US009449987B1

(12) United States Patent
Miyata et al.

(10) Patent No.: US 9,449,987 B1
(45) Date of Patent: Sep. 20, 2016

(54) THREE DIMENSIONAL MEMORY DEVICE WITH EPITAXIAL SEMICONDUCTOR PEDESTAL FOR PERIPHERAL TRANSISTORS

(71) Applicant: SANDISK TECHNOLOGIES INC., Plano, TX (US)

(72) Inventors: Koji Miyata, Yokkaichi (JP); Zhenyu Lu, Milpitas, CA (US); Andrew Lin, San Jose, CA (US); Daxin Mao, Cupertino, CA (US); Jixin Yu, Yokkaichi (JP); Johann Alsmeier, San Jose, CA (US); Wenguang Stephen Shi, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/995,017

(22) Filed: Jan. 13, 2016

Related U.S. Application Data

(63) Continuation-in-part of application No. 14/832,579, filed on Aug. 21, 2015.

(51) Int. Cl.
*H01L 27/115* (2006.01)
*H01L 21/28* (2006.01)

(52) U.S. Cl.
CPC ... *H01L 27/11582* (2013.01); *H01L 27/11556* (2013.01)

(58) Field of Classification Search
CPC .................. H01L 27/11531; H01L 27/11582; H01L 29/4234; H01L 29/66833; H01L 29/7926; H01L 21/28282
See application file for complete search history.

(56) References Cited

U.S. PATENT DOCUMENTS

| 5,915,167 | A | 6/1999 | Leedy |
| 7,005,350 | B2 | 2/2006 | Walker et al. |
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |

(Continued)

FOREIGN PATENT DOCUMENTS

WO     WO02/15277 A2     2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Christine Enad
(74) *Attorney, Agent, or Firm* — The Marbury Law Group PLLC

(57) ABSTRACT

A method of fabricating a memory device is provided. The method includes forming a first alternating stack of insulator layers and spacer material layers over a semiconductor substrate, etching the first alternating stack to expose a single crystalline semiconductor material, forming a first epitaxial semiconductor pedestal on the single crystalline semiconductor material, such that the first epitaxial semiconductor pedestal is in epitaxial alignment with the single crystalline semiconductor material, forming an array of memory stack structures through the first alternating stack, and forming at least one semiconductor device over the first epitaxial semiconductor pedestal.

28 Claims, 37 Drawing Sheets

(56) References Cited

U.S. PATENT DOCUMENTS

| | | | |
|---|---|---|---|
| 7,514,321 | B2 | 4/2009 | Mokhlesi et al. |
| 7,575,973 | B2 | 8/2009 | Mokhlesi et al. |
| 7,696,559 | B2 | 4/2010 | Arai et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,394,716 | B2 | 3/2013 | Hwang et al. |
| 9,023,719 | B2 | 5/2015 | Pachamuthu et al. |
| 9,305,934 | B1 * | 4/2016 | Ding .................. H01L 27/11573 |
| 2007/0210338 | A1 | 9/2007 | Orlowski |
| 2007/0252201 | A1 | 11/2007 | Kito et al. |
| 2009/0230449 | A1 | 9/2009 | Sakaguchi et al. |
| 2009/0242967 | A1 | 10/2009 | Katsumata et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 * | 8/2010 | Fukuzumi .......... G11C 16/0483 257/326 |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0012920 | A1 | 1/2012 | Shin et al. |
| 2012/0119287 | A1 | 5/2012 | Park et al. |
| 2013/0264631 | A1 | 10/2013 | Alsmeier et al. |
| 2014/0061849 | A1 * | 3/2014 | Tanzawa .......... H01L 27/11531 257/499 |
| 2014/0199815 | A1 * | 7/2014 | Hwang ............. H01L 29/66833 438/270 |
| 2015/0076584 | A1 | 3/2015 | Pachamuthu et al. |
| 2015/0179660 | A1 | 6/2015 | Yada et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

U.S. Appl. No. 14/517,134, filed Oct. 17, 2014 SanDisk Technologies Inc.

* cited by examiner

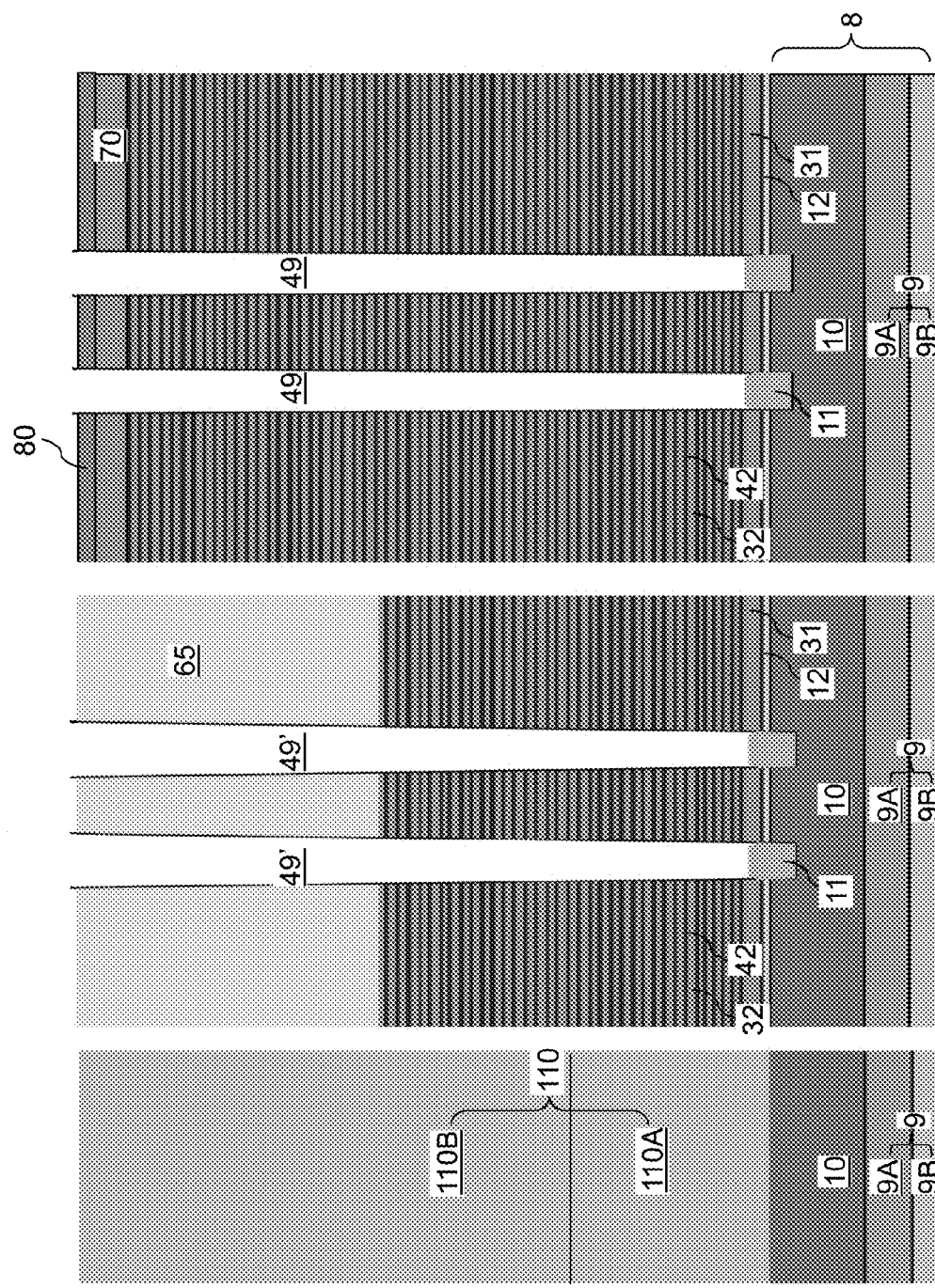

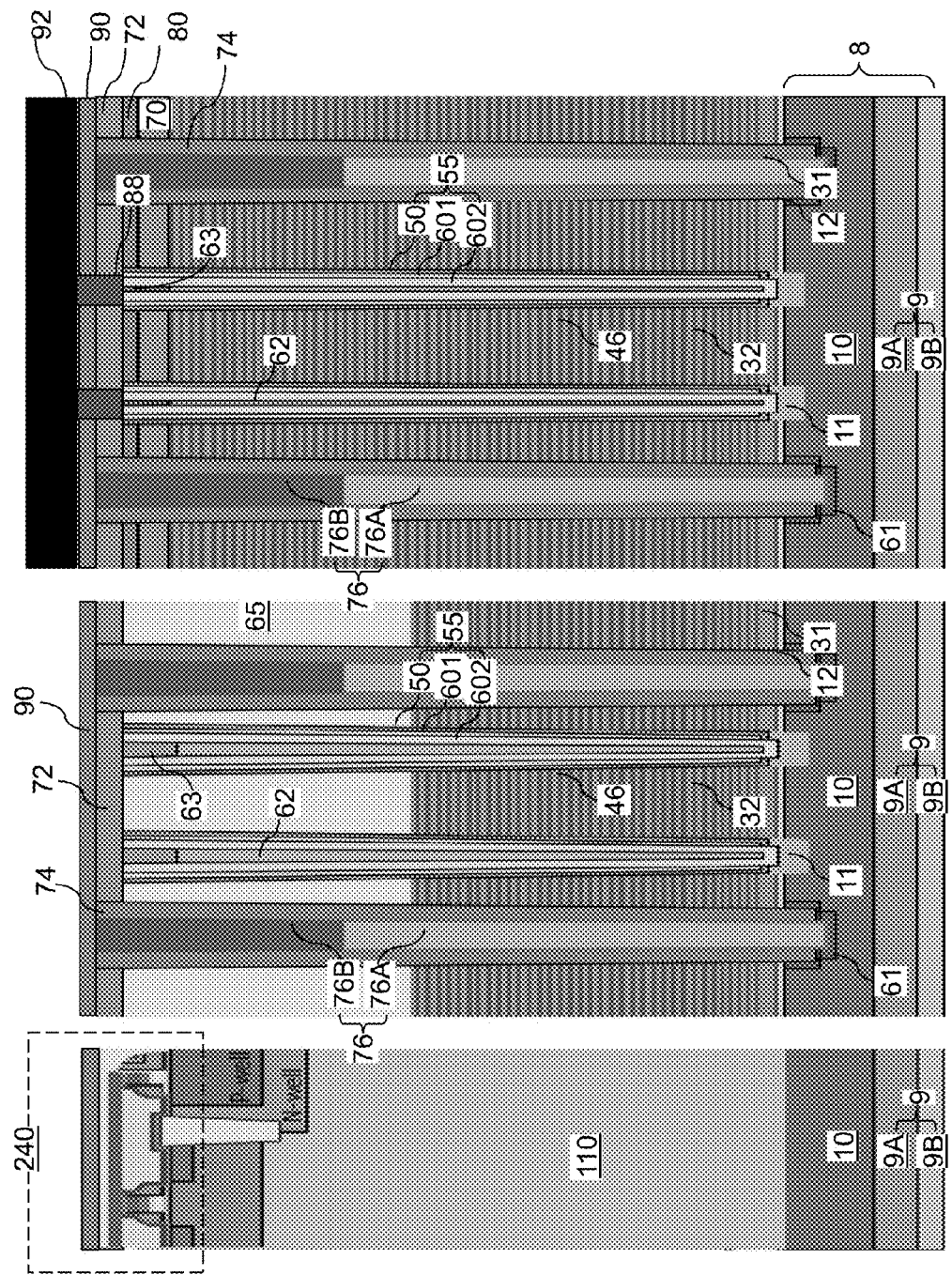

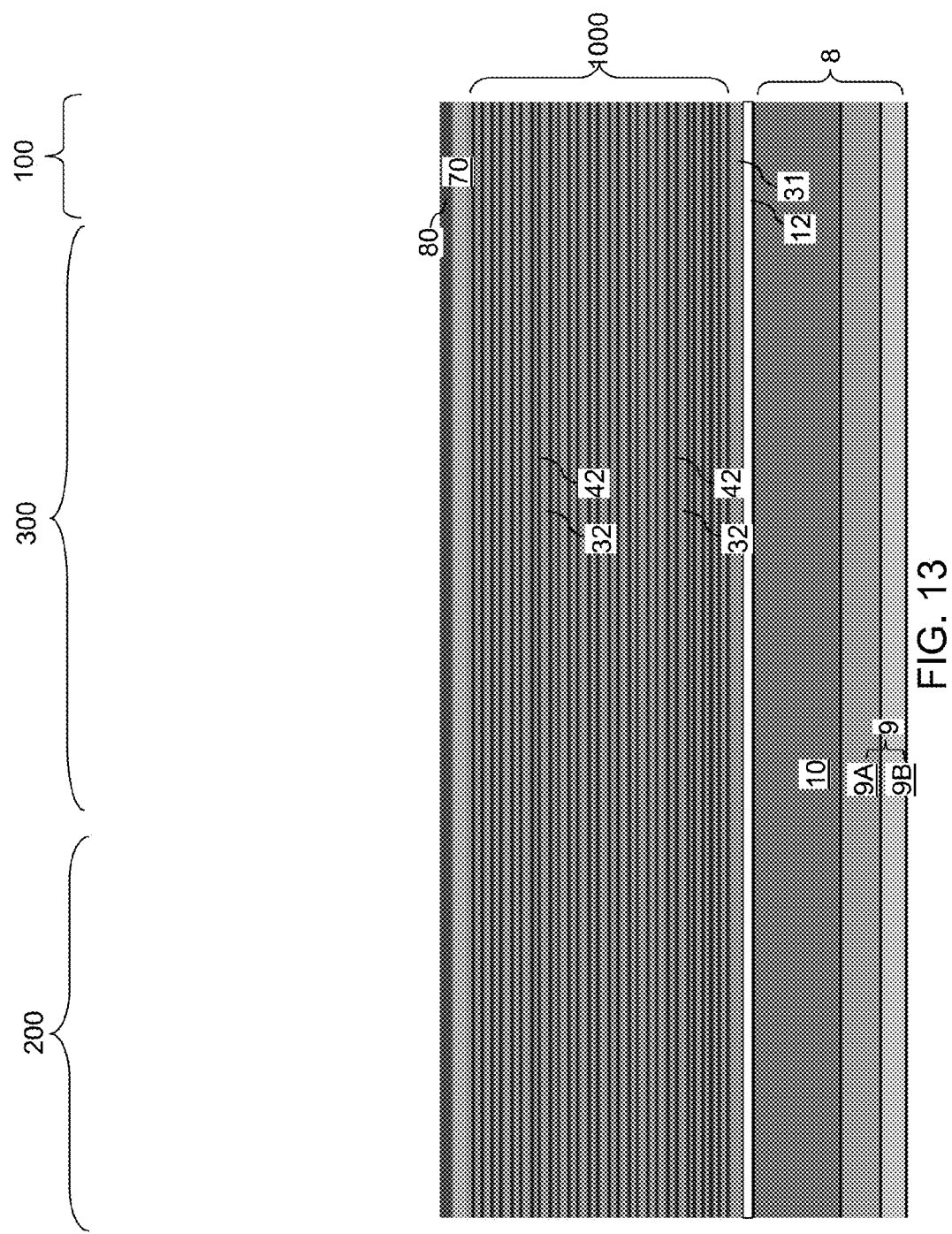

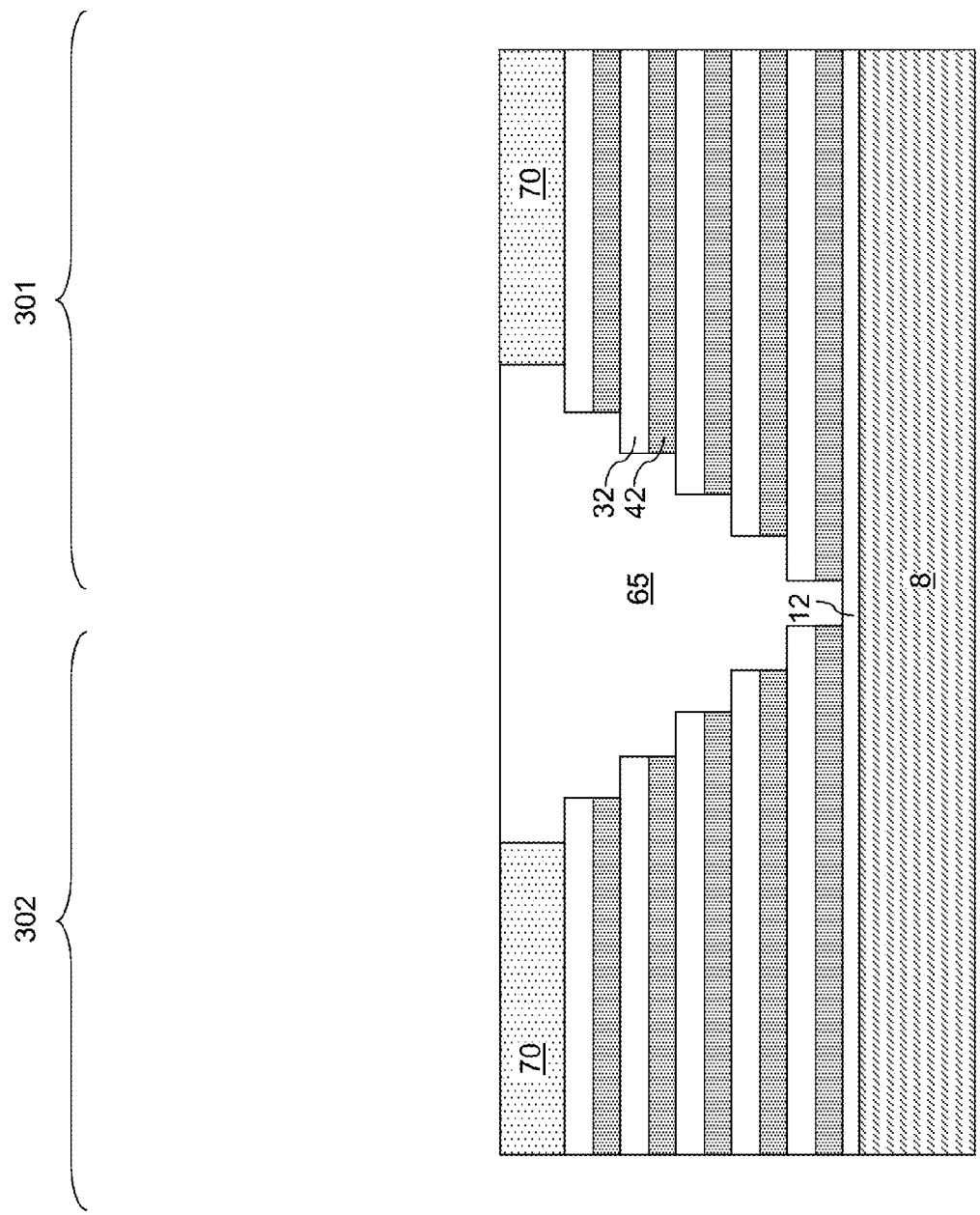

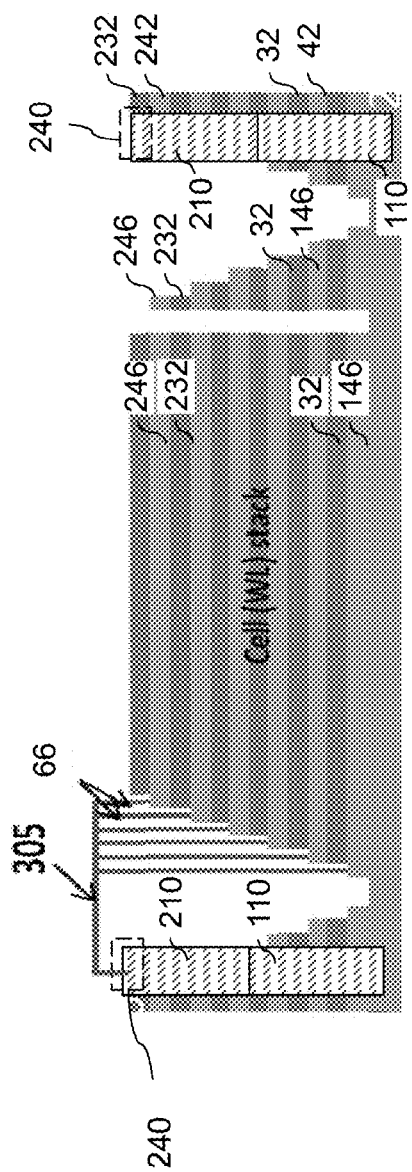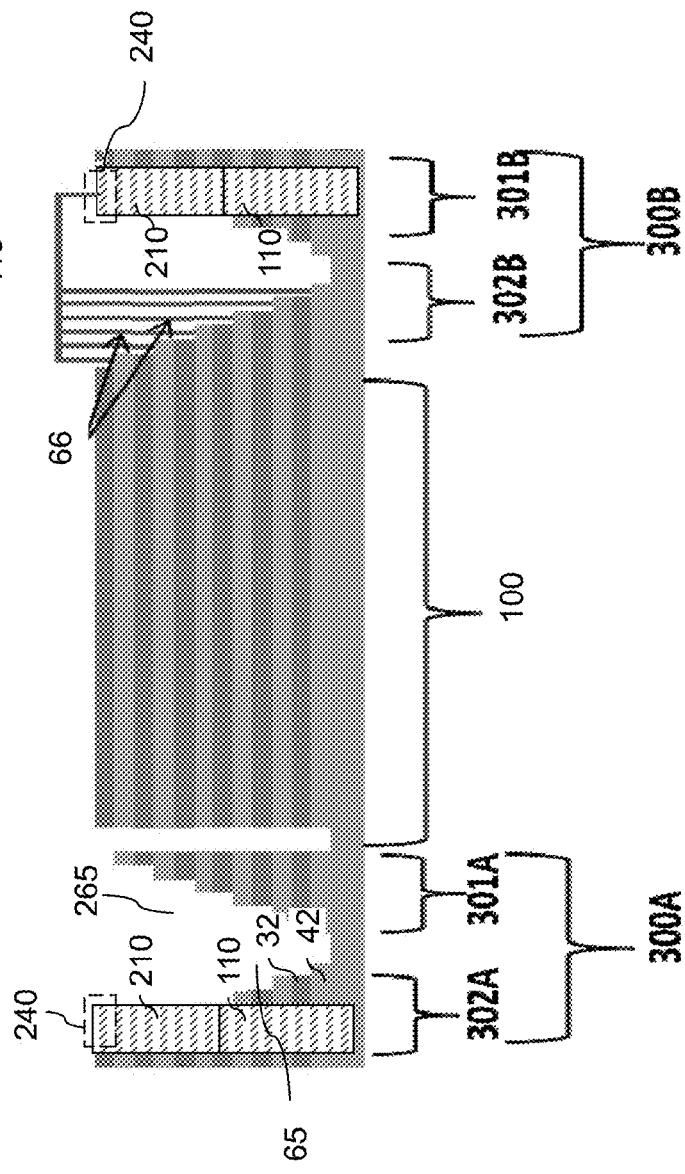

THREE DIMENSIONAL MEMORY DEVICE WITH EPITAXIAL SEMICONDUCTOR PEDESTAL FOR PERIPHERAL TRANSISTORS

FIELD

The present disclosure relates generally to the field of three-dimensional semiconductor devices, and specifically to three-dimensional memory devices including peripheral devices and methods of manufacturing the same.

BACKGROUND

Peripheral devices are needed to control operation of various memory elements in three-dimensional memory devices. As the number of stacks in three-dimensional memory devices increases, the height of contact via structures for providing electrical contact to peripheral devices increases. Such an increase in the height of contact via structures makes it difficult to form reliable contact via structures for the peripheral devices.

SUMMARY

According to an aspect of the present disclosure, a method of fabricating a memory device comprises forming an alternating stack of insulator layers and spacer material layers over a single crystalline semiconductor surface of a substrate and forming stepped surfaces by patterning the alternating stack. The single crystalline semiconductor surface is exposed in a region from which all layers of the alternating stack are removed. The method further comprises after forming the stepped surfaces, forming an epitaxial semiconductor pedestal and a dielectric material portion over a semiconductor surface of the semiconductor substrate and over the stepped surfaces, respectively. The epitaxial semiconductor pedestal is in epitaxial alignment with the single crystalline semiconductor surface of the semiconductor substrate. The method further comprises forming an array of memory stack structures through a remaining portion of the alternating stack, and forming at least one semiconductor device on the epitaxial semiconductor pedestal.

According to another aspect of the present disclosure, a memory device comprises an alternating stack of electrically conductive layers and insulator layers located over a semiconductor substrate, an array of memory stack structures located within memory openings which extend through the alternating stack, a dielectric material portion overlying stepped surfaces of the alternating stack, an epitaxial semiconductor pedestal having substantially vertical sidewalls in epitaxial alignment with a single crystalline substrate semiconductor material in the semiconductor substrate, and at least one semiconductor device located on the top surface of the epitaxial semiconductor pedestal.

According to yet another aspect of the present disclosure, a method of fabricating a memory device is provided. The method comprises forming a first alternating stack of insulator layers and spacer material layers over a semiconductor substrate, etching the first alternating stack to expose a single crystalline semiconductor material, forming a first epitaxial semiconductor pedestal on the single crystalline semiconductor material, wherein the first epitaxial semiconductor pedestal is in epitaxial alignment with the single crystalline semiconductor material, forming an array of memory stack structures through the first alternating stack, forming a second epitaxial semiconductor pedestal on the first epitaxial semiconductor pedestal, wherein the first and the second epitaxial semiconductor pedestals are epitaxial alignment with each other, and forming at least one semiconductor device over the first epitaxial semiconductor pedestal.

According to still another aspect of the present disclosure, a memory device is provided, which comprises at least one alternating stack located over a semiconductor substrate, wherein each of the at least one alternating stack comprises electrically conductive layers and insulator layers that alternate along a direction perpendicular to a top surface of the semiconductor substrate and including stepped surfaces in a contact region, an array of memory stack structures located within memory openings which extend through an entirety of the at least one alternating stack, at least one additional alternating stack of additional insulating layers and spacer material layers, wherein the spacer material layers have a different composition than the electrically conductive layers, at least one epitaxial semiconductor pedestal located in the at least one additional alternating stack, wherein each of the at least one epitaxial semiconductor pedestal is in epitaxial alignment with a single crystalline substrate semiconductor material of the semiconductor substrate, and at least one semiconductor device located on the at least one epitaxial semiconductor pedestal.

BRIEF DESCRIPTION OF THE DRAWINGS

FIG. 10B is a vertical cross-sectional view of the exemplary structure of FIG. 10A along the vertical plane B-B'.

FIG. 10C is a vertical cross-sectional view of the exemplary structure of FIG. 10A along the vertical plane C-C'.

FIG. 10D is a vertical cross-sectional view of the exemplary structure of FIG. 10A along the vertical plane B-B'.

FIG. 12B is a vertical cross-sectional view of the exemplary structure of FIG. 12A along the vertical plane B-B'.

FIG. 12C is a vertical cross-sectional view of the exemplary structure of FIG. 12A along the vertical plane C-C'.

FIG. 12D is a vertical cross-sectional view of the exemplary structure of FIG. 12A along the vertical plane D-D'.

FIG. 13 is a vertical cross-sectional view of a third exemplary structure after formation of a first alternating stack according to a third embodiment of the present disclosure.

FIG. 14 is a vertical cross-sectional view of the third exemplary structure after formation of first stepped terraces according to a third embodiment of the present disclosure.

FIGS. 28A-28D are sequential vertical cross-sectional views of an alternative configuration for the first, second, or third exemplary structure according to an embodiment of the present disclosure.

FIG. 29B is a vertical cross-sectional view of the structure of FIG. 29A along the vertical plane B-B'.

FIG. 29C is a vertical cross-sectional view of the structure of FIG. 29A along the vertical plane C-C'.

DETAILED DESCRIPTION

Figure 1:
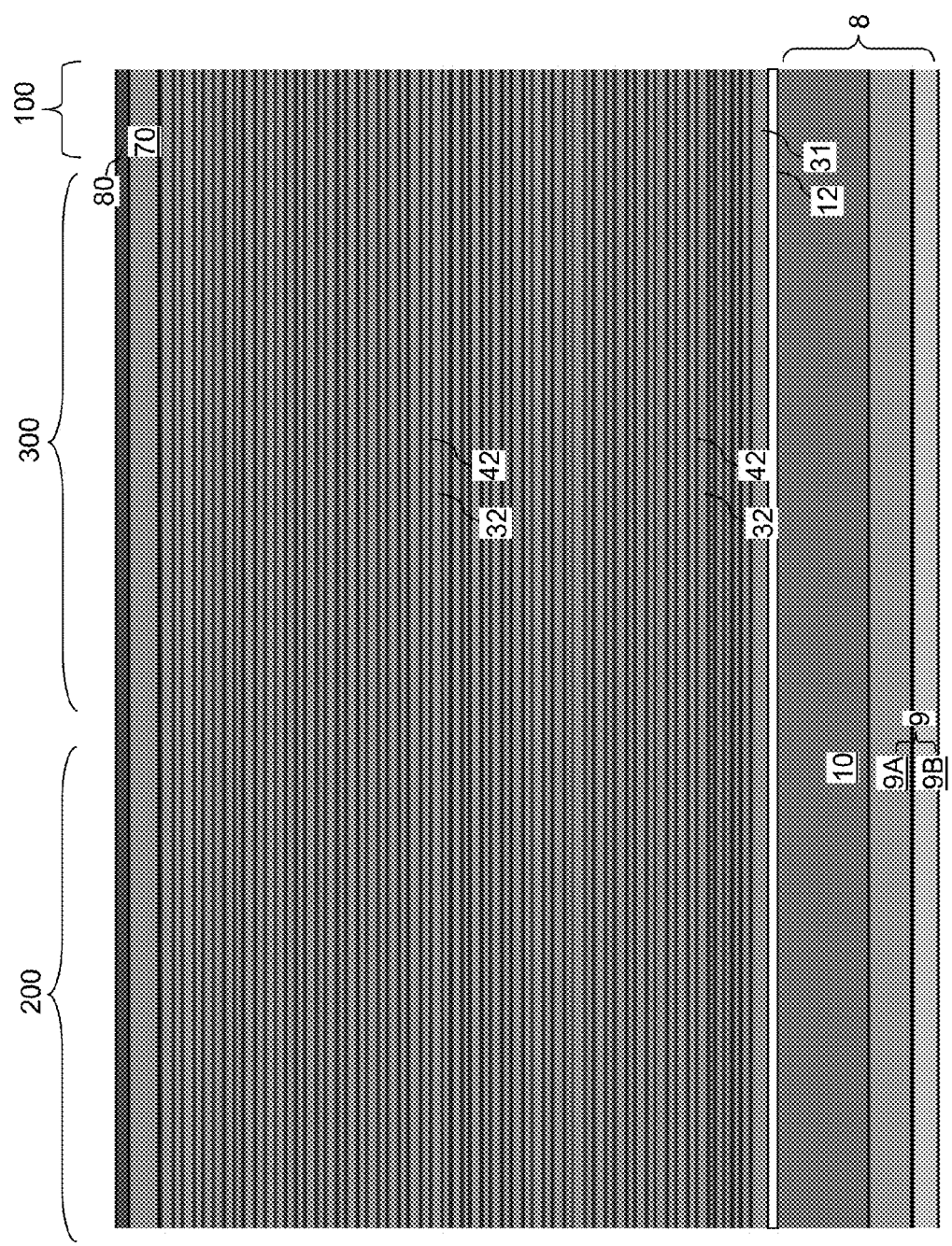
FIG. 1 is a vertical cross-sectional view of a first exemplary structure of after formation of a stack of alternating layers, an insulating cap layer, and a planarization stopping layer over a substrate according to a first embodiment of the present disclosure.

As discussed above, the present disclosure is directed to three-dimensional memory devices incorporating peripheral transistors, and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Elements with the same reference numerals refer to the same or similar elements. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The exemplary structure includes a substrate 8, which can be a semiconductor substrate, such as a single crystal silicon wafer. The semiconductor substrate 8 can include one or more material layers (9, 10). In one embodiment, the substrate 8 can include at least one underlying material layer 9 and a single crystalline semiconductor layer 10 as a topmost layer. In one embodiment, the at least one underlying material layer 9 can include a semiconductor material layer having a doping of a different conductivity type than the single crystalline semiconductor layer 10 located thereabove. Alternatively or additionally, the at least one underlying material layer 9 can include a buried insulator layer. In one embodiment, the at least one underlying material layer 9 can include a first semiconductor material layer 9B having a doping of a first conductivity type, and a second semiconductor material layer 9A having a doping of a second conductivity type that is the opposite of the first conductivity type. The single crystalline semiconductor material layer 10 can have a doping of the first conductivity type.

The single crystalline semiconductor layer 10 is a semiconductor material layer, and can include at least one elemental semiconductor material (e.g., silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the single crystalline semiconductor layer 10.

Optionally, a dielectric pad layer 12 can be formed on a top surface of the single crystalline semiconductor layer 10. The dielectric pad layer 12 can be, for example, silicon oxide layer. The thickness of the dielectric pad layer 12 can be in a range from 3 nm to 30 nm, although lesser and greater thicknesses can also be employed. Optionally, a bottom insulator layer 31 can be formed over the dielectric pad layer 12. If present, the bottom insulator layer 31 includes a dielectric material, and can be formed directly on top surfaces of the dielectric pad layer 12. Exemplary materials that can be employed for the bottom insulator layer 31 include, but are not limited to, silicon oxide, a dielectric metal oxide, and silicon nitride (in case the material of second material layers to be subsequently formed is not silicon nitride).

An alternating stack of first material layers (which can be insulating layers 32) and second material layers (which can be spacer material layer 42) is formed over the top surface of the substrate 8, which can be, for example, on the top surface of the bottom insulator layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a spacer material layer 42 that provides vertical separation between the insulator layers. In this case, the stack can include an alternating plurality of insulator layers 32 and spacer material layers 42.

The stack of the alternating plurality is herein referred to as an alternating stack (32, 42). In one embodiment, the alternating stack (32, 42) can include insulator layers 32 composed of the first material, and spacer material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the spacer material layers 42 is a sacrificial material that can be removed selective to the first material of the insulator layers 32. In this case, the spacer material layers 42 are referred to sacrificial material layers.

As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The spacer material layers 42 may comprise an electrically insulating material, a semiconductor material, or a conductive material. In case the spacer material layers 42 are sacrificial material layers, the sacrificial material of the spacer material layers 42 can be subsequently replaced with electrically conductive electrodes, which can function, for example, as control gate electrodes of a vertical NAND device. Non-limiting examples of the sacrificial material that can be employed for the spacer material layers 42 include silicon nitride, an amorphous semiconductor material (such as amorphous silicon), and a polycrystalline semiconductor material (such as polysilicon). In one embodiment, the spacer material layers 42 can be sacrificial material layers that comprise silicon nitride or a semiconductor material including at least one of silicon and germanium. Alternatively, the spacer material layers 42 can be conductive material layers that are not subsequently replaced, i.e., permanent conductive material layers.

In one embodiment, the insulator layers 32 can include silicon oxide, and spacer material layers can include silicon nitride spacer material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the spacer material layers 42 can be formed, for example, CVD or atomic layer deposition (ALD).

The thicknesses of the insulator layers 32 and the spacer material layers 42 can be in a range from 20 nm to 50 nm, although lesser and greater thicknesses can be employed for each insulator layer 32 and for each spacer material layer 42. The number of repetitions of the pairs of an insulator layer 32 and a spacer material layer (e.g., a control gate electrode or a spacer material layer) 42 can be in a range from 2 to 1,024, and typically from 8 to 256, although a greater number of repetitions can also be employed. The top and bottom gate electrodes in the stack may function as the select gate electrodes. In one embodiment, each spacer material layer 42 in the alternating stack (32, 42) can have a uniform thickness that is substantially invariant within each respective spacer material layer 42.

An insulating cap layer 70 can be deposited over the alternating stack (32, 42). The insulating cap layer 70 includes an insulator material, which may be the same material as the first material of the insulator layers 32. The insulating cap layer 70 includes a material that is different from the second material of the spacer material layers 42. The thickness of the insulating cap layer 70 can be in a range from 20 nm to 100 nm, although lesser and greater thicknesses can also be employed.

A planarization stopping layer 80 can be formed over the insulating cap layer 70. The planarization stopping layer 80 includes a dielectric material that can be employed as a stopping layer in a subsequent planarization step, which may employ chemical mechanical planarization. For example, the planarization stopping layer 80 can employ a dielectric metal oxide (such as aluminum oxide), silicon nitride, or silicon oxide. The planarization stopping layer 80 includes a dielectric material that is different from the second material of the spacer material layers 42. The thickness of the planarization stopping layer 80 can be in a range from 5 nm to 40 nm, although lesser and greater thicknesses can also be employed.

The first exemplary structure can have a region in which memory devices are to be subsequently formed, which is herein referred to as a device region 100. The first exemplary structure can have another region in which contact via structures that contact control gate electrodes are subsequently formed, which is herein referred to as contact region 300. The first exemplary structure can have still another region in which peripheral devices that control the operation of the memory devices are to be subsequently formed, which is herein referred to as a peripheral device region 200.

Figure 2:
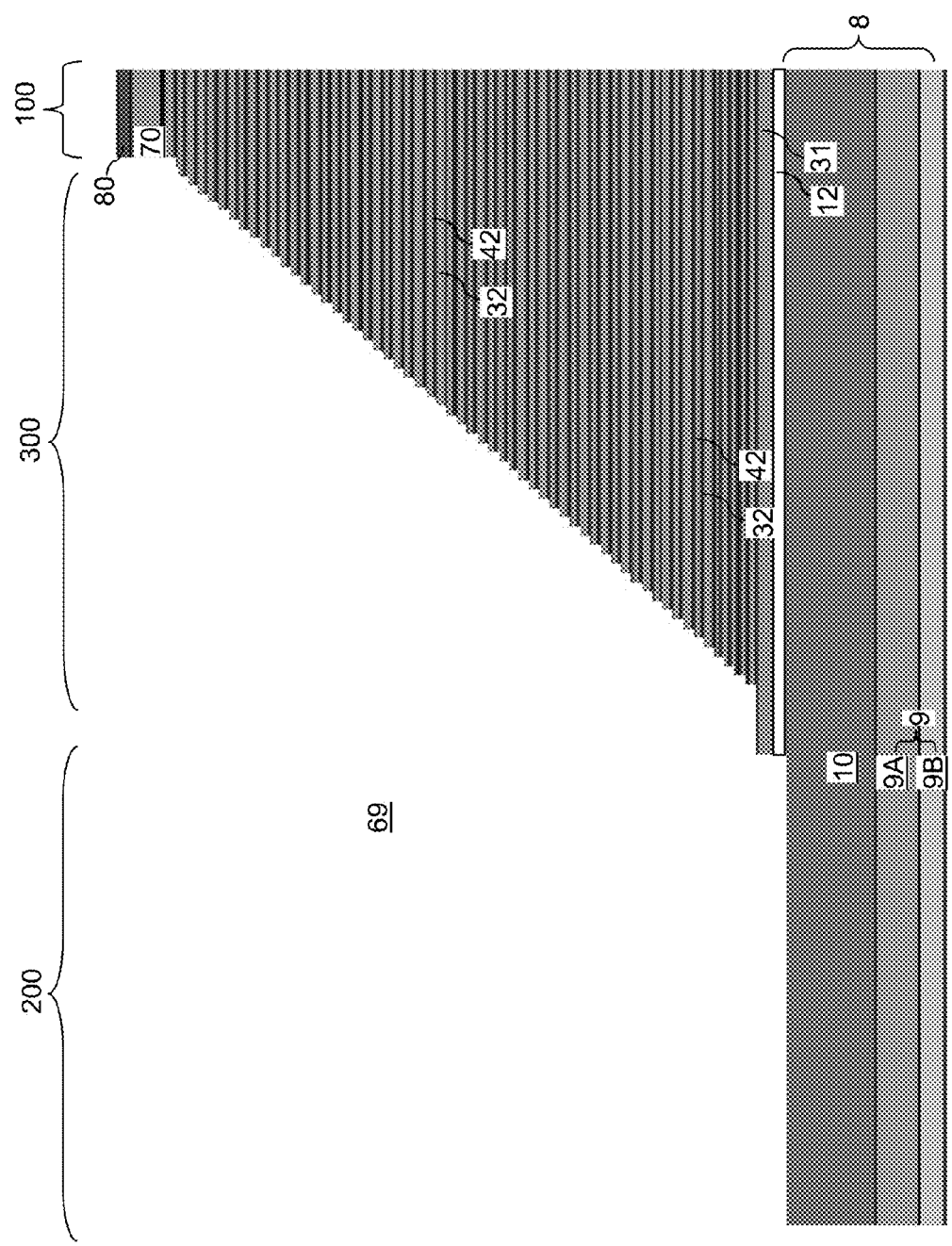
FIG. 2 is a vertical cross-sectional view of the first exemplary structure after formation of stepped terraces according to a first embodiment of the present disclosure.

Referring to FIG. 2, a stepped cavity 69 extending over the contact region 300 and the peripheral device region 200 can be formed according to a first embodiment. The stepped cavity 69 can have various stepped surfaces such that the horizontal cross-sectional shape of the stepped cavity 69 changes in steps as a function of the vertical distance from the top surface of the substrate 8. In one embodiment, the stepped cavity 69 can be formed by initially masking the device region 100 and optionally the contact region 200 with a masking layer (which may be a patterned photoresist layer), patterning the planarization stopping layer 80 and the insulating cap layer 70 by etching unmasked portions of the same, and by repetitively performing a set of processing steps to form the stepped surfaces. In alternative embodiments, regions 200 and 300 may etched at the same time during the same etch step, or region 200 may be etched prior to region 300 in separate etch steps.

The set of processing steps can include, for example, an etch process of a first type that vertically increases the depth of a cavity by one or more levels, and an etch process of a second type that laterally expands the area to be vertically etched in a subsequent etch process of the first type by trimming the masking layer (for example, by partially ashing an outer portion of the masking layer). As used herein, a "level" of a structure including alternating plurality is defined as the relative position of a pair of a first material layer and a second material layer within the structure. For example, a photoresist layer (not shown) can be applied and patterned to initially cover the device region 100 and the contact region 300, and an anisotropic etch process and an ashing process can be alternately performed. Each anisotropic etch process can vertically extend a pre-existing cavity by two vertical levels (corresponding to a pair of an insulator layer 32 and a spacer material layer 42) and etch through the planarization stopping layer 80 and the insulating cap layer 70 within a newly physically exposed area, which is the area in which the top surface of the planarization stopping layer 80 is physically exposed during an immediately preceding ashing process that trims an outer portions of the photoresist layer. Each ashing process trims the photoresist layer by removing only the outermost portions of the photoresist layer. The duration of the ashing process determines the amount of the ashed photoresist material, and the length of the corresponding ledge, i.e., a horizontal surface, of the stepped surfaces. The portions of layers 32 and 42 of the alternating stack (32, 42) as well as layers 12 and 31 located in region 200 may be removed during the formation of the stepped surfaces to expose the semiconductor substrate 8 (e.g., single crystal silicon substrate semiconductor layer 10) in region 200. Alternatively, the portions of these layers located in region 200 may be removed during a separate etching step from the steps using to form the stepped surfaces.

A peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces. Remaining portions of the mask layer can be removed, for example, by ashing.

Figure 3:
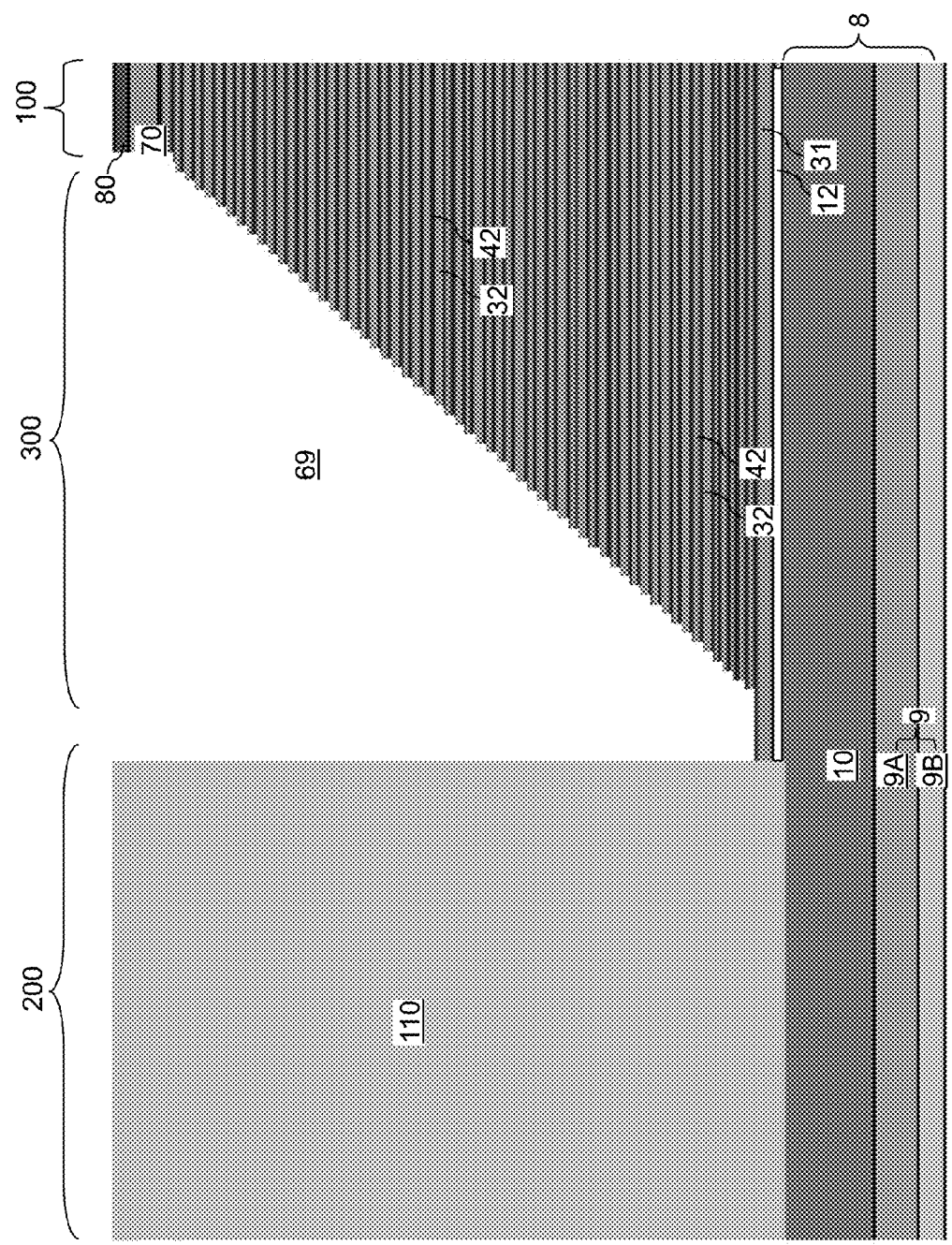
FIG. 3 is a vertical cross-sectional view of the first exemplary structure after formation of an epitaxial semiconductor pedestal in a peripheral device region according to the first embodiment of the present disclosure.

Referring to FIG. 3, an epitaxial semiconductor pedestal 110 can be formed in the peripheral device region 200, which is the region in which a top surface of the single crystalline substrate semiconductor material of the semiconductor material layer 10 is physically exposed. The epitaxial semiconductor pedestal 110 can be formed by a selective epitaxy process. The epitaxial semiconductor pedestal 110 comprises a single crystalline semiconductor material (e.g., single crystal silicon) in epitaxial alignment with the single crystalline substrate semiconductor material (e.g., single crystal silicon) of the semiconductor material layer 10. Optionally, the epitaxial semiconductor pedestal 110 can be doped with electrical dopants of a suitable conductivity type. The top surface of the epitaxial semiconductor pedestal 110 can be coplanar with, or can be located above, the horizontal plane including the top surface of the planarization stopping layer 80. The sidewall surfaces of the epitaxial semiconductor pedestal 110 may be substantially vertical and have no stepped surfaces which are a mirror image of the stepped surfaces in the stack in region 300. The angle of the substantially vertical sidewalls of the epitaxial semiconductor pedestal 110 with respect to a horizontal plane (e.g., the top surface of the substrate) can be in a range from 80 degrees to 100 degrees, such as 90 degrees.

The selective epitaxy process that forms the epitaxial semiconductor pedestal 110 can be performed, for example, by sequentially or simultaneously flowing a reactant gas (such as $SiH_4$, $SiH_2Cl_2$, $SiHCl_3$, $SiCl_4$, $Si_2H_6$, $GeH_4$, $Ge_2H_6$, other semiconductor precursor gases, or combinations there) with an etchant gas (such as HCl). The deposition rate of the semiconductor material on amorphous surfaces (such as the surfaces of dielectric materials) is less than the etch rate of the semiconductor material by the etchant, while the deposition rate of the semiconductor material on crystalline surfaces (such as the top surface of the semiconductor material layer 10) is greater than the etch rate of the semiconductor material by the etchant. Thus, the semiconductor material is deposited only on the semiconductor surface, which is the physically exposed portion of the top surface of the semiconductor material layer 10. The process conditions (such as the deposition temperature, the partial pressure of the various gases in a process chamber, etc.) can be selected such that the deposited semiconductor material is epitaxial, i.e., single crystalline with atomic alignment with the single crystalline structure of the semiconductor material layer 10.

Figure 4:
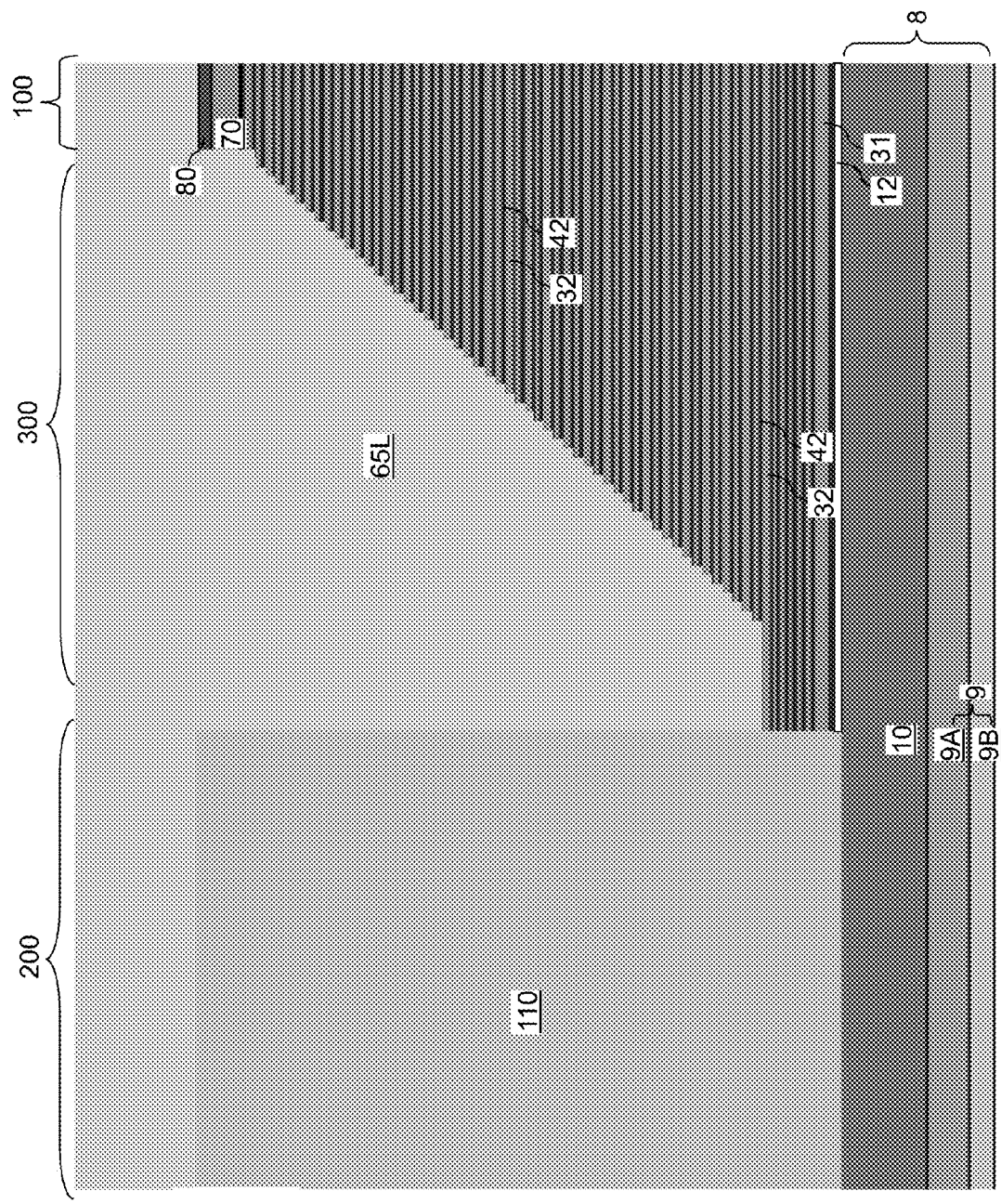
FIG. 4 is a vertical cross-sectional view of the first exemplary structure after deposition of a dielectric fill material layer according to the first embodiment of the present disclosure.

Referring to FIG. 4, a dielectric fill material layer 65L is deposited in the remaining portion of the stepped cavity 69, which is present in the contact region 300, and over the alternating stack (32, 42) in the device region 100, and over the epitaxial semiconductor pedestal 110 in the peripheral device region 200. The dielectric fill material layer 65L includes a dielectric material that can be subsequently planarized employing a planarization process such as chemical mechanical planarization (CMP). For example, the dielectric fill material layer 65L can include a dielectric material such as undoped silicon oxide or doped silicon oxide (such as phosphosilicate glass, borosilicate glass, or borophosphosilicate glass). The dielectric fill material layer 65L can completely fill the remaining portion of the stepped cavity 69 in the contact region 300.

Figure 5:
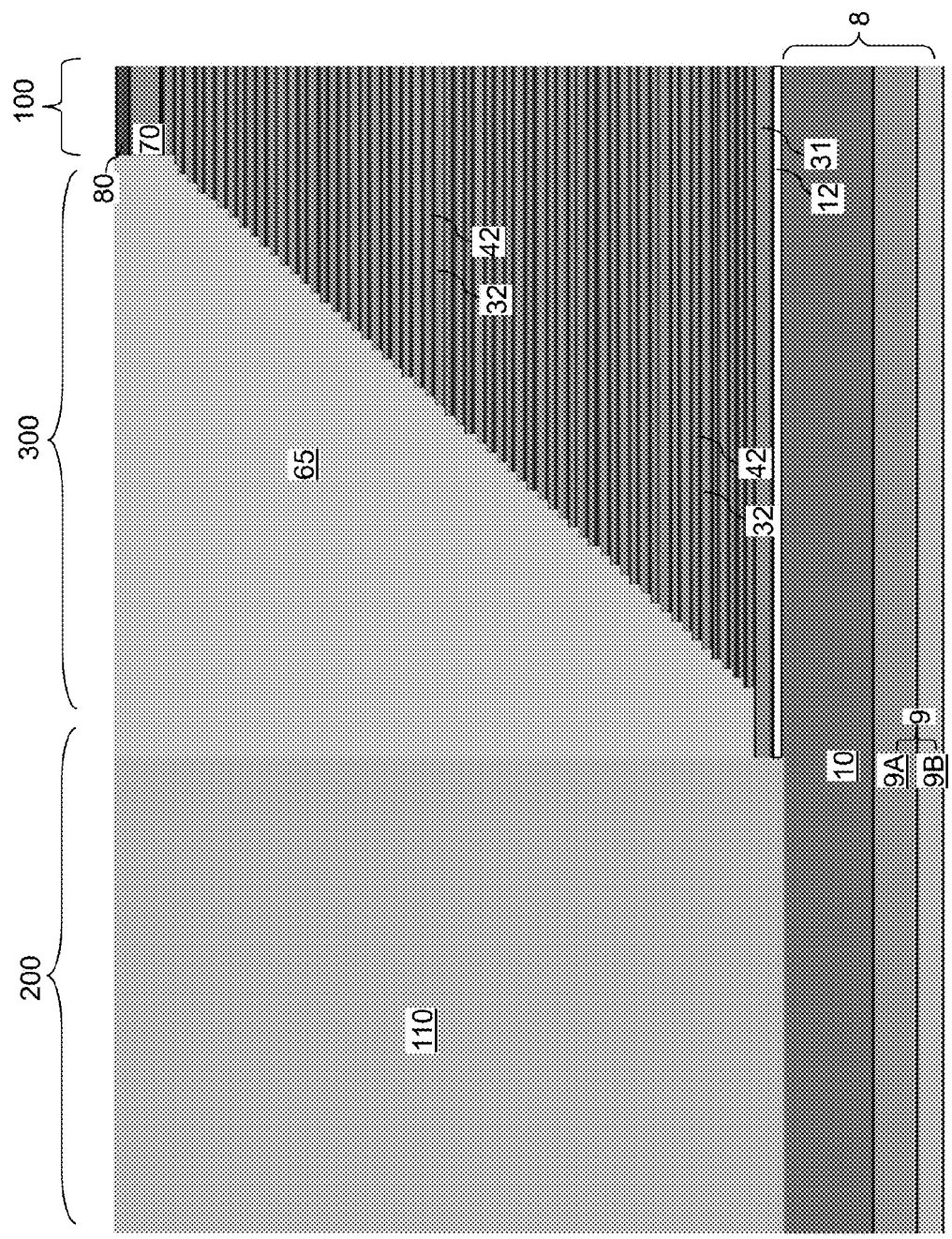
FIG. 5 is a vertical cross-sectional view of the first exemplary structure after formation of a dielectric material portion according to the first embodiment of the present disclosure.

Referring to FIG. 5, a planarization process can be performed to remove portions of the dielectric fill material layer 65L from above a horizontal plane including the top surface of the planarization stopping layer 80. For example, portions of the dielectric fill material layer 65L can be removed from above the top surface of the planarization stopping layer 80 by chemical mechanical planarization (CMP). The remaining portion of the dielectric fill material layer 65L filling the stepped cavity in the contact region 300 constitutes a dielectric material portion (i.e., an insulating fill material portion). In one embodiment, the dielectric material portion can include retro-stepped bottom surfaces. In this case, the dielectric material portion is herein referred to as a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. Thus, an epitaxial semiconductor pedestal 110 and a retro-stepped dielectric material portion 65 are formed over a semiconductor surface of the semiconductor substrate 8 and over the stepped surfaces, respectively. If desired, the retro-stepped dielectric material portion 65 may also be formed over a part of the exposed substrate 8. The epitaxial semiconductor pedestal 110 is in epitaxial alignment with a single crystalline substrate semiconductor material in the semiconductor substrate 8.

In one embodiment, the dielectric material of the dielectric fill material layer 65L can be planarized to form the retro-stepped dielectric material portion 65 employing at least the epitaxial semiconductor pedestal 110 as a stopping structure for the planarization process. In one embodiment, the dielectric material of the dielectric fill material layer 65L can be planarized to form the retro-stepped dielectric material portion 65 employing the epitaxial semiconductor pedestal 110 and the planarization stopping layer 80 as stopping structures for the planarization process. The use of pedestal 100 as a planarization (e.g., polish) stop during planarization (e.g., CMP) of the retro-stepped dielectric material portion 65 is one non-limiting advantage of forming the pedestal 110 after forming the stepped surfaces in region 300. Another non-limiting advantage of forming the pedestal 110 after forming the stepped surfaces in region 300 is that no stepped surfaces are formed in the sidewall(s) of the pedestal 110. This leaves more room at the flat top surface of the pedestal 110 to form peripheral (e.g., driver circuit) devices and/or a reduction of space used for the pedestal which permits more memory devices to be formed in region 100 for the same size substrate.

Figure 6:
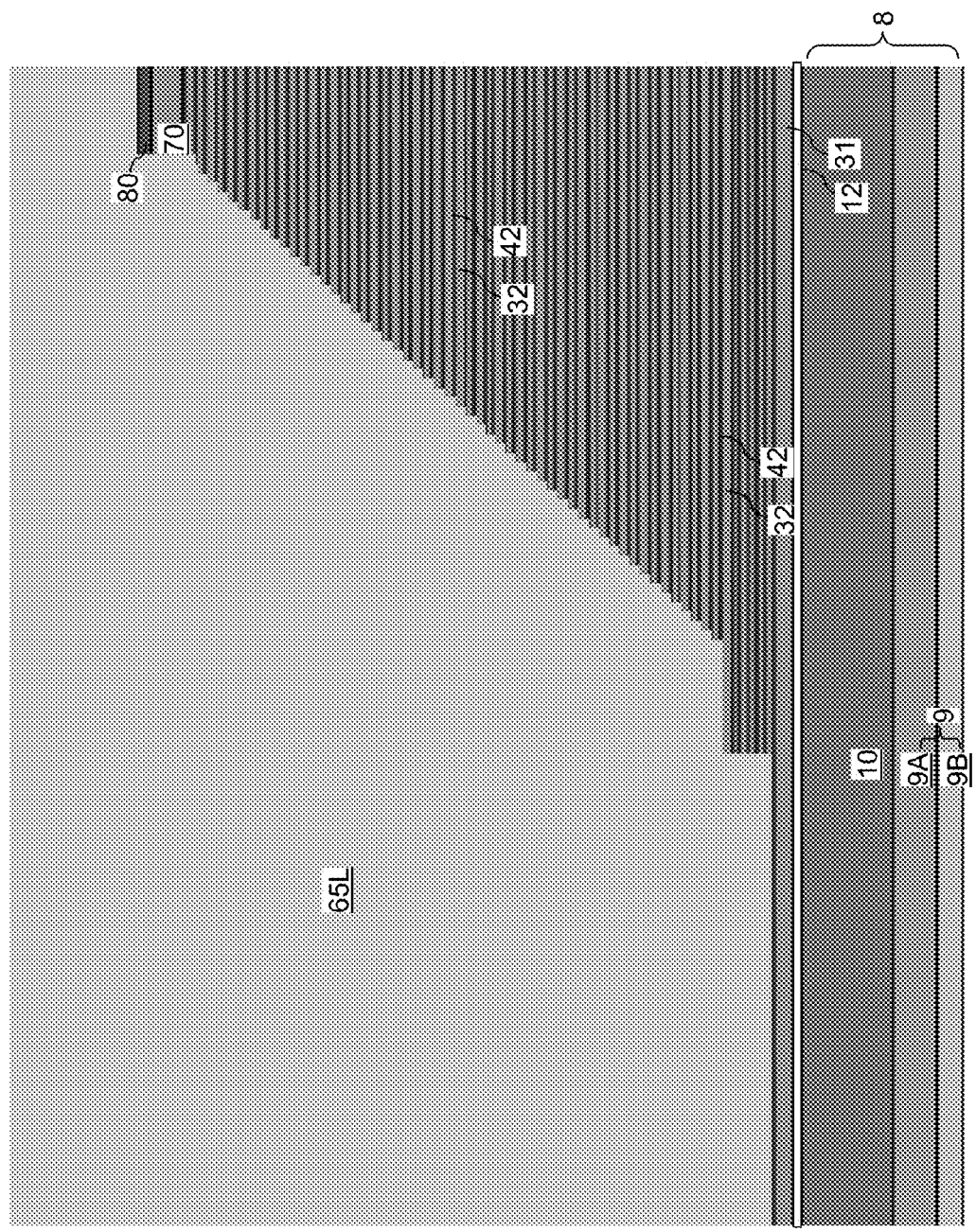
FIG. 6 is a vertical cross-sectional view of a second exemplary structure after formation of a dielectric fill material layer according to a second embodiment of the present disclosure.

Referring to FIG. 6, a second exemplary structure according to a second embodiment of the present disclosure can be derived from the first exemplary structure of FIG. 2 by forming a dielectric fill material layer 65L prior to forming the epitaxial semiconductor pedestal. The planarization stopping layer 80 is patterned prior to forming the stepped surfaces illustrated in FIG. 2. The dielectric fill material layer 65L of FIG. 6 can have the same composition as the dielectric fill material layer 65L of FIG. 4. Further, the dielectric fill material layer 65L of FIG. 6 can be formed employing the same deposition methods as the deposition methods for forming the dielectric fill material layer 65L of FIG. 4.

Figure 7:
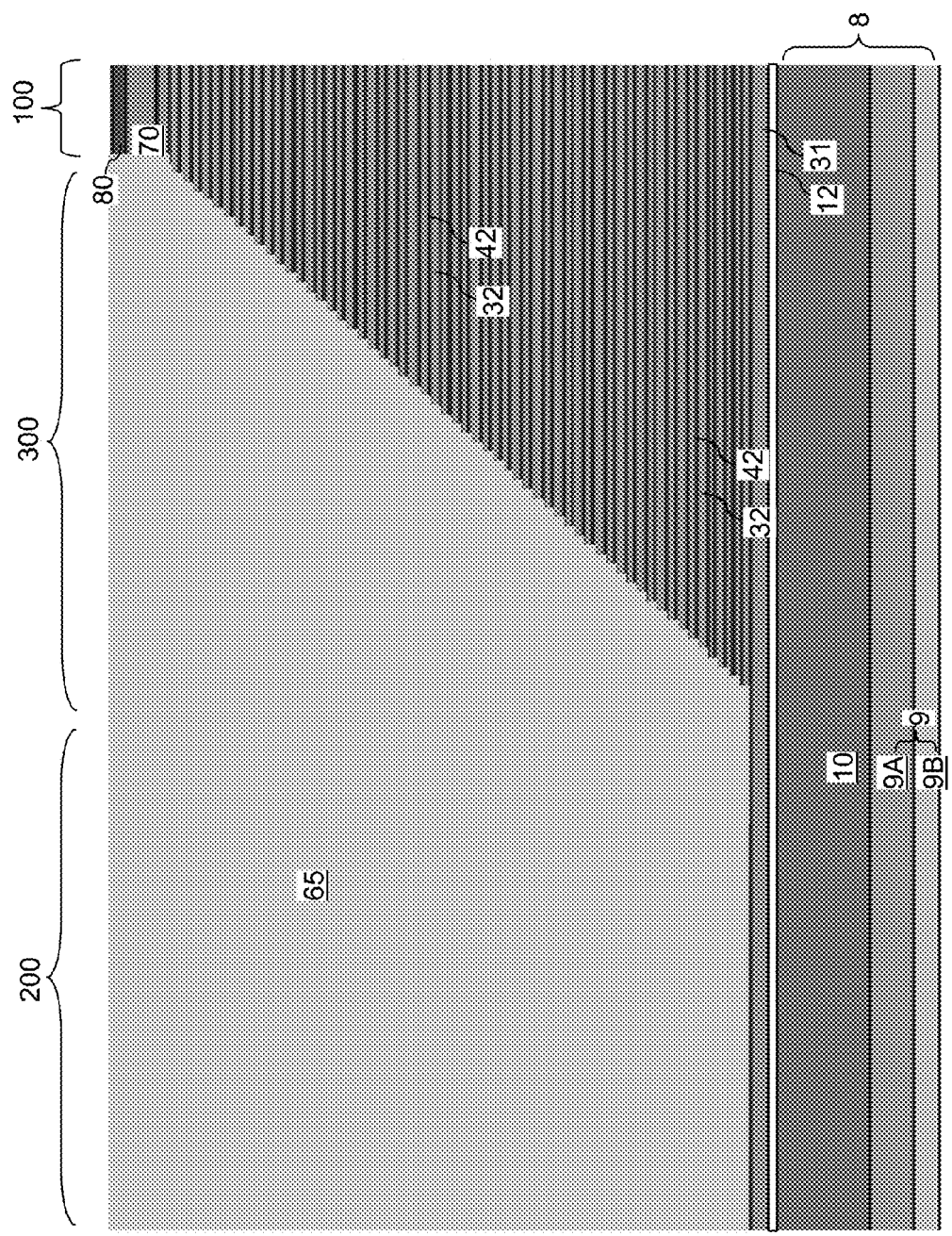
FIG. 7 is a vertical cross-sectional view of the second exemplary structure after formation of a dielectric material portion according to the second embodiment of the present disclosure.

Referring to FIG. 7, a planarization process can be performed to remove portions of the dielectric fill material layer 65L from above a horizontal plane including the top surface of the planarization stopping layer 80. For example, portions of the dielectric fill material layer 65L can be removed from above the top surface of the planarization stopping layer 80 by chemical mechanical planarization (CMP). The dielectric fill material layer 65L can be planarized employing the planarization stopping layer 80 as a stopping layer. The remaining portion of the dielectric fill material layer 65L filling the stepped cavity in the contact region 300 and the peripheral device region 200 constitutes a retro-stepped dielectric material portion 65 (i.e., an insulating fill material portion). If silicon oxide is employed for the retro-stepped dielectric material portion 65, the silicon oxide of the retro-stepped dielectric material portion 65 may, or may not, be doped with dopants such as B, P, and/or F.

Figure 8:
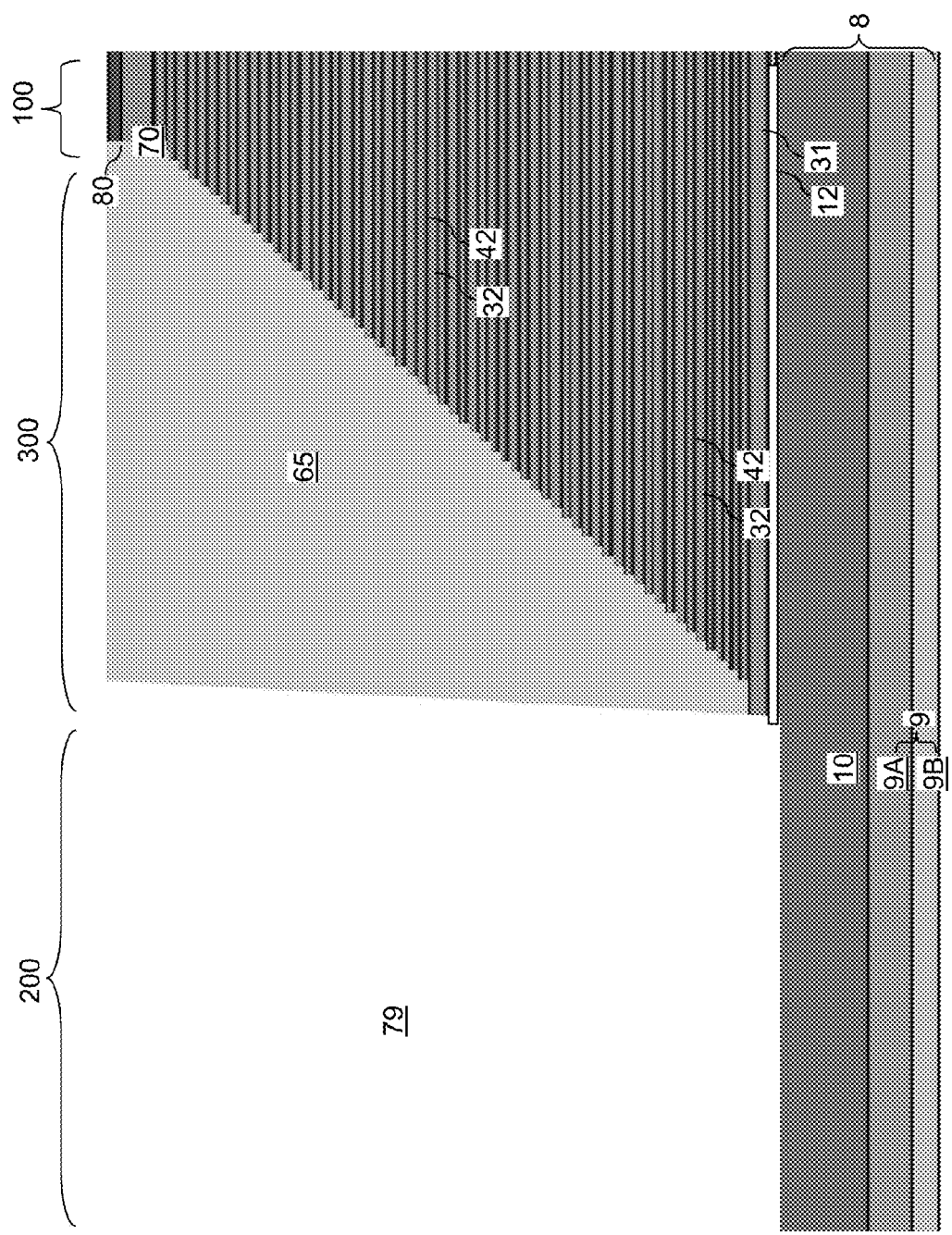
FIG. 8 is a vertical cross-sectional view of the second exemplary structure after removal of a region of the dielectric material portion according to the second embodiment of the present disclosure.

Referring to FIG. 8, a photoresist layer (not shown) can be applied over the planarization stopping layer 80 and the retro-stepped dielectric material portion 65, and can be patterned to cover the device region 100 and the contact region 300, while not covering the peripheral device region 200. An anisotropic etch or an isotropic etch can be performed to remove a portion of the retro-stepped dielectric material portion 65 from the peripheral device region 200. In one embodiment, an anisotropic etch can be employed to remove the physically exposed region of the retro-stepped dielectric material portion 65 from above the top surface of the semiconductor substrate 8 in the peripheral device region 200.

The retro-stepped dielectric material portion 65 is reduced in size due to the anisotropic etch. Specifically, a remaining portion of the deposited dielectric material over the stepped surfaces in the contact region 300 constitutes the retro-stepped dielectric material portion 65. Thus, the retro-stepped dielectric material portion 65 (as provided after the processing steps of FIG. 8) is formed by deposition and patterning of a dielectric material over the substrate 8. A peripheral region cavity 79 is formed within the volume from which a portion of the retro-stepped dielectric material portion 65 is removed.

Figure 9:
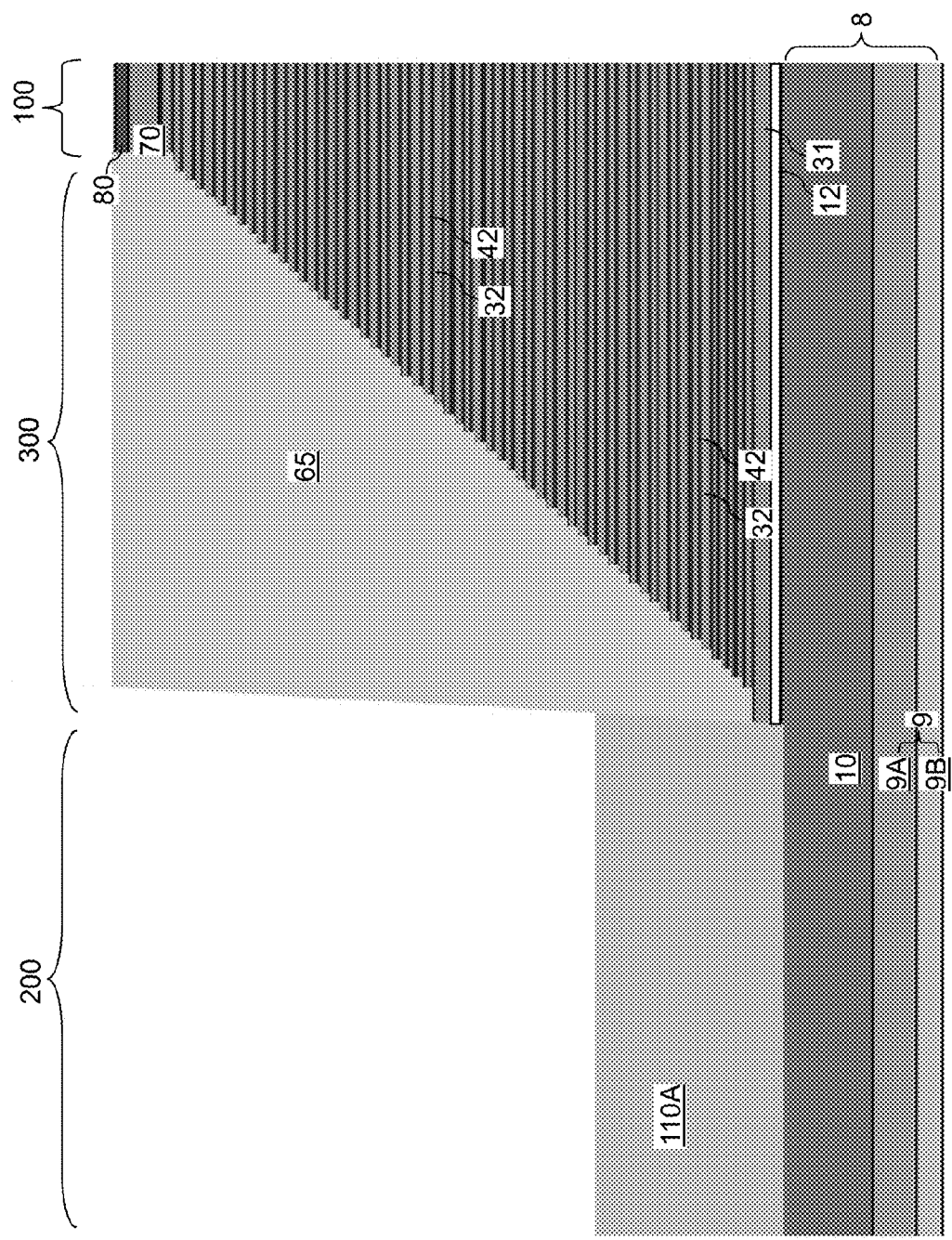
FIG. 9 is a vertical cross-sectional view of the second exemplary structure after formation of an epitaxial semiconductor portion according to the second embodiment of the present disclosure.
Figure 10A:
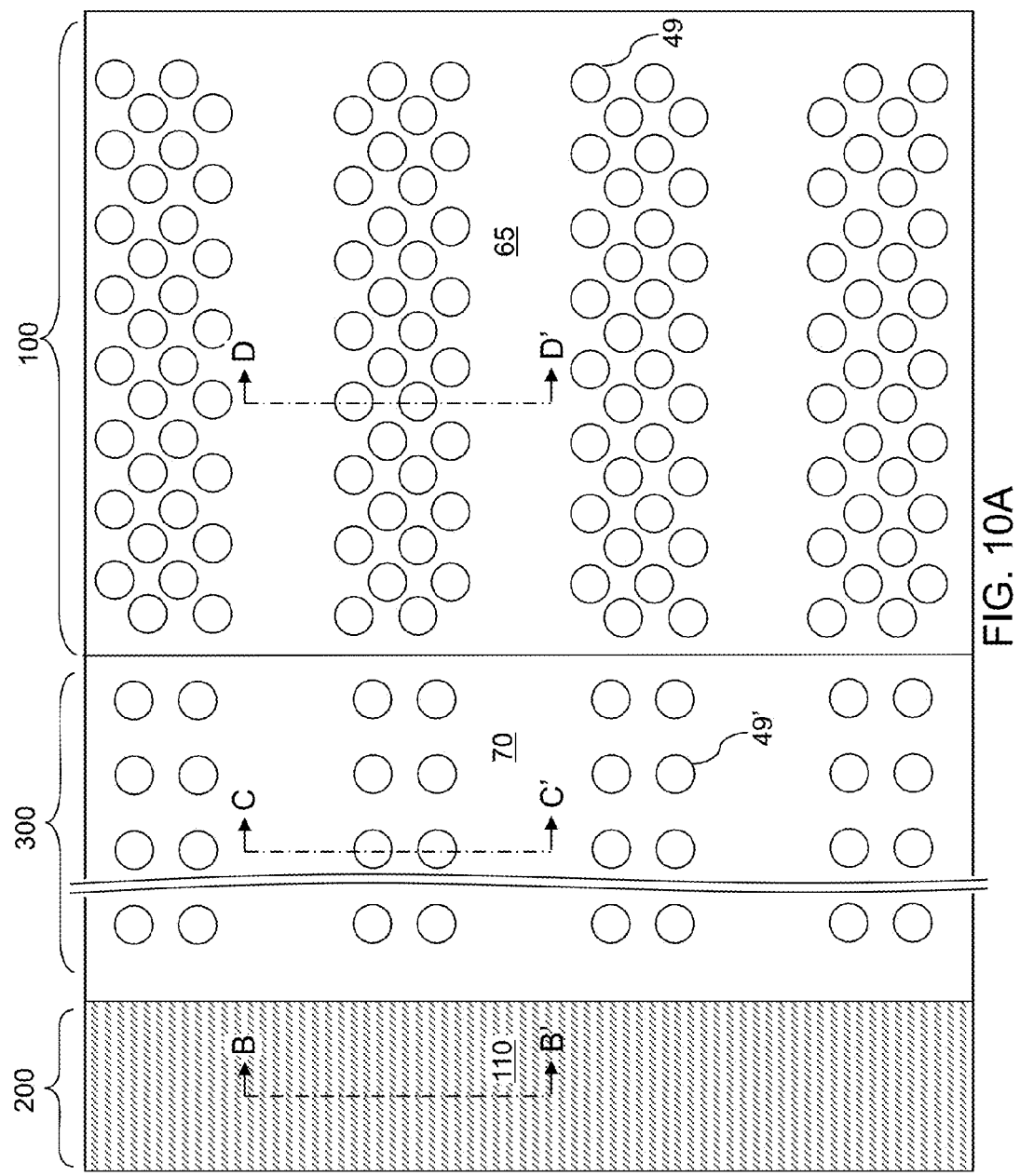
FIG. 10A is a top-down view of the first or second exemplary structure after formation of memory openings and epitaxial channel portions according to the second embodiment of the present disclosure.

Referring to FIG. 9, a lower epitaxial semiconductor pedestal 110A can be formed in the peripheral device region 200, which is the region in which a top surface of the single crystalline substrate semiconductor material of the semiconductor material layer 10 is physically exposed. The lower epitaxial semiconductor pedestal 110A can be formed by a selective epitaxy process, which is herein referred to as a first selective epitaxy process. The lower epitaxial semiconductor pedestal 110A comprises a single crystalline semiconductor material in epitaxial alignment with the single crystalline substrate semiconductor material of the semiconductor material layer 10. Optionally, the lower epitaxial semiconductor pedestal 110A can be doped with electrical dopants of a suitable conductivity type. The top surface of the lower epitaxial semiconductor pedestal 110A can be located below the horizontal plane including the top surface of the planarization stopping layer 80 and below the top surface of the retro-stepped dielectric material portion 65. The sidewall surfaces of the lower epitaxial semiconductor pedestal 110A can contact a sidewall of the retro-stepped dielectric material portion 65, which can be a substantially vertical sidewall. The angle of the sidewalls of the lower epitaxial semiconductor pedestal 110A with respect to a horizontal plane can be in a range from 80 degrees to 100 degrees, such as 90 degrees, although lesser and greater angles can also be employed.

The selective epitaxy process that forms the lower epitaxial semiconductor pedestal 110A can be the same as the selective epitaxy process that can be employed to form the epitaxial semiconductor pedestal 110 of FIG. 3. The duration of the selective epitaxy process can be selected such that the thickness of the lower epitaxial semiconductor pedestal 110A can be between 30% and 99% of the vertical distance between the top surface of the planarization stopping layer 80 and the top surface of the semiconductor substrate 8.

Referring to FIGS. 10A-10D, a photoresist layer (not shown) is applied over the second exemplary structure of FIG. 9 or over the first exemplary structure of FIG. 5. The photoresist layer can be applied over planarization stopping layer 80, the retro-stepped dielectric material portion 65, and either (i) the pedestal 110 of the first exemplary structure of the first embodiment shown in FIG. 5 or (ii) the lower epitaxial semiconductor pedestal 110A in the second structure according to the second embodiment shown in FIG. 9. The photoresist layer is lithographically patterned to form openings therein. The pattern of the openings is selected such that a first subset of the openings is formed within the device region 100 at which formation of memory stack structures is desired, and a second subset of the openings is formed within the contact region 300 at which formation of dummy support structures is desired. As used herein, a "dummy" structure refers to a structure that is not electrically active.

Memory openings 49 and dummy memory openings 49' can be formed by transferring the pattern of the openings through the planarization stopping layer 80, the insulating cap layer 70, the alternating stack (32, 42), the bottom insulator layer 31, the dielectric pad layer 12, and the retro-stepped dielectric material portion 65. In one embodiment, each memory opening 49 may have a smaller diameter or width than each dummy memory opening 49'. Alternatively, the openings 49 may have the same diameter or width. The transfer of the pattern of the openings can be performed employing an anisotropic etch such as a reactive ion etch. At least one semiconductor surface (e.g., layer 10) is physically exposed at a bottom portion of each memory opening 49 and each dummy memory opening 49' by the anisotropic etch. The photoresist layer can be subsequently removed, for example, by ashing.

In the method of the second embodiment, an upper epitaxial semiconductor pedestal 110B and epitaxial channel portions 11 can be simultaneously formed on the second exemplary structure of FIG. 9 by another selective epitaxy process, which is herein referred to as a second selective epitaxy process. The upper epitaxial semiconductor pedestal 110B is formed directly on the lower epitaxial semiconductor pedestal 110A. Each epitaxial channel portion 11 is formed directly on the physically exposed semiconductor surfaces of the semiconductor material layer 10 in the substrate 8.

In one embodiment, the second selective epitaxy process can be performed in a process region in which the supply of the reactant gas (i.e., the semiconductor precursor gas) limits the deposition rate of the semiconductor material. In this case, the upper epitaxial semiconductor pedestal 110B can have a greater thickness than the epitaxial channel portions 11. The combination of the lower epitaxial semiconductor pedestal 110A and the upper epitaxial semiconductor pedestal 110B constitutes an epitaxial semiconductor pedestal 110. In one embodiment, the thickness of the lower epitaxial semiconductor pedestal apportion 110A and the thickness of the upper epitaxial semiconductor pedestal 110B can be selected such that the top surface of the upper epitaxial semiconductor pedestal 110B is substantially coplanar with the top surface of the retro-stepped dielectric material portion 65 and/or the top surface of the planarization stopping layer 80. In another embodiment, the thickness of the lower epitaxial semiconductor pedestal apportion 110A and the thickness of the upper epitaxial semiconductor pedestal 110B can be selected such that the top surface of the upper epitaxial semiconductor pedestal 110B is formed above a horizontal plane including the top surface of the retro-stepped dielectric material portion 65 and the top surface of the planarization stopping layer 80. In this case, a touch-up chemical mechanical planarization process may be optionally performed after formation of memory stack structures and drain regions.

The plurality of memory openings 49 is formed through the remaining portion of the alternating stack (32, 42) after the first epitaxial semiconductor deposition process and prior to the second epitaxial semiconductor deposition process. The upper epitaxial semiconductor pedestal 110B comprises a single crystalline semiconductor material in epitaxial alignment with the single crystalline substrate semiconductor material of the semiconductor material layer 10. The semiconductor material of the upper epitaxial semiconductor pedestal 110B and the epitaxial channel portions 11 can be the same as, or can be different from, the semiconductor material of the lower epitaxial semiconductor pedestal 110A (e.g., both may comprise single crystal silicon). Thus, an epitaxial semiconductor pedestal 110 and a retro-stepped dielectric material portion 65 are formed over a semiconductor surface of the semiconductor substrate 8 and over the stepped surfaces, respectively. If desired, the portion 65 may also be formed over part of the substrate 8. The epitaxial semiconductor pedestal 110 is in epitaxial alignment with a single crystalline substrate semiconductor material in the semiconductor substrate 8.

In the method of the first embodiment, the epitaxial semiconductor pedestal 110 is masked during formation of the epitaxial channel portions 11 in the first exemplary structure of FIG. 5. Alternatively, the epitaxial channel portions 11 may be omitted entirely, and the channel 60 may directly contact the substrate 8 (e.g., directly contact layer 10). Optionally, the planarization stopping layer 80 can be removed selective to the insulating cap layer 70.

Referring to FIGS. 11A-11D, the next step in the methods of the first and the second embodiments include forming a memory film layer within each of the memory openings 49 and the dummy memory openings 49' by a sequential deposition of material layer. For example, at least one blocking dielectric layer, a memory material layer, and a tunneling dielectric layer can be sequentially deposited to form a contiguous layer stack. The at least one blocking dielectric layer includes at least one dielectric material such as a dielectric metal oxide material and/or silicon oxide. The memory material layer can include a charge trapping dielectric material such as silicon nitride or a plurality of conductive floating gates. The tunneling dielectric layer includes a single dielectric layer, such as silicon oxide, or a dielectric layer stack such as an ONO stack (i.e., a silicon oxide, silicon nitride, silicon oxide stack).

A first contiguous semiconductor material layer can be deposited over the memory film 50. The first contiguous semiconductor material layer can be a polycrystalline or an amorphous semiconductor material layer. An anisotropic etch can be performed to remove horizontal portions of the first contiguous semiconductor material layer and the memory film layer. Each remaining portion of the memory film layer within a memory opening 49 or within a dummy memory opening 49' constitutes a memory film 50. Each remaining portion of the first contiguous semiconductor material layer within a memory opening 49 or within a dummy memory opening 49' constitutes a first semiconductor material layer 601. An opening is formed though a stack of a first semiconductor material layer 601 and a memory film 50 at a bottom portion of each memory opening 49 and each dummy memory opening 49'. A top surface of an epitaxial channel portion 11 is physically exposed through an opening in each memory film 50. If portion 11 is omitted, then layer 10 may be exposed instead.

A second contiguous semiconductor material layer is deposited directly on the physically exposed top surfaces of the epitaxial channel portions 11. A dielectric fill material is deposited in the cavities that are unfilled portions of the memory openings 49 or the dummy memory openings 49'. The horizontal portions of the dielectric fill material and the second contiguous semiconductor material layer are removed from above the top surfaces of the retro-stepped dielectric material portion 65 and the epitaxial semiconductor pedestal 110 by a planarization process, which can include a recess etch and/or chemical mechanical planarization. Each remaining portion of the second contiguous semiconductor material layer constitutes a second semiconductor material layer 602. Each adjoining pair of a first semiconductor material layer 601 and a second semiconductor material layer 602 constitutes a vertical semiconductor channel 60. Each adjoining pair of a memory film 50 and a vertical semiconductor channel 60 in the device region 100 constitutes a memory stack structure 55 which is electrically contacted by a respective bit line, as will be described in more detail below. Each adjoining pair of a memory film 50 and a vertical semiconductor channel 60 in the contact region 300 constitutes a dummy memory stack structure 55' which is not electrically contacted by a respective bit line. The dielectric fill material is subsequently recessed below the top surface of the insulating cap layer 70. Each remaining portion of the dielectric fill material in a memory opening 49 or in a dummy memory opening 49' constitutes a dielectric core 62. A doped semiconductor material is deposited in the recess regions to form drain regions 63. Each drain region 63 contacts a vertical semiconductor channel 60 and overlies a dielectric core 62.

A contact level dielectric layer 72 is formed over the insulating cap layer 70, the retro-stepped dielectric material portion 65, and the epitaxial semiconductor pedestal 110. Backside contact trenches can be formed through the contact level dielectric layer 72, the insulating cap layer 70, the alternating stack (32, 42), the bottom insulator layer 31, the dielectric pad layer 12, and the retro-stepped dielectric material portion 65. In one embodiment, the memory stack structures 55 can be formed as groups that are laterally spaced from one another along a first horizontal direction hd1. In this case, the backside contact trenches can extend along a second horizontal direction hd2, which can be perpendicular to the first horizontal direction hd1. The backside contact trenches can extend into an upper portion of the semiconductor material layer 10.

Electrical dopants can be implanted into surface portions of the semiconductor material layer 10 to form source regions 61. In one embodiment, the semiconductor material layer 10 and the epitaxial channel portions 11 can have a doping of a first conductivity type (such as p-type), and the source regions 61 and the drain regions 63 can have a doping of s second conductivity type (such as n-type). The vertical semiconductor channels 60 can have a doping of the first conductivity type, or can be substantially intrinsic. As used herein, a semiconductor material is substantially intrinsic if the dopant concentration does not exceed $1.0 \times 10^{16}/\text{cm}^3$.

In one embodiment, the spacer material layers 42 can comprise sacrificial material layers. In this case, the sacrificial material layers 42 can be replaced with conductive material layers, for example, by removing the sacrificial material layers 42 selective to the insulator layer 32 employing a selective etch process to form lateral recesses, and by depositing at least one conductive material (such as a combination of a metallic nitride liner (e.g., TiN) and a metal fill material (e.g., W) to fill the lateral recesses. The portions of the conductive material outside of the lateral recesses (for example, in the backside contact trenches and over the contact level dielectric layer 72) can be removed by an isotropic etch. Each lateral recess is filled with an electrically conductive layer 46, which can function as control gate electrodes of the memory stack structures 55. The dummy memory stack structures 55' are used to support the spaced apart layers 32 in the stack after layers 42 are removed from the stack.

Alternatively, the spacer material layers 42 can be provided as electrically conductive layers. In this case, replacement of the spacer material layers with at least one conductive material is not necessary.

An insulating spacer 74 can be formed on sidewalls of each backside contact trench, for example, by deposition of a conformal dielectric material layer and an anisotropic etch that removes horizontal portions of the conformal dielectric material layer. Each remaining vertical portion of the conformal dielectric material layer constitutes an insulating spacer 74.

At least one conductive material can be deposited within the unfilled portions of the backside contact trenches to form a backside contact via structure 76 within each backside contact trench. In one embodiment, multiple conductive materials can be employed to form the backside contact via structures 76. In one embodiment, each backside contact via structure 76 can include a lower backside contact via portion 76A containing a first conductive material and an upper backside contact via portion 76B containing a second conductive material.

Referring to FIGS. 12A-12E, contact via structures 66 can be formed through the retro-stepped dielectric material portion 65 to a respective electrically conductive layer 46 in the methods of the first and the second embodiments. The contact via structures 66 provide electrical contact to the electrically conductive layers 46, which may be formed by replacement of sacrificial material layers (as embodied as the spacer material layers 42), or provided as the spacer material layers 42. Memory contact via structures 88 (i.e., drain electrodes/local interconnects) are formed in openings in a via level dielectric layer 90 deposited over the device such that each respective structure 88 contacts the drain region 63 in a respective memory stack structure 55. A plurality of bit lines 92 are then formed in electrical contact with the structures 88. The structures 88 and bit lines 92 do not electrically contact the dummy memory stack structures 55' in region 300.

The portion of the contact level dielectric layer 72 in the peripheral device region 200 can be removed, for example, by application and patterning of a photoresist layer to cover the device region 100 and the contact region 300, and by removing physically exposed portions of the contact level dielectric layer 72. At least one semiconductor device 240 can be formed on the epitaxial semiconductor pedestal 110. In an illustrative example, the at least one semiconductor device 240 can include at least one field effect transistor that includes a transistor source region 201, a transistor drain region 202, a transistor body region 203, a gate electrode 205 (that includes a gate dielectric and a gate conductor), and a gate spacer 206. The at least one semiconductor device 240 can be any semiconductor device known in the art.

The exemplary structure of FIGS. 12A-12E includes a multilevel structure, comprising an alternating stack {(32, 46) or (32, 42)} of electrically conductive layers (46 or 42) and insulator layers 32 located over a semiconductor substrate 8; an array of memory stack structures 55 located within memory openings through the alternating stack {(32, 46) or (32, 42)}; a retro-stepped dielectric material portion 65 overlying stepped surfaces of the alternating stack {(32, 46) or (32, 42)}; and an epitaxial semiconductor pedestal 110 in epitaxial alignment with a single crystalline substrate semiconductor material in the semiconductor substrate 8. In one embodiment, the pedestal 110 may have a top surface within a same horizontal plane as a top surface of the retro-stepped dielectric material portion 65. Preferably, the pedestal 110 has substantially vertical sidewalls and no stepped surfaces in the sidewalls.

At least one semiconductor device 240 can be located on the top surface of the epitaxial semiconductor pedestal 110. The at least one semiconductor device 240 can comprise a field effect transistor including a gate electrode 205 that protrudes above a top surface of a contact level dielectric layer 72 that overlies the memory stack structures 55. An array of drain regions 63 can contact a respective semiconductor channel 60 within the array of memory stack structures 55. A bottom surface of each drain region 63 can be located below a bottom surface of the insulating cap layer 70.

An array of epitaxial channel portions 11 can underlie the array of memory stack structures 55. The array of epitaxial channel portions 11 can have the same material composition as an upper portion of the epitaxial semiconductor pedestal 110. In one embodiment, the epitaxial semiconductor pedestal 110 can comprise an upper epitaxial semiconductor pedestal 110B and a lower epitaxial semiconductor pedestal 110A that comprises a different semiconductor material than the upper semiconductor pedestal 110B.

In one embodiment, contact via structures 66 can extend through the retro-stepped dielectric material portions 65 and contact a respective electrically conductive layer (46 or 42). In one embodiment, the entire contact area between the retro-stepped dielectric material portion 65 and the epitaxial semiconductor pedestal 110 can be within a two-dimensional plane, which can be the plane of a facet of the epitaxial semiconductor pedestal 110 and/or a substantially vertical sidewall of the retro-stepped dielectric material portion 65.

In one embodiment, the multistack structure can comprise a monolithic three-dimensional NAND memory device. The semiconductor substrate can comprise a silicon substrate. The monolithic three-dimensional NAND memory device can comprise an array of monolithic three-dimensional NAND strings over the silicon substrate. At least one memory cell in the first device level of the three-dimensional array of NAND strings can be located over another memory cell in the second device level of the three-dimensional array of NAND strings. The silicon substrate can contain an integrated circuit comprising a driver circuit for the memory device located thereon. Each NAND string can comprise a semiconductor channels. At least one end portion the semiconductor channel can extend substantially perpendicular to a top surface of the silicon substrate. Each NAND string can comprise a plurality of charge storage elements. Each charge storage element can be located adjacent to a respective semiconductor channel. In one embodiment, each charge storage element can be a portion of the charge storage material that is located adjacent to a control gate electrode as embodied as a conductive material layer (46 or 42). Each NAND string can comprise a plurality of control gate electrodes having a strip shape extending substantially parallel to the top surface of the silicon substrate. The plurality of control gate electrodes can comprise at least a first control gate electrode located in the first device level and a second control gate electrode located in the second device level.

Generally speaking, thermal budget is a big concern for complementary metal oxide semiconductor (CMOS) devices for three-dimensional (3D) NAND device manufacturing. Preferably, memory stack structures employ high quality material layers, which can be implemented by high temperature process steps. If a CMOS module (e.g., containing peripheral/driver circuit transistors) in the peripheral region 200 is built before the memory array formation in the device region 100, then the CMOS devices are impacted by all memory array thermal processes during formation of the memory array in region 100. According to the methods of the present disclosure, an epitaxial semiconductor pedestal is grown after staircase formation and prior to formation of memory stack structures. The CMOS devices are fabricated after formation of the memory stack structures, which reduces thermal budget that the CMOS devices of the peripheral device region 200 are subjected to. The planarity of the top surface of the retro-stepped dielectric material portion 65 can be improved, and the contact via structures (not shown) that are formed above the peripheral devices can be short, thereby reducing the parasitic resistance and the parasitic capacitance of the metal interconnect structures connected to the peripheral devices of the present disclosure.

Another advantage of the embodiments is that the pedestal 100 can be used as a planarization (e.g., polish) stop during planarization (e.g., CMP) of the retro-stepped dielectric material portion 65 when the pedestal 110 is formed after the stepped surfaces in region 300. Another non-limiting advantage of forming the pedestal 110 after forming the stepped surfaces in region 300 is that no stepped surfaces are formed in the sidewall(s) of the pedestal 110. This leaves more room at the flat top surface of the pedestal 110 to form peripheral (e.g., driver circuit) devices and/or a reduction of space used for the pedestal which permits more memory devices to be formed in region 100 for the same size substrate.

Referring to FIG. 13, a third exemplary structure according to a third embodiment of the present disclosure is illustrated, which can be the same as the first exemplary structure illustrated in FIG. 1. The alternating stack is herein referred to as a first alternating stack 1000, and includes insulator layers and spacer material layers. The spacer material layers may be electrically conductive layers, or can be sacrificial material layers that are subsequently removed. In one embodiment, the spacer material layers can be sacrificial material layers, which are herein referred to as first sacrificial material layers 42. The insulator layers are herein referred to as first insulator layers 32. The first insulator layers 32 can be the same as the insulator layers 32 of the first embodiment, and the first sacrificial material layers 42 can be the same as the sacrificial material layers 42 of the first embodiment. The number of repetitions in the first alternating stack 1000 may be the same as, or may be different from, the number of repetitions of the alternating stack in the first embodiment.

A first insulating cap layer 70 and a first planarization stopping layer 80 can be formed over the first alternating stack (32, 42). The first insulating cap layer 70 can include the same material as, and can have the same thickness as, the insulating cap layer 70 of the first embodiment. The first planarization stopping layer 80 can include the same material as, and can have the same thickness as, the planarization stopping layer 80 of the first embodiment.

Referring to FIG. 14, first stepped surfaces can be formed on the first alternating stack employing the same methods as in the first embodiment. A first stepped cavity 69 extending over the contact region 300 and the peripheral device region 200 can be formed. The first stepped cavity 69 can have various stepped surfaces such that the horizontal cross-sectional shape of the stepped cavity changes in steps as a function of the vertical distance from the top surface of the substrate 8. The same processing steps may be employed as in the first embodiment.

Figure 15:
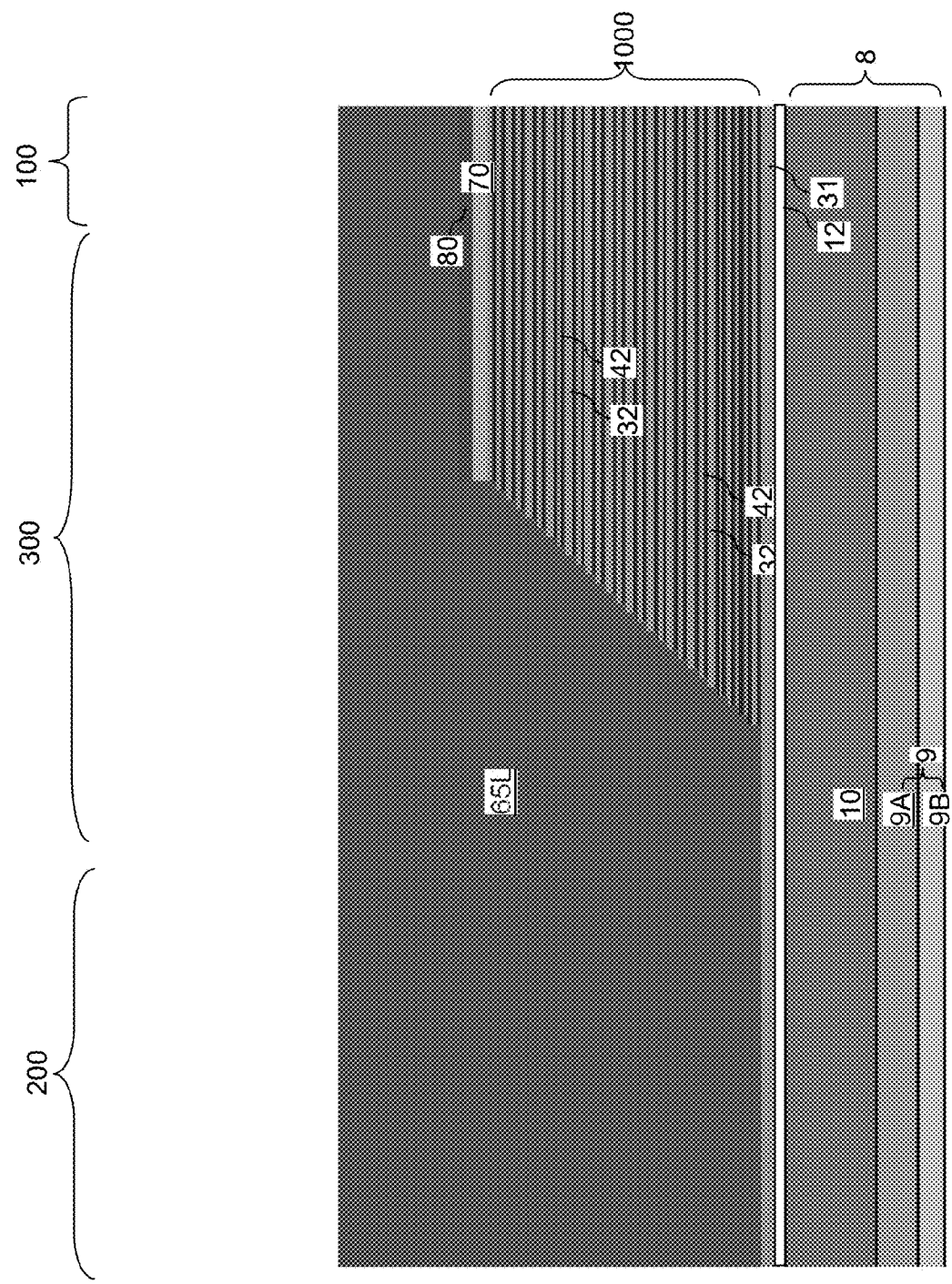
FIG. 15 is a vertical cross-sectional view of the third exemplary structure after deposition of a first dielectric fill material layer according to the third embodiment of the present disclosure.

Referring to FIG. 15, a first dielectric fill material layer 65L is deposited in the stepped cavity 69, which is present in the contact region 300, and over the first alternating stack 1000 in the device region 100. The first dielectric fill material layer 65L includes a dielectric material that can be subsequently planarized employing a planarization process such as chemical mechanical planarization (CMP). The first dielectric fill material layer 65L can include the same material as the dielectric fill material layer 65L of the first embodiment. The first dielectric fill material layer 65L can completely fill the first stepped cavity 69 in the contact region 300.

Figure 16:
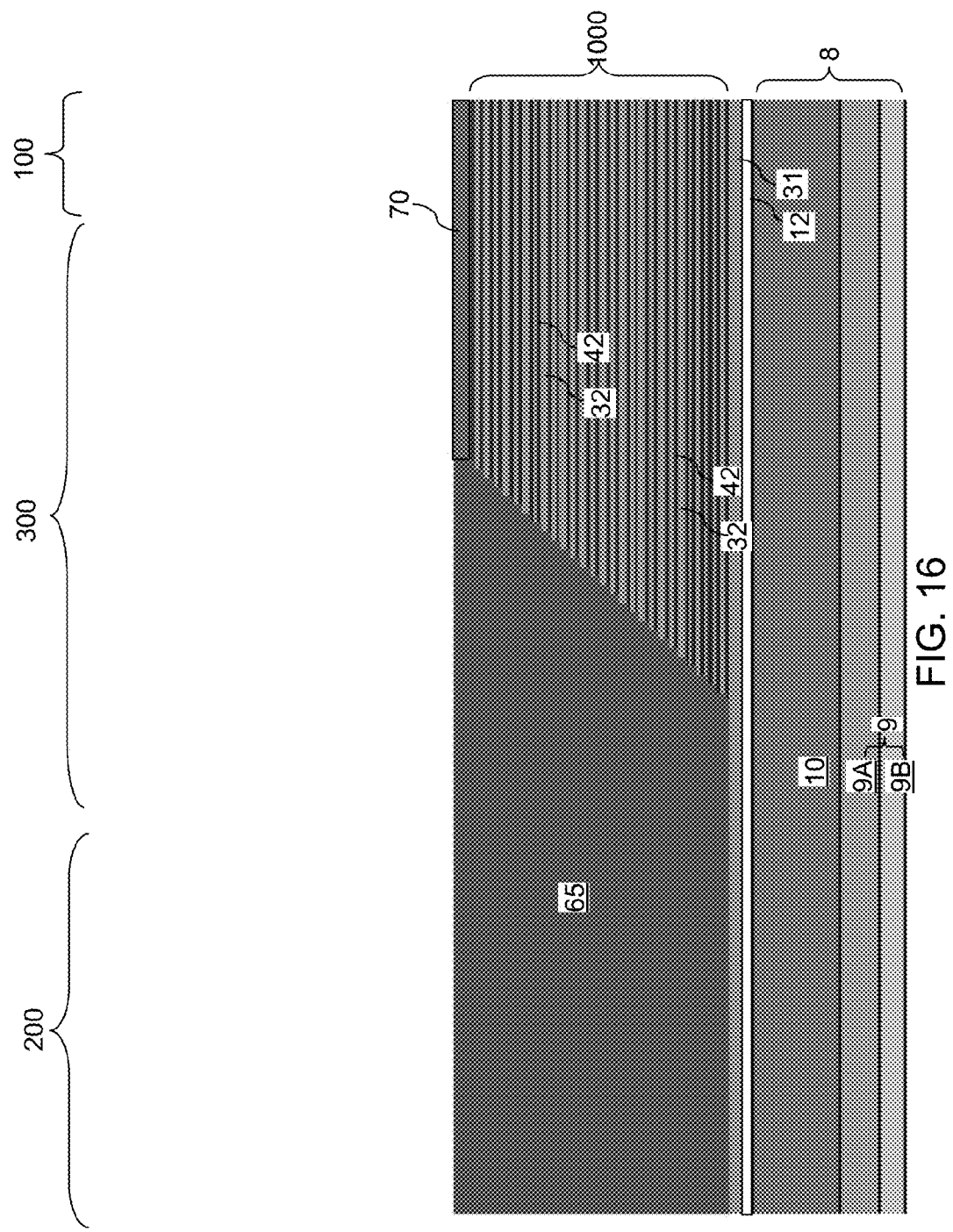
FIG. 16 is a vertical cross-sectional view of the third exemplary structure after formation of the first dielectric fill material portion according to the third embodiment of the present disclosure.

Referring to FIG. 16, a first planarization process can be performed to remove portions of the first dielectric fill material layer 65L from above a horizontal plane including the top surface of the first planarization stopping layer 80. For example, portions of the first dielectric fill material layer 65L can be removed from above the top surface of the first planarization stopping layer 80 by chemical mechanical planarization (CMP). The first dielectric fill material layer 65L can be planarized employing the first planarization stopping layer 80 as a stopping layer. The first planarization stopping layer 80 can be subsequently removed. The remaining portion of the first dielectric fill material layer 65L filling the first stepped cavity in the contact region 300 and the peripheral device region 200 constitutes a first retro-stepped dielectric material portion 65 (i.e., an insulating fill material portion). If silicon oxide is employed for the first retro-stepped dielectric material portion 65, the silicon oxide of the retro-stepped dielectric material portion 65 may, or may not, be doped with dopants such as B, P, and/or F.

Figure 17:
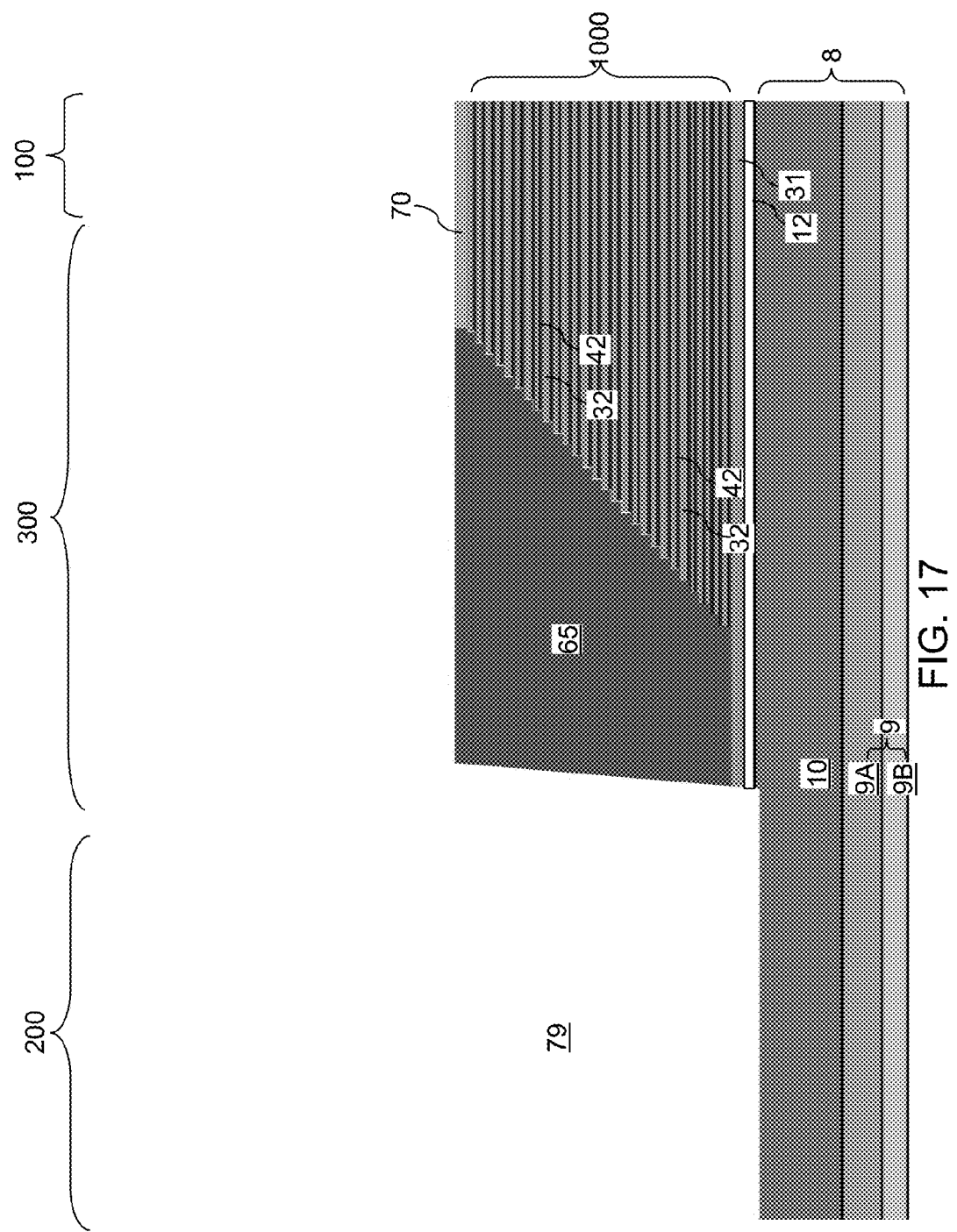
FIG. 17 is a vertical cross-sectional view of the third exemplary structure after patterning the first dielectric fill material portion to physically expose a top surface of single crystalline semiconductor layer according to the third embodiment of the present disclosure.

Referring to FIG. 17, a photoresist layer (not shown) can be applied over the first insulating cap layer 70 and the first retro-stepped dielectric material portion 65, and can be patterned to cover the device region 100 and the contact region 300, while not covering the peripheral device region 200. An anisotropic etch or an isotropic etch can be performed to remove a portion of the first retro-stepped dielectric material portion 65 from the peripheral device region 200. In one embodiment, an anisotropic etch can be employed to remove the physically exposed region of the first retro-stepped dielectric material portion 65 from above the top surface of the semiconductor substrate 8 in the peripheral device region 200.

The first retro-stepped dielectric material portion 65 is reduced in size due to the anisotropic etch. Specifically, a remaining portion of the deposited dielectric material over the first stepped surfaces in the contact region 300 constitutes the first retro-stepped dielectric material portion 65. Thus, the first retro-stepped dielectric material portion 65 (as provided after the processing steps of FIG. 17) is formed by deposition and patterning of a dielectric material over the substrate 8. A first peripheral region cavity 79 is formed within the volume from which a portion of the first retro-stepped dielectric material portion 65 is removed.

Figure 18:
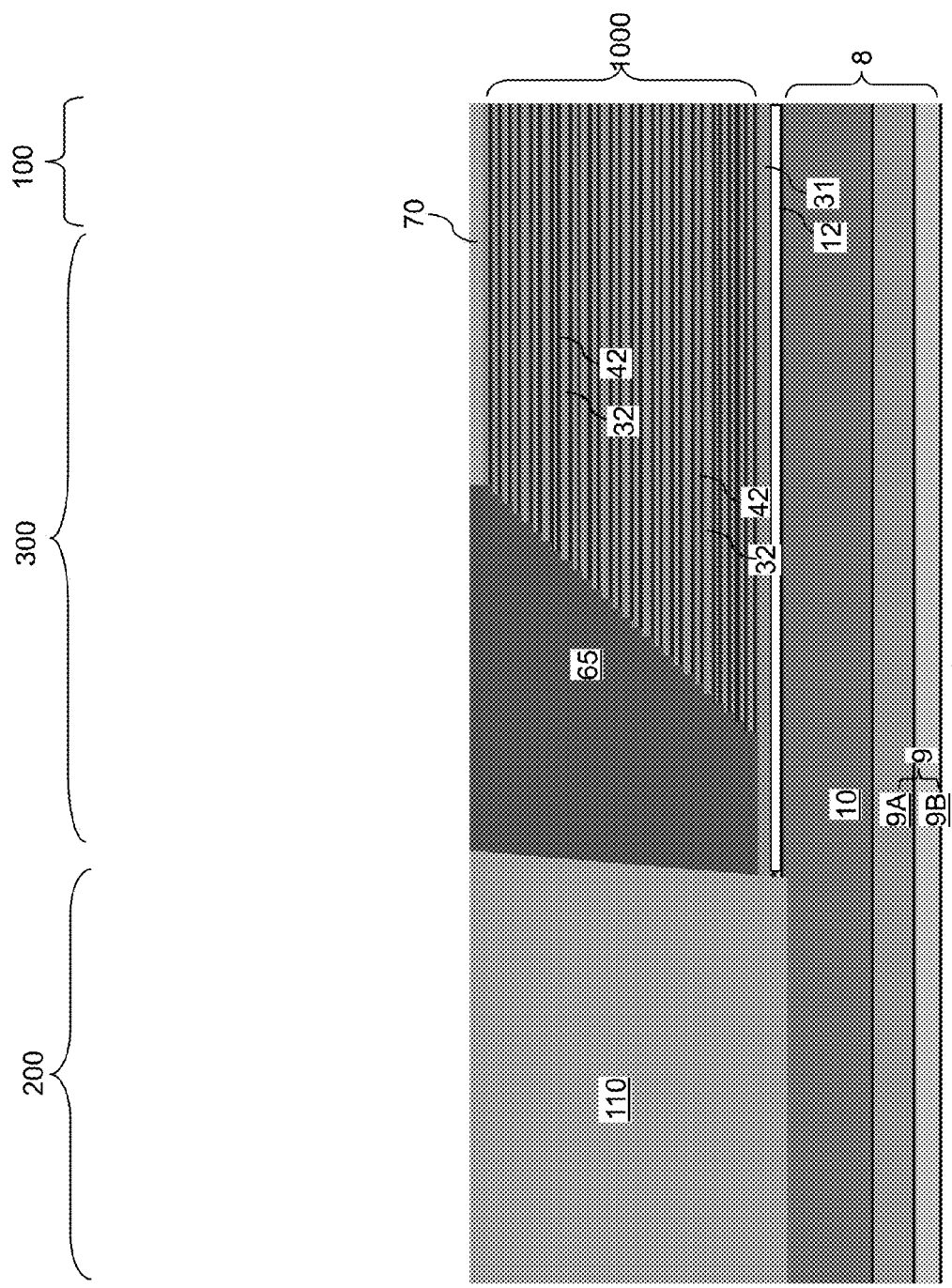
FIG. 18 is a vertical cross-sectional view of the third exemplary structure after formation of a first epitaxial semiconductor pedestal according to the third embodiment of the present disclosure.

Referring to FIG. 18, a first epitaxial semiconductor pedestal 110 can be formed in the peripheral device region 200, which is the region in which a top surface of the single crystalline substrate semiconductor material of the semiconductor material layer 10 is physically exposed. The first epitaxial semiconductor pedestal 110 can be formed by a selective epitaxy process. The first epitaxial semiconductor pedestal 110 comprises a single crystalline semiconductor material (e.g., single crystal silicon) in epitaxial alignment with the single crystalline substrate semiconductor material (e.g., single crystal silicon) of the semiconductor material layer 10. Optionally, the first epitaxial semiconductor pedestal 110 can be doped with electrical dopants of a suitable conductivity type. The top surface of the first epitaxial semiconductor pedestal 110 can be coplanar with, or can be located above, the horizontal plane including the top surface of the first insulating cap layer 70. The sidewall surface of the first epitaxial semiconductor pedestal 110 that contacts the first retro-stepped dielectric material portion 65 may be substantially vertical. In this case, the angle of the substantially vertical sidewalls of the first epitaxial semiconductor pedestal 110 with respect to a horizontal plane (e.g., the top surface of the substrate) can be in a range from 80 degrees to 100 degrees, such as 90 degrees. Alternatively, the sidewall surface of the first epitaxial semiconductor pedestal 110 that contacts the first retro-stepped dielectric material portion 65 may be tapered at a taper angle of 10 degrees or greater (e.g., at a taper angle from 10 degrees to 45 degrees). The taper angle is measured from the vertical direction that is perpendicular to the top surface of the substrate 8. The sidewall surface of the first epitaxial semiconductor pedestal 110 that contacts the first retro-stepped dielectric material portion 65 does not have any stepped surfaces.

The selective epitaxy process employed to form the epitaxial semiconductor pedestal 110 of the first embodiment may be employed to form the first epitaxial semiconductor pedestal 110 of the third embodiment. The process conditions (such as the deposition temperature, the partial pressure of the various gases in a process chamber, etc.) can be selected such that the deposited semiconductor material is epitaxial, i.e., single crystalline with atomic alignment with the single crystalline structure of the semiconductor material layer 10. Optionally, any excess portion of the deposited epitaxial semiconductor material formed above the horizontal plane including the top surface of the first insulating cap layer 70 can be removed by a planarization process. Chemical mechanical planarization (CMP) and/or a recess etch may be employed. In this case, the first epitaxial semiconductor pedestal 110 can have a top surface within the same horizontal plane as the top surfaces of the first insulating cap layer 70 and the first retro-stepped dielectric material portion 65. Alternatively, the top surface of the first epitaxial semiconductor pedestal 110 may be raised above, or recessed below, the horizontal plane including the top surfaces of the first insulating cap layer 70 and the first retro-stepped dielectric material portion 65.

Figure 19:
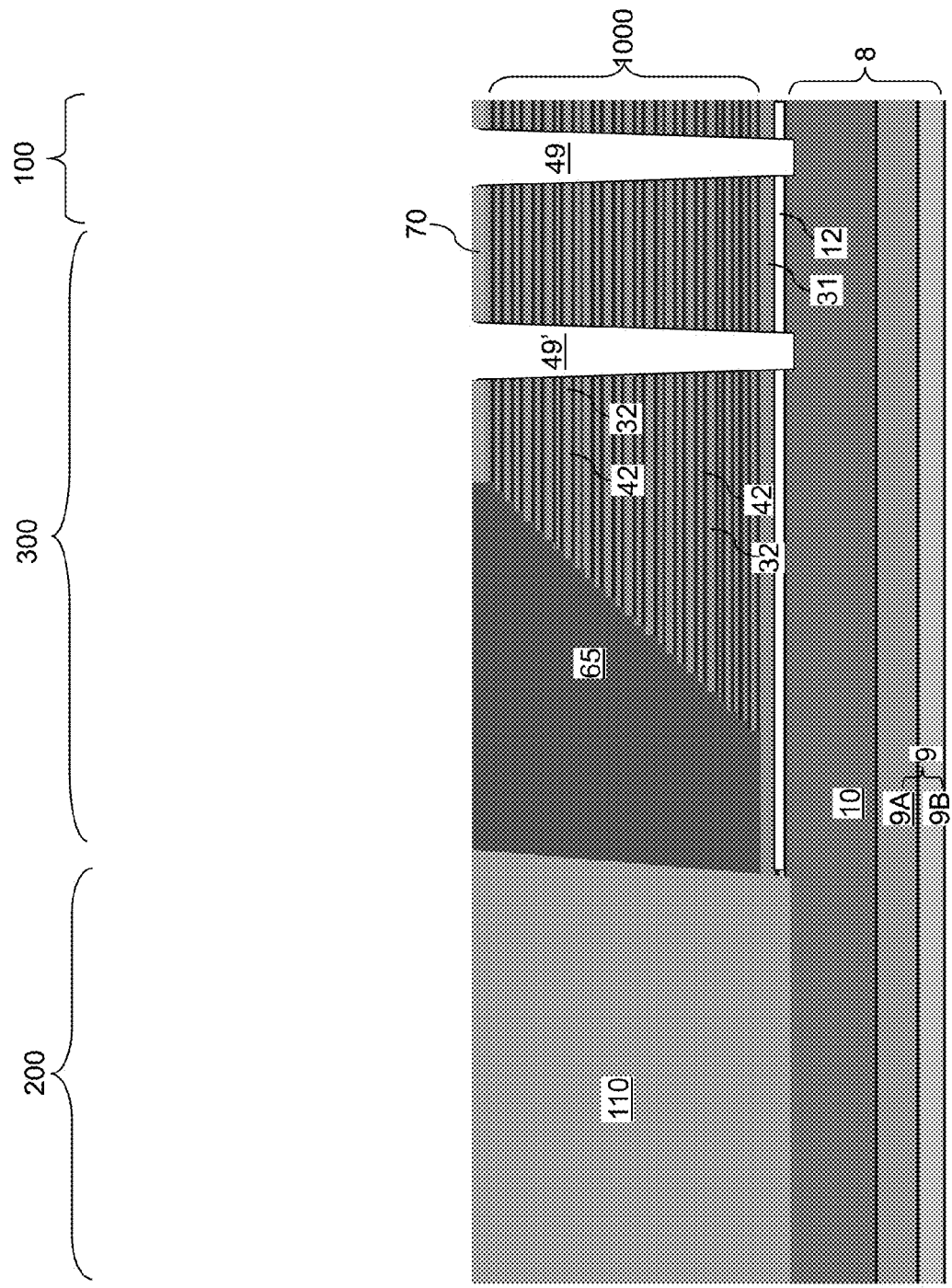
FIG. 19 is a vertical cross-sectional view of the third exemplary structure after formation of first memory openings according to the third embodiment of the present disclosure.

Referring to FIG. 19, a photoresist layer (not shown) is applied over the third exemplary structure. The photoresist layer may be applied over first planarization insulating cap layer 70, the first retro-stepped dielectric material portion 65, and the first epitaxial semiconductor pedestal 110. The photoresist layer can be lithographically patterned to form openings therein. The pattern of the openings is selected such that a first subset of the openings is formed within the device region 100 at which formation of memory stack structures is desired, and a second subset of the openings is formed within the contact region 300 at which formation of dummy support structures is desired. For example, the pattern of the memory openings 49 and the dummy memory openings 49' illustrated in FIG. 10A may be employed to form openings in the photoresist layer.

First memory openings 49 and first dummy memory openings 49' can be formed by transferring the pattern of the openings in the photoresist layer through the first insulating cap layer 70, the first alternating stack 1000, the optional bottom insulator layer 31, the optional dielectric pad layer 12, and the first retro-stepped dielectric material portion 65. In one embodiment, each first memory opening 49 may have a smaller diameter or width than each first dummy memory opening 49'. Alternatively, the memory openings 49 and the first dummy memory openings 49' may have the same diameter or width. The transfer of the pattern of the openings in the photoresist layer into the third exemplary structure can be performed employing an anisotropic etch such as a reactive ion etch. At least one semiconductor surface (e.g., the single crystalline semiconductor layer 10) is physically exposed at a bottom portion of each first memory opening 49 and each first dummy memory opening 49' by the anisotropic etch. The photoresist layer can be subsequently removed, for example, by ashing.

Figure 20:
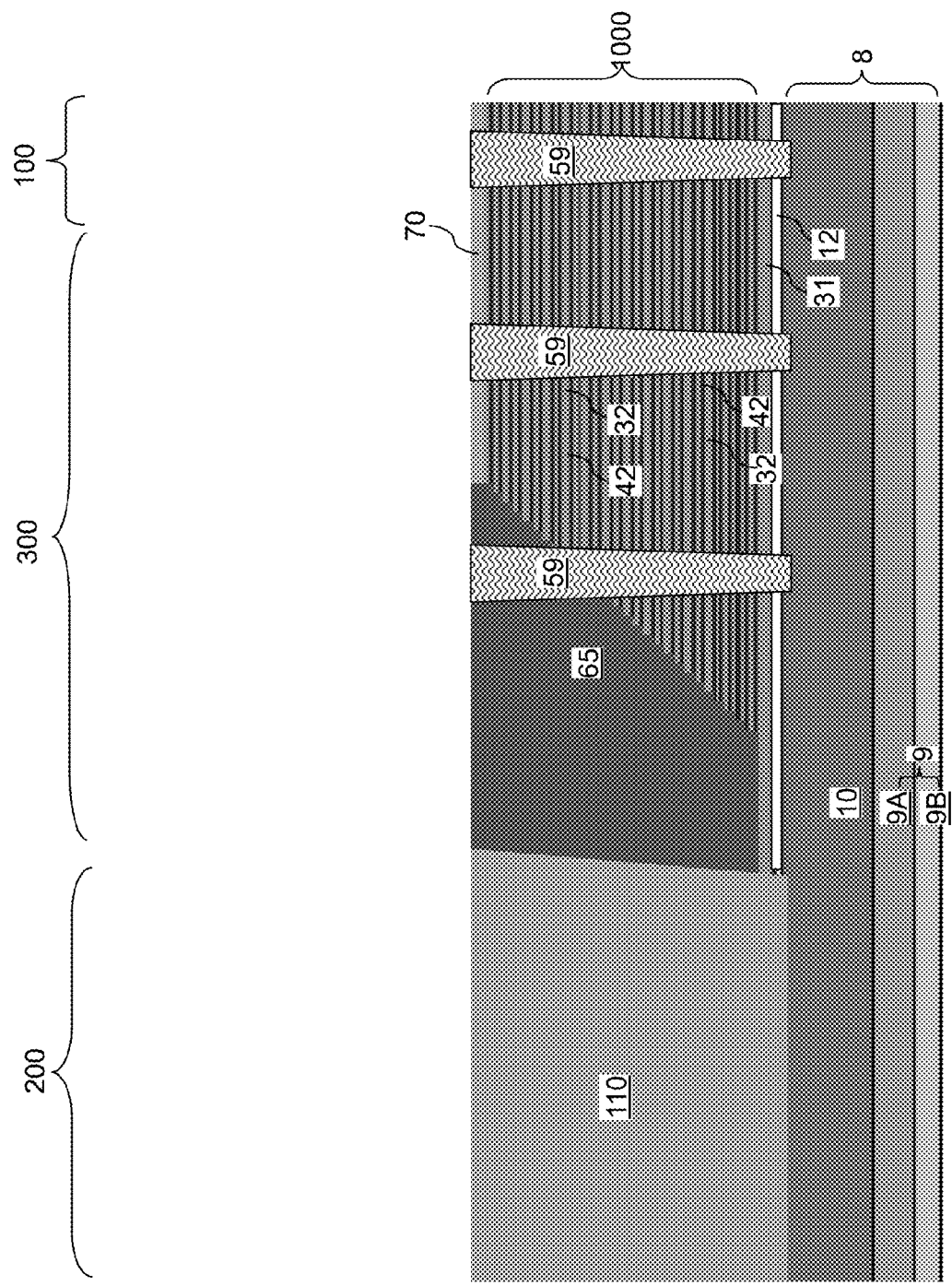
FIG. 20 is a vertical cross-sectional view of the third exemplary structure after formation of sacrificial fill structures according to the third embodiment of the present disclosure.

Referring to FIG. 20, sacrificial fill structures 59 can be formed in each of the first memory openings 49 and the first dummy memory openings 49'. The sacrificial fill structures 59 include a sacrificial material that can be subsequently removed selective to the materials of the single crystalline semiconductor layer 10, the first alternating stack 1000, and the first retro-stepped dielectric material portion 65. Optionally, a dielectric liner (not shown) may be formed on the surfaces of the first memory openings 49 and the first dummy memory openings 49' prior to formation of the sacrificial fill structures 59. The dielectric liner, if employed, may include a dielectric material layer such as a silicon oxide layer, a silicon nitride layer, a dielectric metal oxide layer, or a stack thereof.

For example, the sacrificial fill structures 59 may include a semiconductor material such as germanium or a silicon-germanium alloy, a dielectric material such as amorphous carbon, diamond-like carbon, an organic polymer, an inorganic polymer (such as a silicon-based polymer), or organosilicate glass. The sacrificial material of the sacrificial fill structures 59 may be formed by a self-planarizing method (such as spin-coating), a conformal deposition method (such as low pressure chemical vapor deposition, or a non-conformal deposition method (such as plasma-enhanced chemical vapor deposition). At least one cavity may, or may not, be formed within each sacrificial fill structure 59 depending on the method of deposition. Excess portions of the sacrificial material deposited above the horizontal plane including the top surfaces of the first insulating cap layer 70 and the first retro-stepped dielectric material portion 65 can be removed by a planarization process. The planarization process may employ, for example, chemical mechanical planarization (CMP) and/or a recess etch. Each sacrificial fill structures 59 may have a top surface that is substantially coplanar with the top surfaces of the first insulating cap layer 70 and the first retro-stepped dielectric material portion 65.

Figure 21:
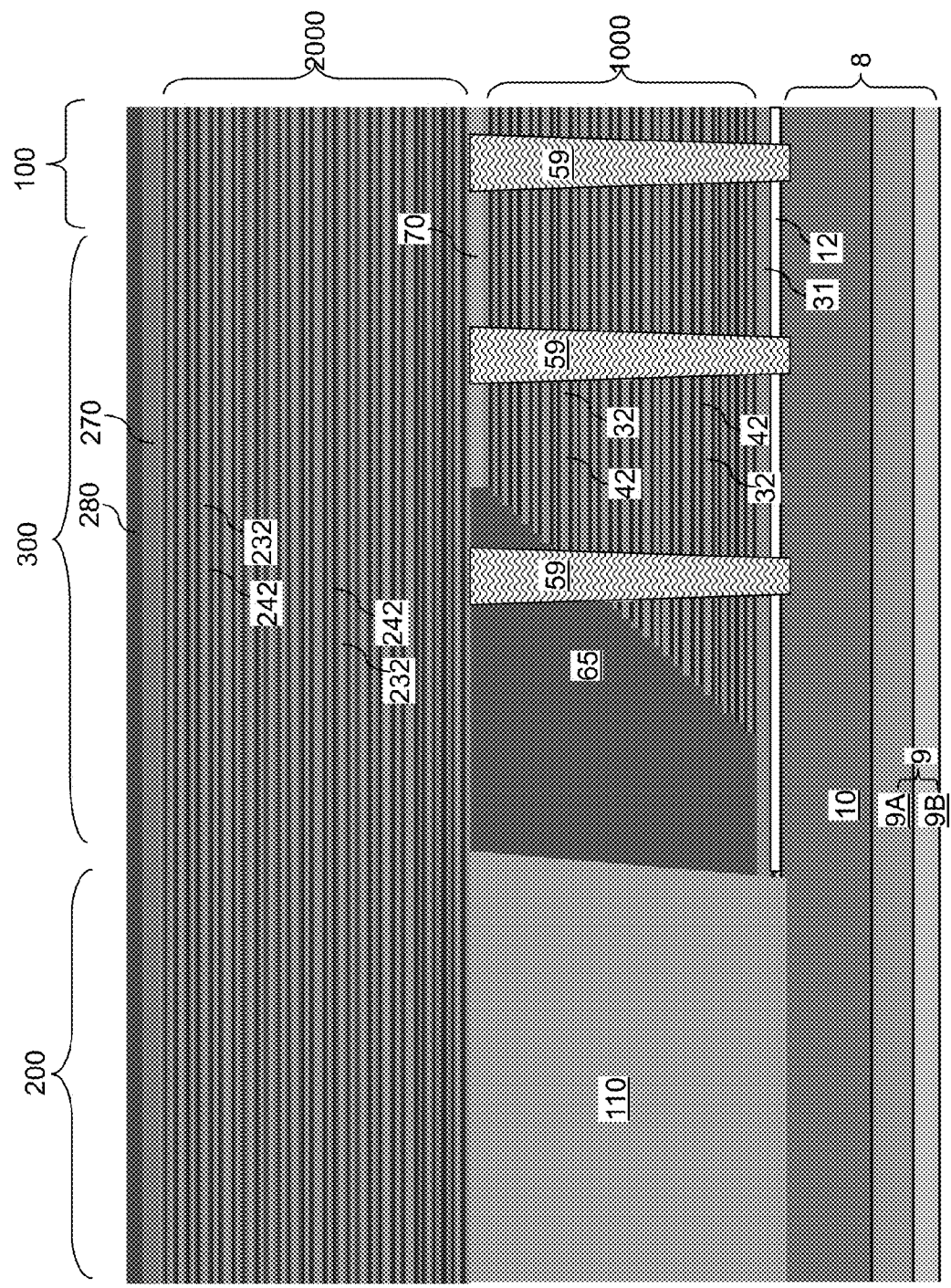
FIG. 21 is a vertical cross-sectional view of the third exemplary structure after formation of a second alternating stack according to the third embodiment of the present disclosure.

Referring to FIG. 21, a second alternating stack 2000 of spacer material layers and insulator layers can be formed over the first alternating stack 1000. The spacer material layers may be electrically conductive layers, or can be sacrificial material layers that are subsequently removed. In one embodiment, the spacer material layers can be sacrificial material layers, which are herein referred to as second sacrificial material layers 242. The insulator layers are herein referred to as second insulator layers 232. The second insulator layers 232 can include any material that can be employed for the first insulator layers 32 of the first embodiment, and the second sacrificial material layers 242 can include any material that can be employed for the sacrificial material layers 42 of the first embodiment. The range for the thickness of the second insulator layers 232 may be the same as the range for the thickness of the insulator layers 32 of the first embodiment. The range for the thickness of the second sacrificial material layers 242 may be the same as the range for the thickness of the sacrificial material layers 42 of the first embodiment or of the first stack 1000. The number of repetitions in the second alternating stack 2000 may be the same as, or may be different from, the number of repetitions of the alternating stack in the first embodiment. In one embodiment, the second insulator layers 232 may include the same material as the first insulator layers 32 of the first alternating stack 1000, and the second sacrificial material layers 242 may include the same material as the first sacrificial material layers 42 of the first alternating stack 1000.

A second insulating cap layer 270 and a second planarization stopping layer 280 can be formed over the second alternating stack 2000. The second insulating cap layer 270 can include the same material as, and can have the same thickness as, the first insulating cap layer 70. The second planarization stopping layer 280 can include the same material as, and can have the same thickness as, the first planarization stopping layer 80.

Figure 22:
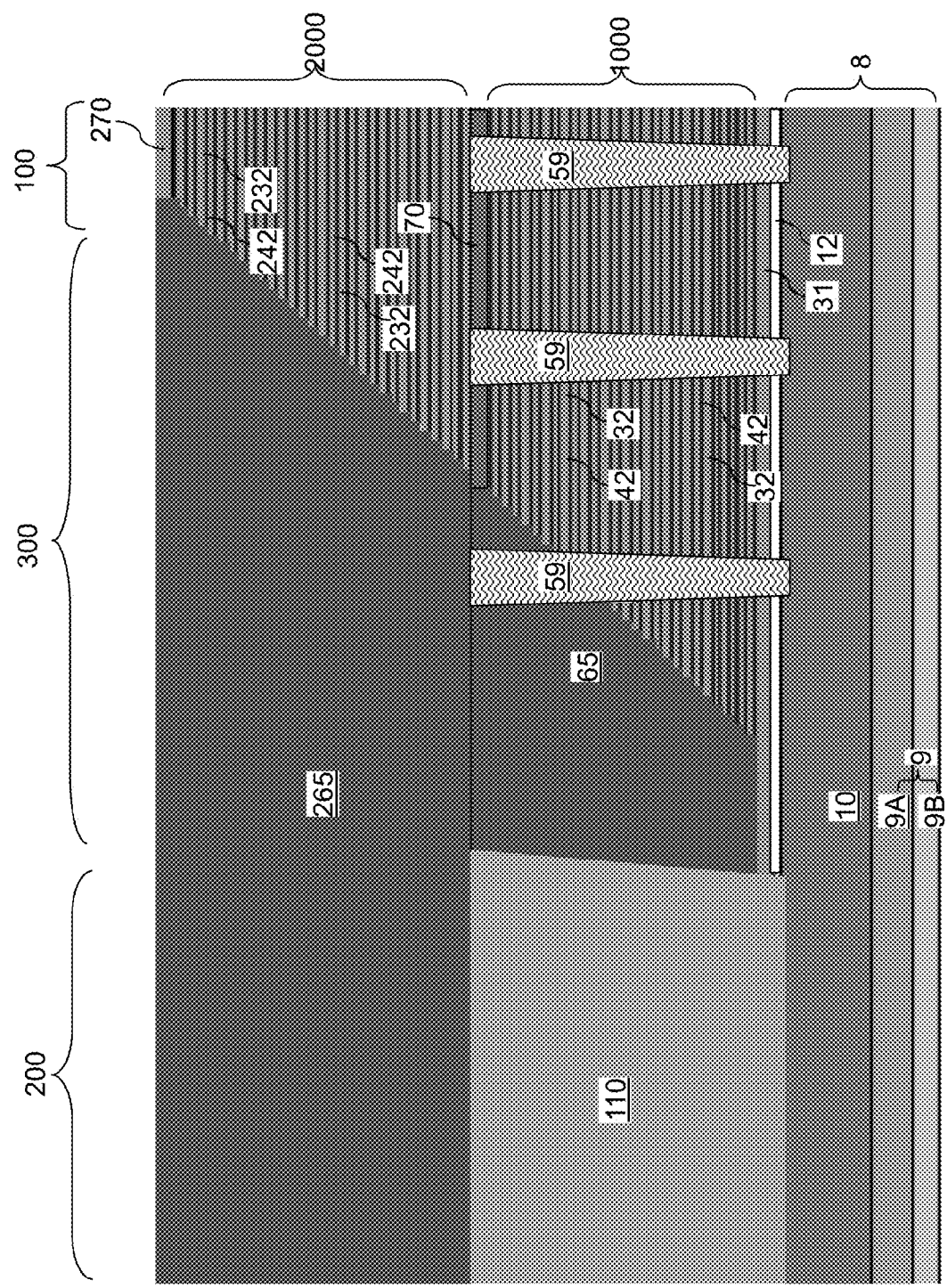
FIG. 22 is a vertical cross-sectional view of the third exemplary structure after formation of second stepped terraces and a second dielectric fill material portion according to the third embodiment of the present disclosure.

Referring to FIG. 22, second stepped surfaces can be formed on the second alternating stack 2000 employing the same methods as during formation of the first stepped surfaces on the first alternating stack 1000. The second stepped surfaces can be staggered with respect to the first stepped surfaces such that the area of the second stepped surfaces adjoins the area of the first stepped surfaces, and is more proximal to the device region 100 than the area of the first stepped surfaces that are present on the first alternating stack 1000. A second stepped cavity extending over the contact region 300 and the peripheral device region 200 can be formed. The second stepped cavity can overlie the entirety of the first stepped surfaces. The second stepped cavity can have various stepped surfaces such that the horizontal cross-sectional shape of the stepped cavity changes in steps as a function of the vertical distance from the top surface of the substrate 8.

A second dielectric fill material layer can be deposited in the second stepped cavity, which is present in the contact region 300, over the second alternating stack 2000 in the device region 100, over the first retro-stepped dielectric material portion 65 in the contact region 300, and over the epitaxial semiconductor pedestal 110 in the peripheral device region 200. The second dielectric fill material layer includes a dielectric material that can be subsequently planarized employing a planarization process such as chemical mechanical planarization (CMP). The second dielectric fill material layer can include any material that can be employed for the dielectric fill material layer 65L of the first embodiment. In one embodiment, the second dielectric fill material layer can include the same material as the dielectric material of the first retro-stepped dielectric material portion 65. The second dielectric fill material layer can completely fill the second stepped cavity in the contact region 300.

A second planarization process can be performed to remove portions of the second dielectric fill material layer from above a horizontal plane including the top surface of the second planarization stopping layer 280. For example, portions of the second dielectric fill material layer can be removed from above the top surface of the second planarization stopping layer 280 by chemical mechanical planarization (CMP). The second dielectric fill material layer can be planarized employing the second planarization stopping layer 280 as a stopping layer. The remaining portion of the second dielectric fill material layer filling the second stepped cavity in the contact region 300 and the peripheral device region 200 constitutes a second retro-stepped dielectric material portion 265 (i.e., an insulating fill material portion). If silicon oxide is employed for the second retro-stepped dielectric material portion 265, the silicon oxide of the retro-stepped dielectric material portion 265 may, or may not, be doped with dopants such as B, P, and/or F. The second planarization stopping layer 280 can be subsequently removed.

Figure 23:
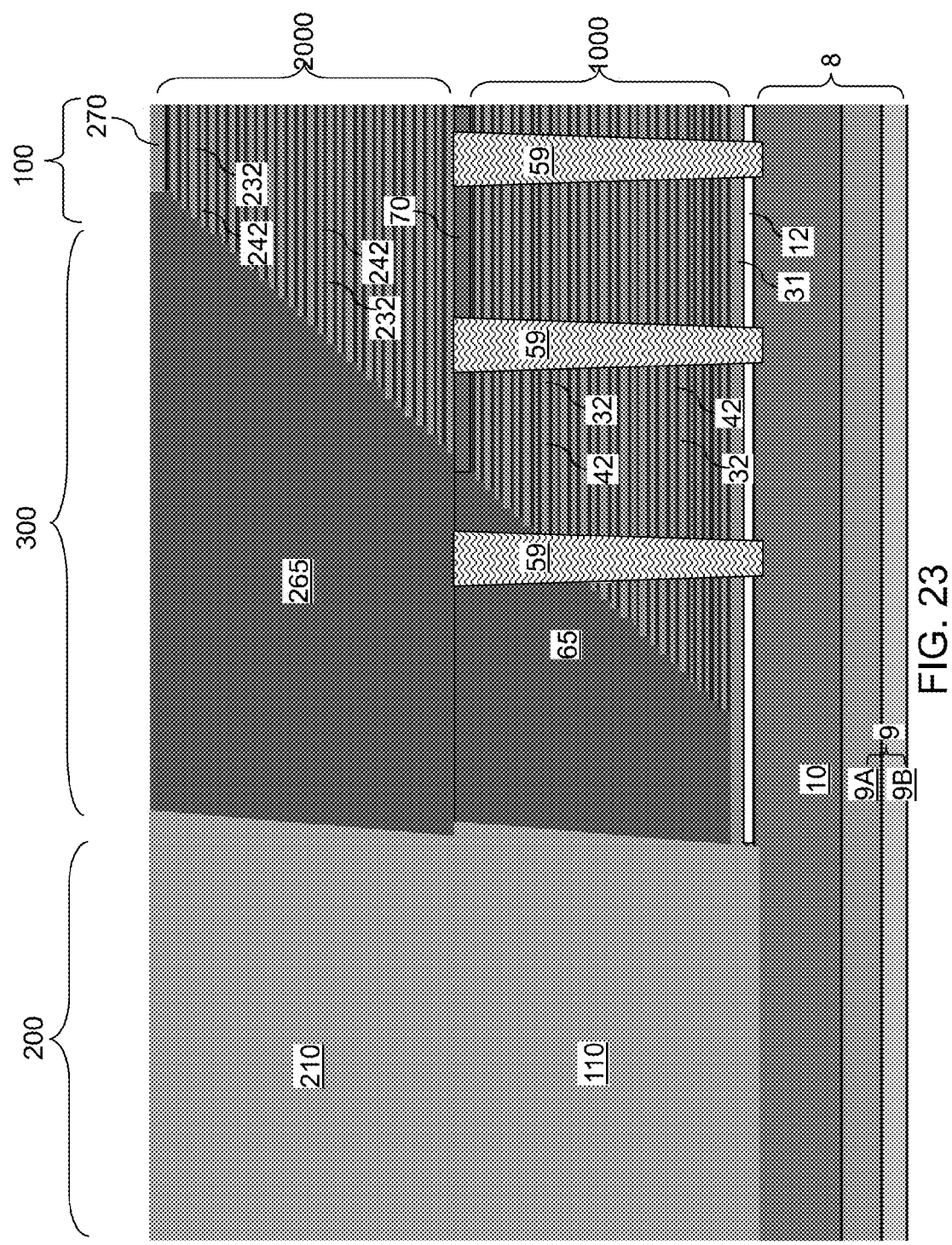
FIG. 23 is a vertical cross-sectional view of the third exemplary structure after formation of a second epitaxial semiconductor pedestal according to the third embodiment of the present disclosure.
Figure 24:
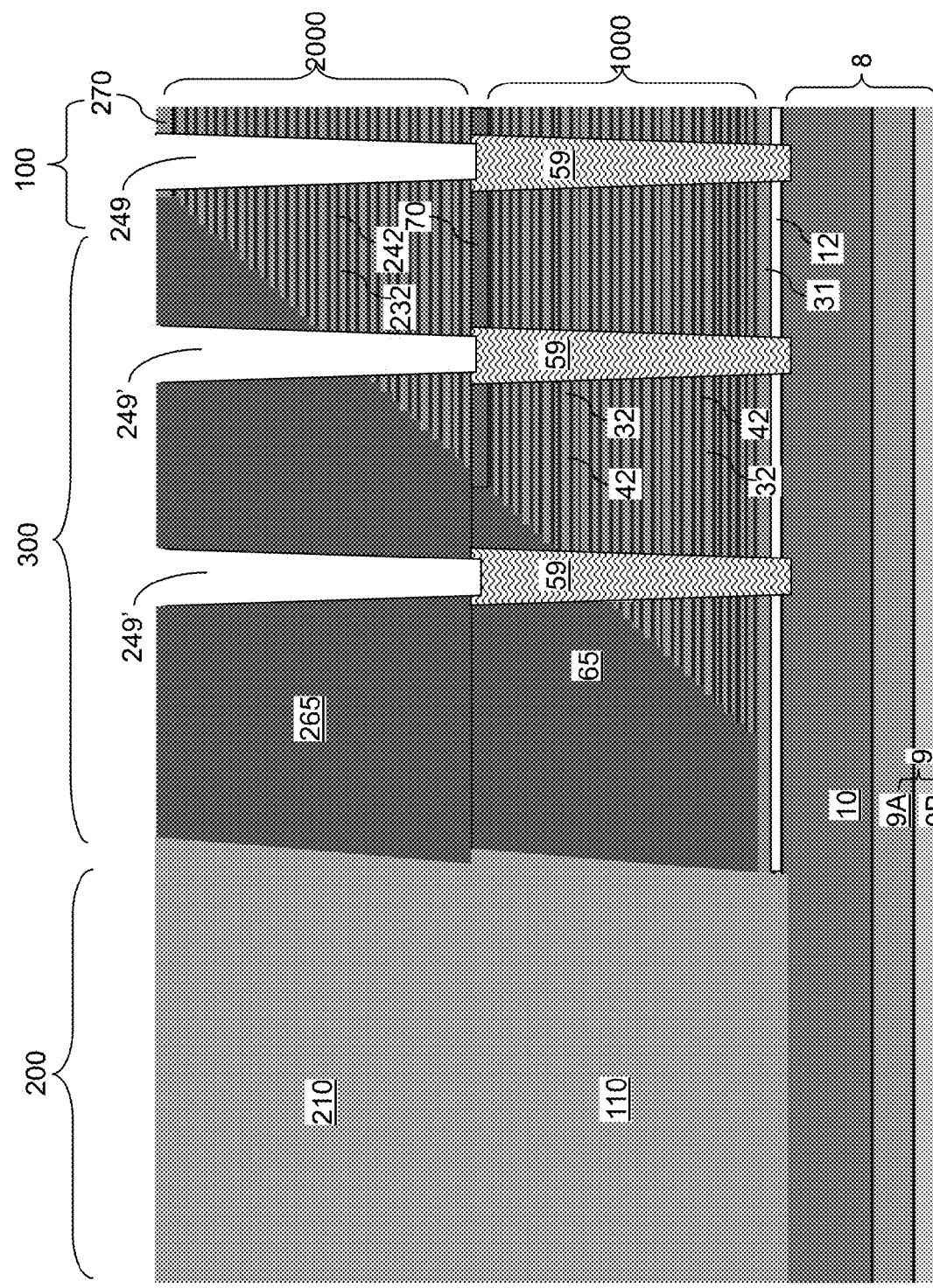
FIG. 24 is a vertical cross-sectional view of the third exemplary structure after formation of second memory openings according to the third embodiment of the present disclosure.

Referring to FIG. 23, a photoresist layer (not shown) can be applied over the second insulating cap layer 270 and the second retro-stepped dielectric material portion 265, and can be patterned to cover the device region 100 and the contact region 300, while not covering the peripheral device region 200. An anisotropic etch or an isotropic etch can be performed to remove a portion of the second retro-stepped dielectric material portion 265 from the peripheral device region 200. In one embodiment, an anisotropic etch can be employed to remove the physically exposed region of the second retro-stepped dielectric material portion 265 from above the top surface of the first epitaxial semiconductor pedestal 110 in the peripheral device region 200. In one embodiment, the first epitaxial semiconductor pedestal 110 may be employed as a stopping layer for the anisotropic etch process. In some embodiments, an overetch may be performed into the top surface of the first epitaxial semiconductor pedestal 110.

The second retro-stepped dielectric material portion 265 is reduced in size due to the anisotropic etch. Specifically, a remaining portion of the deposited dielectric material over the second stepped surfaces in the contact region 300 constitutes the second retro-stepped dielectric material portion 265. Thus, the second retro-stepped dielectric material portion 265 (as provided after the processing steps of FIG. 23) is formed by deposition and patterning of a dielectric material over the first retro-stepped dielectric material portion 65. A second peripheral region cavity is formed within the volume from which a portion of the second retro-stepped dielectric material portion 265 is removed.

A second epitaxial semiconductor pedestal 210 can be formed in the peripheral device region 200, which is the region in which a top surface of the first epitaxial semiconductor pedestal 110 is physically exposed. The second epitaxial semiconductor pedestal 210 can be formed by a selective epitaxy process. The second epitaxial semiconductor pedestal 210 comprises a single crystalline semiconductor material (e.g., single crystal silicon) that is in epitaxial alignment with the single crystalline semiconductor material of the first epitaxial semiconductor pedestal 110, and thus, is in epitaxial alignment with the single crystalline substrate semiconductor material (e.g., single crystal silicon) of the semiconductor material layer 10. Optionally, the second epitaxial semiconductor pedestal 210 can be doped with electrical dopants of a suitable conductivity type. The top surface of the second epitaxial semiconductor pedestal 210 can be coplanar with, or can be located above, the horizontal plane including the top surface of the second insulating cap layer 270. In case the top surface of the second epitaxial semiconductor pedestal 210 is formed above the horizontal plane including the top surface of the second insulating cap layer 270, a planarization process (such as chemical mechanical planarization and/or a recess etch) can be performed to remove a protruding portion of the second epitaxial semiconductor pedestal 280. In this case, the top surface of the second epitaxial semiconductor pedestal 210 after the planarization process can be coplanar with the top surfaces of the second insulating cap layer 270 and the second retro-stepped dielectric material portion 265.

The sidewall surface of the second epitaxial semiconductor pedestal 210 that contacts the second retro-stepped dielectric material portion 265 may be substantially vertical. In this case, the angle of the substantially vertical sidewalls of the second epitaxial semiconductor pedestal 210 with respect to a horizontal plane (e.g., the top surface of the substrate) can be in a range from 80 degrees to 100 degrees, such as 90 degrees. Alternatively, the sidewall surface of the second epitaxial semiconductor pedestal 210 that contacts the second retro-stepped dielectric material portion 265 may be tapered at a taper angle of 10 degrees or greater (e.g., at a taper angle from 10 degrees to 45 degrees). The sidewall surface of the second epitaxial semiconductor pedestal 210 that contacts the second retro-stepped dielectric material portion 265 does not have any stepped surfaces.

The selective epitaxy process employed to form the epitaxial semiconductor pedestal 110 of the first embodiment may be employed to form the second epitaxial semiconductor pedestal 210 of the third embodiment. The process conditions (such as the deposition temperature, the partial pressure of the various gases in a process chamber, etc.) can be selected such that the deposited semiconductor material is epitaxial, i.e., single crystalline with atomic alignment with the single crystalline structure of the first epitaxial semiconductor pedestal 110, and thus, with atomic alignment with the single crystalline structure of the semiconductor material layer 10. Optionally, any excess portion of the deposited epitaxial semiconductor material formed above the horizontal plane including the top surface of the second insulating cap layer 270 can be removed by a planarization process. Chemical mechanical planarization (CMP) and/or a recess etch may be employed. In this case, the second epitaxial semiconductor pedestal 210 can have a top surface within the same horizontal plane as the top surfaces of the second insulating cap layer 270 and the second retro-stepped dielectric material portion 265.

Second memory openings 249 and second dummy memory openings 249' are formed through the second alternating stack 2000 to the top surfaces of the sacrificial fill structures 59. The second memory openings 249 are formed in the device region 100, and second dummy memory openings 249' are formed in the contact region 300. Each second memory opening 249 can be formed in an area that substantially coincides with the area of a respective first memory opening 49. Each second dummy memory opening 249' can be formed in an area that substantially coincides with the area of a respective first dummy memory opening 49'.

For example, a lithographic material stack (not shown) including at least a photoresist layer can be formed over the second alternating stack 2000, and can be lithographically patterned to form openings within the lithographic material stack. The pattern in the lithographic material stack can be transferred through the second alternating stack 2000 and the second retro-stepped dielectric material portion 265 by at least one anisotropic etch that employs the patterned lithographic material stack as an etch mask. Portions of the second alternating stack 2000 and the second retro-stepped dielectric material portion 265 that underlie the openings in the patterned lithographic material stack are etched to form the second memory openings 249 and the second dummy memory openings 249'. In other words, the transfer of the pattern in the patterned lithographic material stack through the second alternating stack 2000 forms the second memory openings 249 and the second dummy memory openings 249'.

In one embodiment, the chemistry of the anisotropic etch process employed to etch through the materials of the second alternating stack 2000 can alternate to optimize etching of the second insulating layers 232 and the second sacrificial material layers 242 in the second alternating stack 2000 while providing a comparable average etch rate for the second dielectric material portion 265. The anisotropic etch can be, for example, a series of reactive ion etches. The sidewalls of the second memory openings 249 and the second dummy memory openings 249' can be substantially vertical, or can be tapered.

The second memory openings 249 are formed through the second alternating stack 2000 in areas overlying the sacrificial fill structures 59 located in the device region 100. The second dummy memory opening 249' can be formed through the second retro-stepped dielectric material portion and the second alternating stack 2000 in areas overlying the sacrificial fill structures 59 located in the contact region 200 concurrently with formation of the second memory openings 249. In one embodiment, the sacrificial fill structures 59 can be employed as an endpoint detection material to control the termination time of the anisotropic etch process. In one embodiment, the second memory openings 249 and the second dummy memory openings 249' may extend below the top surface of the sacrificial fill structures 59 by an overetch. The lateral dimensions (e.g., a diameter) of the second memory openings 249 and the second dummy memory openings 249' can be comparable to the lateral dimensions of the respective underlying sacrificial fill structures 59. For example, the lateral dimensions of each of the second memory openings 249 and the second dummy memory openings 249' can be from about 20 nm to 200 nm at an upper portion thereof, and can be about 10 nm to 150 nm at a lower portion thereof. In one embodiment, the second memory openings 249 and the first memory openings 49 can be formed as an array of openings, which can be a periodic two-dimensional array of openings. The second dummy memory openings 249' and the first dummy memory openings 49' can be formed as discrete openings that are mutually separated from one another, and may, or may not, form a periodic two-dimensional array pattern. The lateral separation distance among the second dummy memory openings 249' may be greater than twice (e.g., three time or more) than the nearest neighbor distance among the second memory openings 249.

In one embodiment, each bottom surface of the second memory openings 249 can be entirely within the area of a top surface of an underlying sacrificial fill structure 59. Each bottom surface of the second dummy memory openings 249' can be entirely within the area of a top surface of an underlying sacrificial fill structure 59. Subsequently, the patterned lithographic material stack can be subsequently removed, for example, by ashing.

Figure 25:
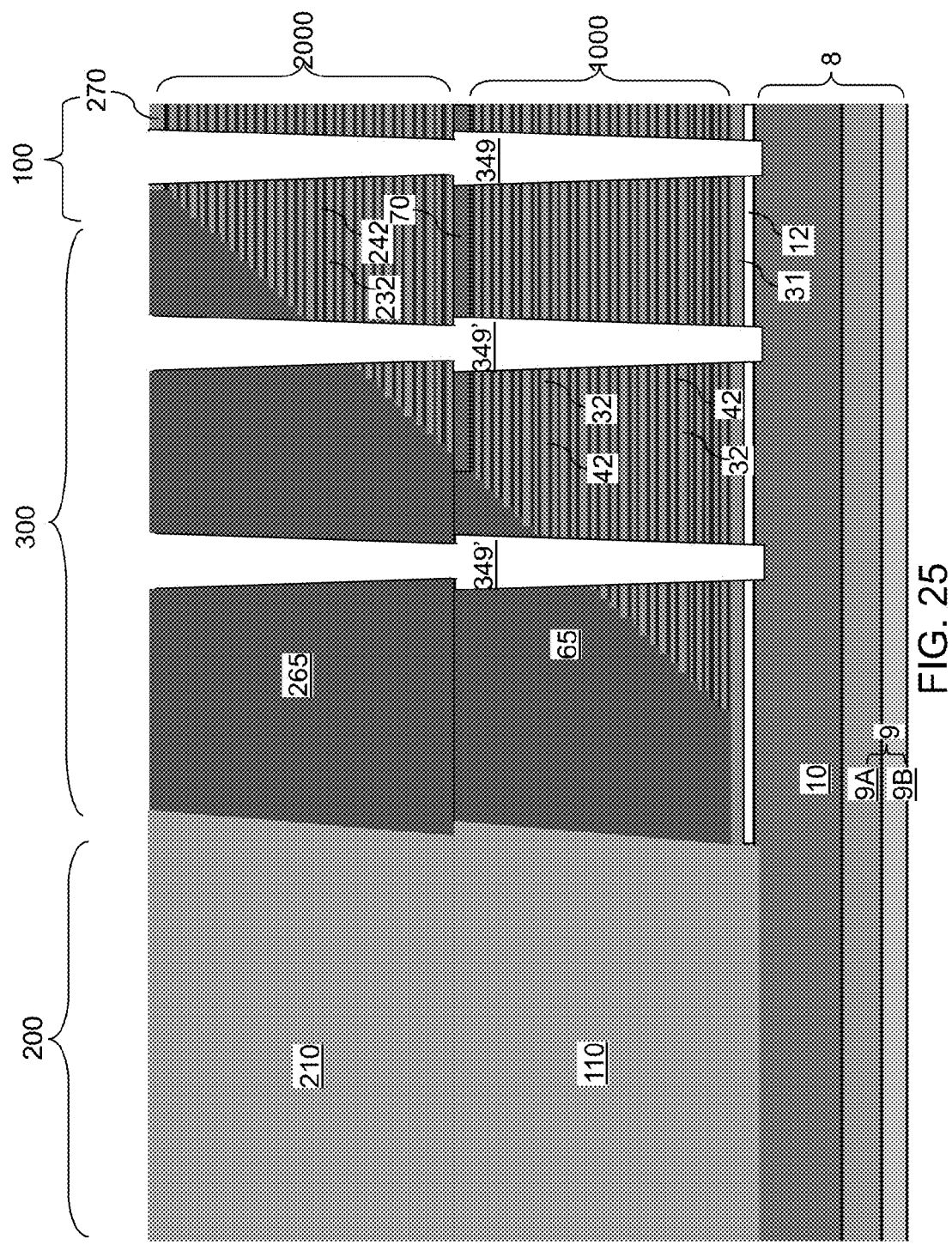
FIG. 25 is a vertical cross-sectional view of the third exemplary structure after formation of inter-stack memory openings according to the third embodiment of the present disclosure.

Referring to FIG. 25, the sacrificial fill structures 59 can be removed selective to the materials of the first alternating stack 1000, the second alternating stack 2000, the first and second retro-stepped dielectric material portions (65, 265), and the substrate 8. For example, if germanium or a silicon-germanium alloy is employed for the sacrificial fill structures 59, a wet etch employing hydrogen peroxide can be used. If amorphous carbon or an organic polymer is employed for the sacrificial fill structures 59, an ashing process can be employed. If an optional sacrificial liner is employed within the first memory openings 49 and the first dummy memory openings 49', the sacrificial liner can be removed by an etch process that is selective to the materials of the first alternating stack 1000, the second alternating stack 2000, the first and second retro-stepped dielectric material portions (65, 265), and the substrate 8.

Each second memory opening 249 is extended downward to include the volume of an underlying first memory opening 49, thereby forming vertically extending openings, which are herein referred to as inter-stack memory openings 349. Each inter-stack memory opening 349 extends through the first alternating stack 1000 and the second alternating stack 2000. As used herein, an "inter-stack" element refers to an element that extends through at least two alternating stacks. Each second dummy memory openings 249' is extended downward to include the volume of an underlying first memory opening 49', thereby forming additional vertically extending openings, which are herein referred to as inter-stack dummy memory openings 349'. Each inter-stack dummy memory opening 349' extends through the first alternating stack 1000, the second retro-stepped dielectric material portion 265, and optionally the second alternating stack 2000, and optionally the first retro-stepped dielectric material portion 65.

Each inter-stack memory opening 349 includes a volume of a vertically adjoining pair of a first memory opening 49 and a second memory opening 249, and extends at least between a first horizontal plane including a bottom surface of the first alternating stack 1000 to a second horizontal plane including a top surface of the second alternating stack 2000. Each inter-stack dummy memory opening 349' includes a volume of a vertically adjoining pair of a first dummy memory opening 49' and a second dummy memory opening 249', and extends at least between the first horizontal plane including the bottom surface of the first alternating stack 1000 to the second horizontal plane including the top surface of the second alternating stack 2000. The inter-stack memory openings 349 and the inter-stack dummy memory openings 349' are multi-level opening structures containing a first-level opening within the first alternating stack (1000) and a second-level opening in the second alternating stack 2000 or the second retro-stepped dielectric material portion 265.

Figure 26A:
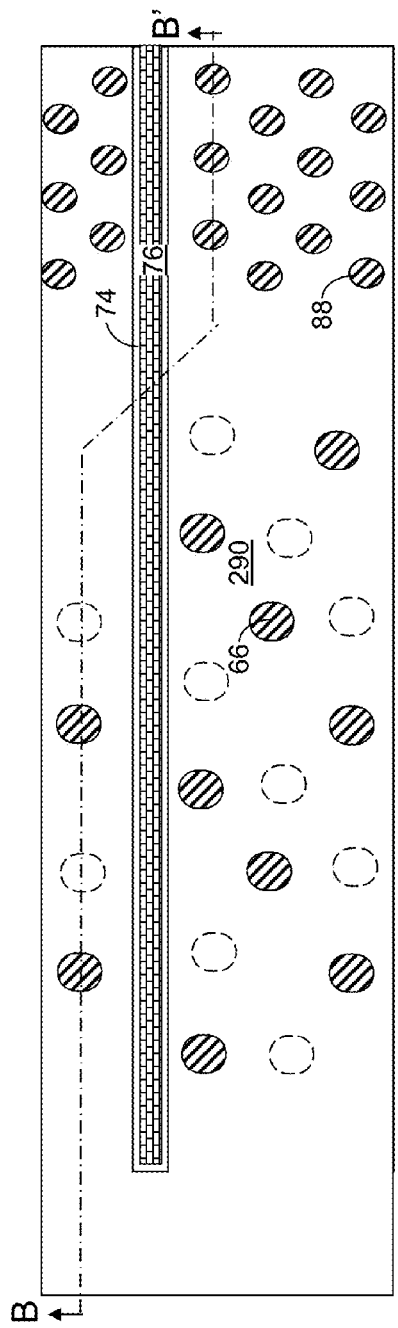
FIG. 26A is a top-down view of the third exemplary structure after formation of memory stack structures according to the third embodiment of the present disclosure.
Figure 26B:
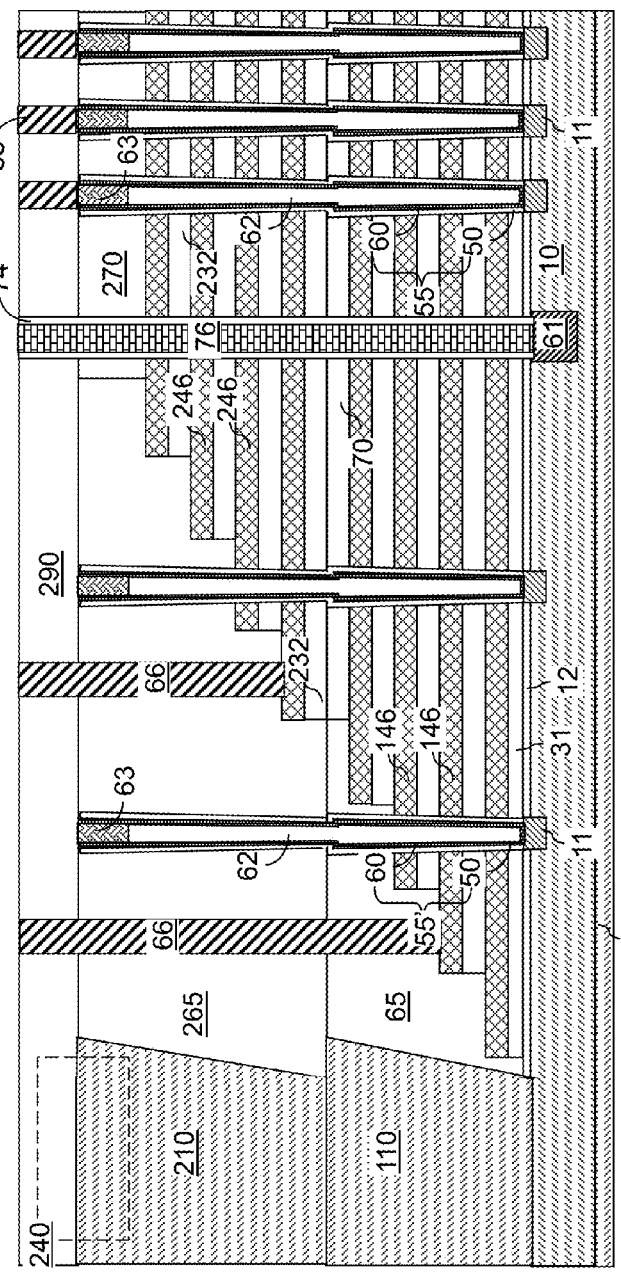
FIG. 26B is a vertical cross-sectional view of the third exemplary structure of FIG. 26A along line B-B' in FIG. 26A.

Referring to FIGS. 26A and 26B, epitaxial channel portions 11 may be optionally formed by a selective epitaxy process at the bottom of each inter-stack memory opening 349 and each inter-stack dummy memory opening 349'. The epitaxial channel portions 11 formed in the inter-stack memory openings 349 function as a portion of a channel of a respective vertical field effect transistor. The epitaxial channel portions 11 formed in the inter-stack dummy memory openings 349' are dummy structures that provide a filling material in the inter-stack dummy memory openings 349' to enhance structural integrity.

Memory stack structures 55 and dummy memory stack structures 55' can be simultaneously formed in the inter-stack memory openings 349 in the device region 100 and in the inter-stack dummy memory openings 349' in the contact region 300, respectively. In one embodiment, each memory stack structure 55 and each dummy memory structure 55' which function as a support pillar structure can have an identical set of elements. In other words, the set of all materials present within each memory stack structure 55 can be the same as the set of all materials present within each dummy memory stack structure 55'. Each memory stack structure 55 is formed by filling an inter-stack memory opening 349 with a set of materials, and each dummy memory stack structure 55' is formed by filling an inter-stack dummy memory opening 349' with the same set of materials deposited in the same processing steps.

In one embodiment, a memory film 50 can be formed on each sidewall of the inter-stack memory openings 349 and the inter-stack dummy memory openings 349'. In one embodiment, the memory film 50 can include a layer stack including, from outside to inside, a blocking dielectric layer, a memory material layer, and a tunneling dielectric layer. In one embodiment, the memory film 50 can be the same as in the first or second embodiment, i.e., can have the same thickness and material composition for each of the components therein.

The memory film 50 can be deposited as a layer stack of contiguous layers. An anisotropic etch can be performed to etch horizontal portions of the memory film 50 from above the second alternating stack 2000 and at the bottom of each inter-stack opening (349, 349'). The remaining portions of the memory film 50 are vertical portions that are located within a respective inter-stack memory opening 349 or inter-stack dummy memory opening 349'. An opening can be formed through each horizontal portion of the memory film 50 at the bottom of each inter-stack opening (349, 349') by the anisotropic etch.

Figure 11A:
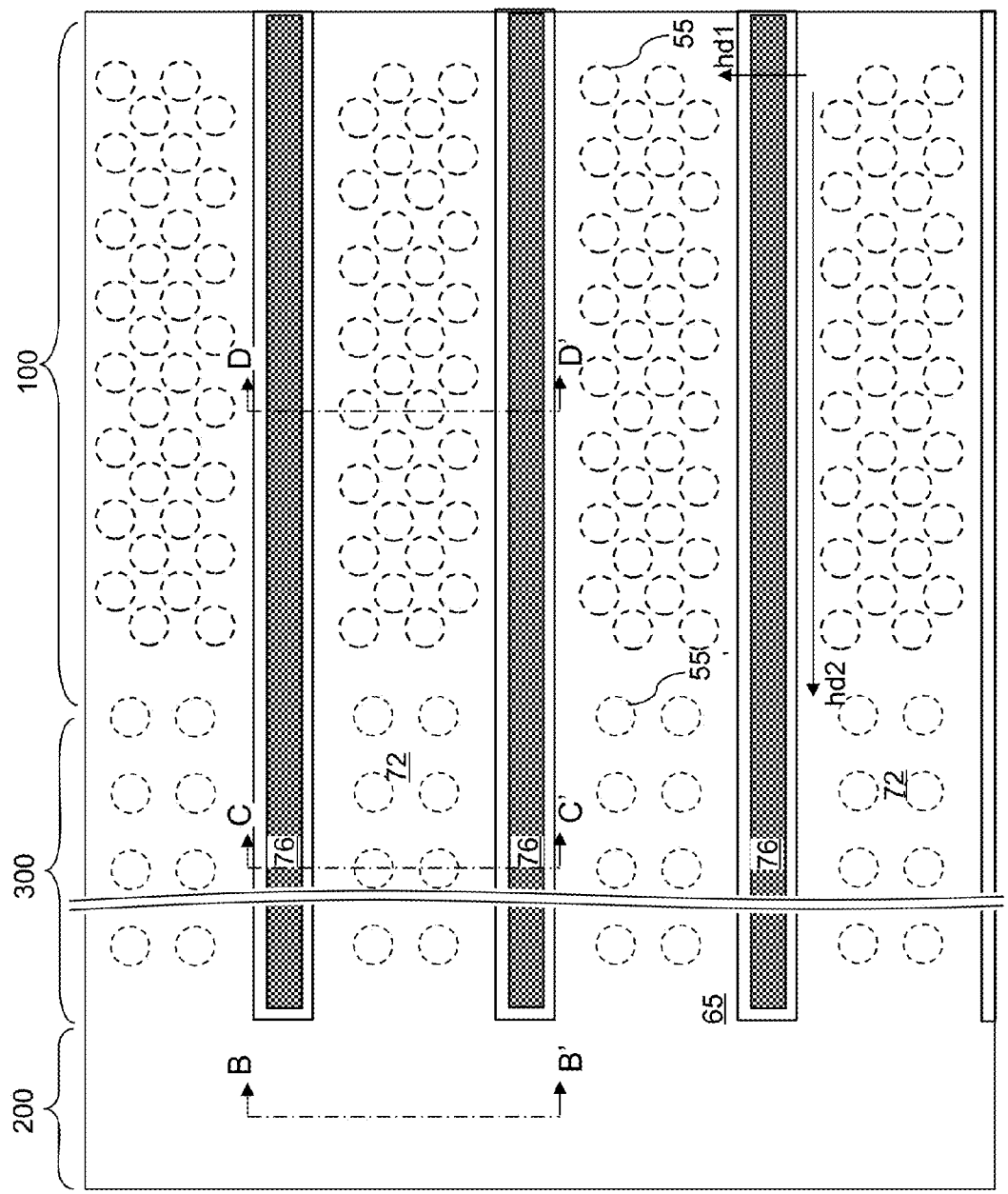
FIG. 11A is a top-down view of the first or second exemplary structure after formation of memory stack structures and backside contact structures according to the embodiments of the present disclosure.
Figures 11B, 11C, 11D:
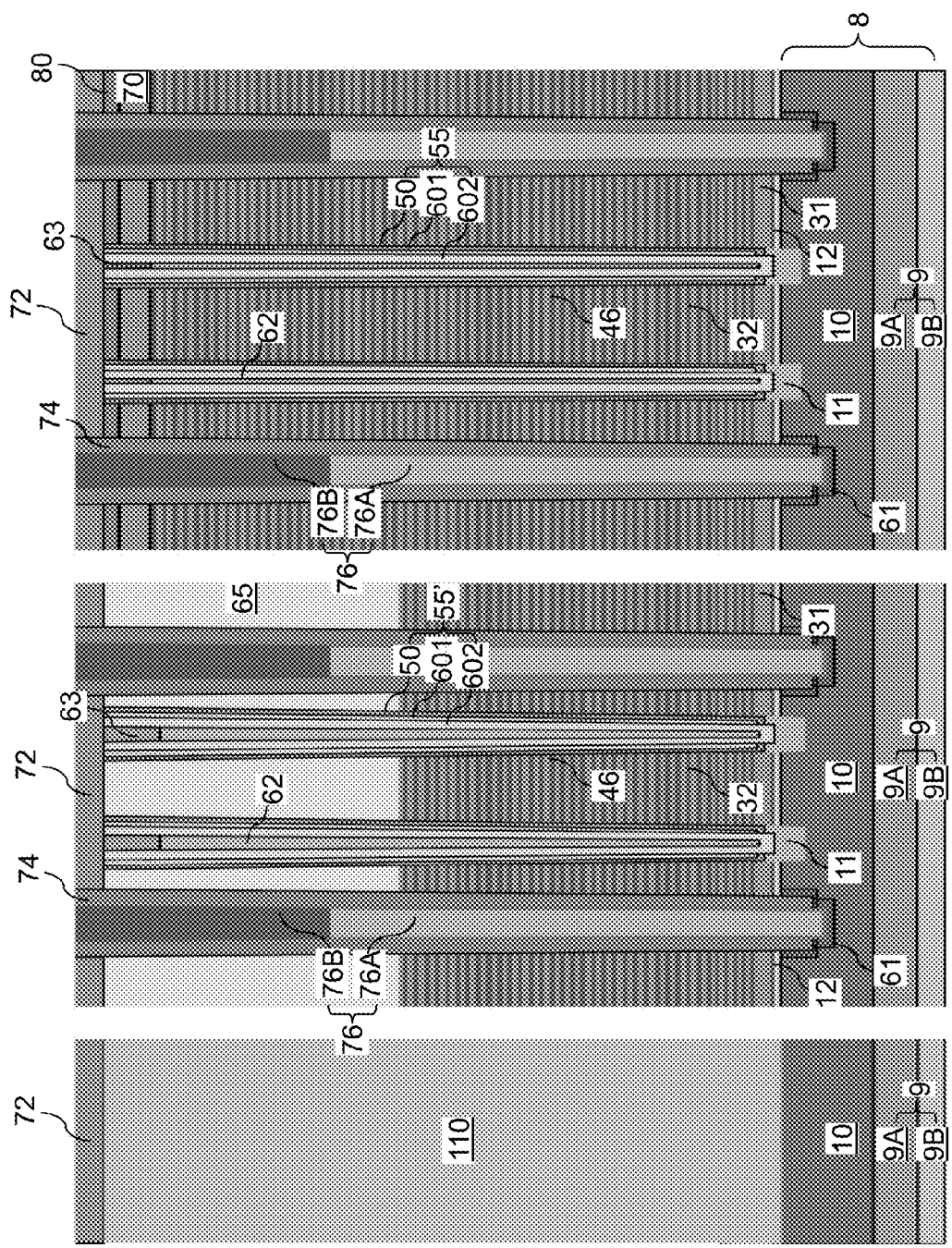
FIG. 11B is a vertical cross-sectional view of the exemplary structure of FIG. 11A along the vertical plane B-B'.
FIG. 11C is a vertical cross-sectional view of the exemplary structure of FIG. 11A along the vertical plane C-C'.
FIG. 11D is a vertical cross-sectional view of the exemplary structure of FIG. 11A along the vertical plane B-B'.

A semiconductor channel 60 is formed within each inter-stack opening (349, 349') and directly on an inner sidewall of each memory film 50. The semiconductor channel 60 can be formed by depositing at least one semiconductor material on the inner sidewalls of the memory films 50 and on semiconductor surfaces of the semiconductor substrate 8. Optionally, the semiconductor channel 60 may include a combination of a first semiconductor channel layer 601 and a second semiconductor channel layer 602 as illustrated in FIGS. 11C and 11D. The semiconductor material of the semiconductor channel 60 can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature. In one embodiment, each semiconductor channel 60 can be a single semiconductor channel extending through the second alternating stack 2000 the first alternating stack 1000.

A dielectric core 62 can be formed within a cavity inside each semiconductor channel 60, for example, by deposition of a dielectric material such as silicon oxide, and subsequent planarization of the dielectric material. Planarization of the dielectric material can be performed to remove the portion of the deposited dielectric material from above the top surface of the horizontal plane including the top surface of the topmost layer of the upper stack structure. The planarization of the dielectric material can be performed, for example, by chemical mechanical planarization. The remaining dielectric material portions can be recessed below the top surface of the upper stack structure, for example, by a recess etch. Each remaining portion of the dielectric material inside a memory opening constitutes a dielectric core 62. The dielectric core 62 is an optional component, and a combination of a memory film 50 and a semiconductor channel 60 may completely fill a memory opening.

A drain region 63 can be formed on the top portion of each semiconductor channel 60, for example, by deposition of a doped semiconductor material. If the semiconductor channels 60 comprise a doped semiconductor material, the conductivity type of the drain regions 63 can be the opposite of the conductivity type of the semiconductor channels 60. In one embodiment, the semiconductor channels 60 and the doped semiconductor material layer 10 collectively constitute the channels of vertical stacks of field effect transistors embodied within a vertical memory stack structure such as a vertical NAND structure.

Each set of a memory film 50, a semiconductor channel 60, a dielectric core 62, and a drain region 63 within an inter-stack memory opening 349 constitutes a memory stack structure 55. Each set of a memory film 50, a semiconductor channel 60, a dielectric core 62, and a drain region 63 within an inter-stack dummy memory opening 349' constitutes a dummy memory stack structure 55'. The dummy memory stack structures 55' do not provide any electrical functionality, but are employed to provide mechanical support during manufacture of the device in the exemplary structure, for example, by preventing collapse of material layers during subsequent formation of backside recesses. Further, the dummy memory stack structures 55' can be employed to provide mechanical support after manufacture, and during operation, of the device in the exemplary structure.

Each dummy memory stack structure 55' can comprises a dummy semiconductor channel 60 having the same composition as, and the same thickness as, a semiconductor channel 60 in a memory stack structure 55. The dummy semiconductor channel 60 is not electrically connected to a driver circuit of the monolithic three-dimensional memory device. As used herein, a first element is electrically connected to a second element if the first element contacts the second element or a conductive path (a path consisting of at least one conductive material) is present between the first element and the second element.

In one embodiment, each dummy memory stack structure 55' can comprise a dummy memory film 50 including a dummy memory material layer having the same composition as, and the same thickness as, the memory film in a memory stack structure 55. Each dummy memory stack structure 55' can comprise a dummy tunneling dielectric layer having the same composition as, and the same thickness as, the tunneling dielectric layer.

The dummy memory stack structures 55' do not perform any electrical function. Thus, no charge is stored in the dummy memory film during operation of the monolithic three-dimensional memory device. No charge carriers tunnel through the dummy tunneling dielectric layer during operation of the monolithic three-dimensional memory device. No current flows through the dummy semiconductor channel during operation of the monolithic three-dimensional memory device.

Each dummy memory stack structure 55' is an electrically inactive component, i.e., a component that does not function electrically, by virtue of not being electrically shorted to a conductive component except for the semiconductor material of the semiconductor substrate 8. Each semiconductor pillar structure 55' includes a memory film 50 which is a dummy memory film (i.e., an electrically inactive memory film), a semiconductor channel 60 which is a dummy semiconductor channel (i.e., an electrically inactive semiconductor channel), a dielectric core 62, and a drain region 63 which is a dummy drain region (i.e., an electrically inactive drain region).

Each dummy memory film 50 in the at least one dummy memory stack structure 55' is formed during the same step as the memory film 50 in each memory stack structure 55. Each dummy tunneling dielectric layer in the at least one dummy memory stack structure 55' is formed during the same step as the tunneling dielectric layer in each memory stack structure 55. Each dummy semiconductor channel 60 in the at least one dummy memory stack structure 55' is formed during the same step as the semiconductor channel 60 in each memory stack structure 55. Each dummy drain region 63 in the at least one dummy memory stack structure 55' is formed during the same step as the drain region 63 in each memory stack structure 55.

At least one semiconductor device 240 can be formed in, or on, the multiple epitaxial semiconductor pedestals, which can be, for example, the first and second epitaxial semiconductor pedestals (110, 210). In one embodiment, at least one semiconductor device formed on the at least one epitaxial semiconductor pedestal (110, 210) can comprise at least one transistor of a driver circuit of the memory device. In an illustrative example, the at least one semiconductor device 240 can include at least one field effect transistor and/or one or more other semiconductor devices known in the art.

A contact level dielectric layer 290 can be formed over the second alternating stack 2000, the second retro-stepped dielectric material portion 265, and the second epitaxial semiconductor pedestal 210. The contact level dielectric layer 290 includes a dielectric material such as silicon oxide, silicon nitride, organosilicate glass, or a combination thereof. The thickness of the contact level dielectric layer 290 can be in a range from 100 nm to 1,000 nm, although lesser and greater thicknesses can also be employed.

Backside contact trenches can be formed through the contact level dielectric layer 290, the second alternating stack 2000, the first alternating stack, the first and second insulating cap layers (70, 270), the first alternating stack 1000, the bottom insulator layer 31, the dielectric pad layer 12, and the first and second retro-stepped dielectric material portion (65, 265). In one embodiment, the memory stack structures 55 can be formed as groups that are laterally spaced from one another by the backside contact trenches. Electrical dopants can be implanted into surface portions of the semiconductor material layer 10 to form source regions 61 in the same manner as in the first and second embodiments.

While the present disclosure is described employing an embodiment in which two alternating stacks are employed, the processing steps of FIGS. 20-24 may be repeated to form a multistack structure including three or more alternating stacks. In this case, a set of stepped surfaces, a retro-stepped dielectric material portion, an epitaxial semiconductor pedestal, and a set of sacrificial fill structures can be formed for each alternating stack. Thus, combinations of three or more alternating stacks, three or more sets of stepped surfaces, three or more retro-stepped dielectric material portions, three or more vertically stacked and mutually epitaxially aligned epitaxial semiconductor pedestals, and inter-stack openings can be formed employing the methods of the present disclosure.

Figure 27:
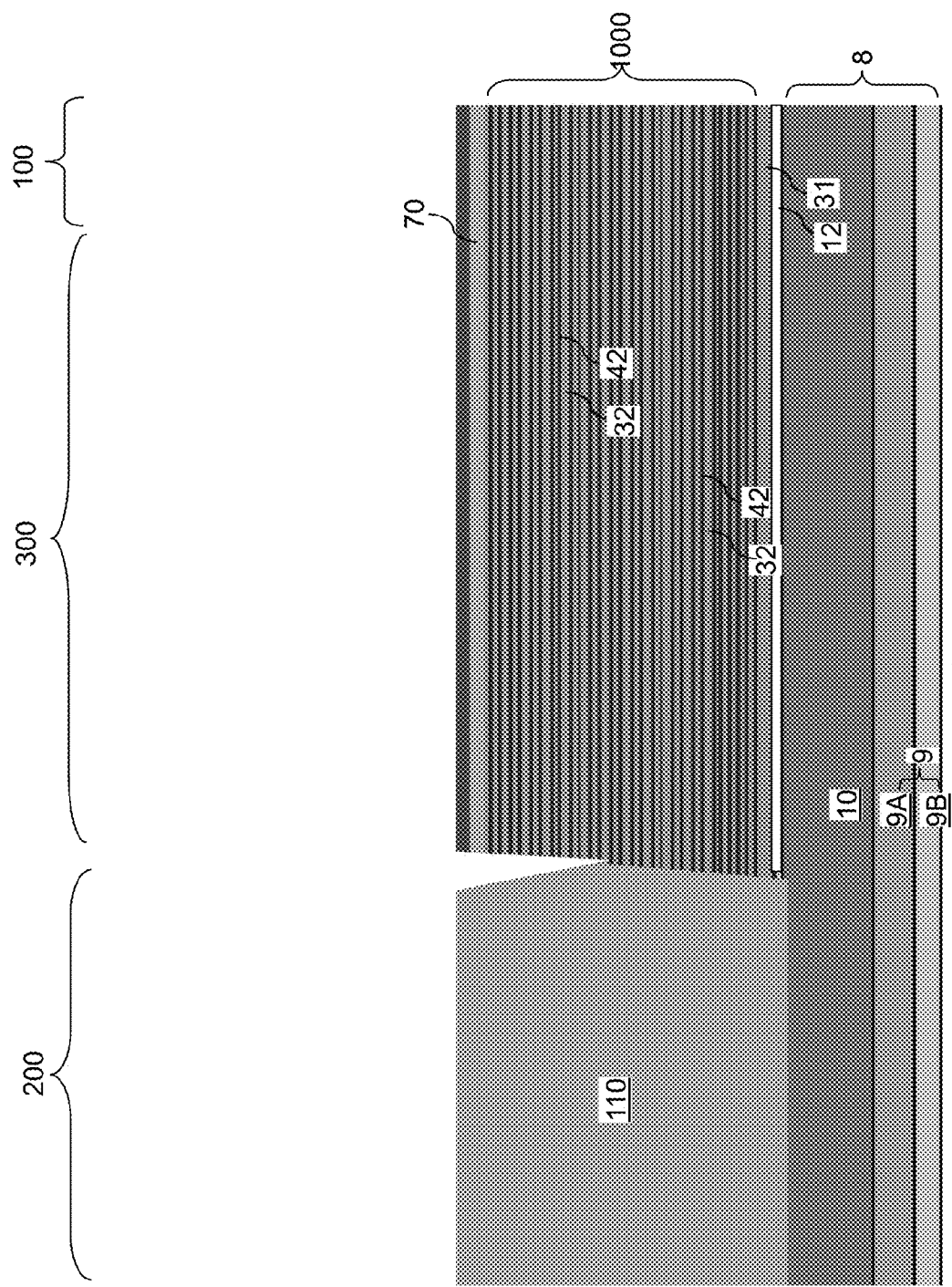
FIG. 27 is a vertical cross-sectional view of an alternate embodiment of the third exemplary structure after formation of a first epitaxial semiconductor pedestal prior to formation of a first dielectric material fill portion according to the third embodiment of the present disclosure.

Referring to FIG. 27, an alternate embodiment of the third exemplary structure can be provided by reversing order of the processing steps of FIG. 18 and the processing steps of FIGS. 14, 15 and 16. In this case, the portion of the first alternating stack 1000 in the peripheral device region 200 is removed by an anisotropic etch while the portion of the first alternating stack 1000 in the device region 100 and the contact region 300 is protected, for example, by a patterned photoresist layer that is subsequently removed. The alternate embodiment illustrated in FIG. 27 corresponds to a processing step after formation of the first epitaxial semiconductor pedestal 110 and prior to formation of stepped surfaces, during which a portion of the first epitaxial semiconductor pedestal 110 may be removed. In this case, a first epitaxial semiconductor pedestal 110 can be formed prior to formation of a first dielectric material fill portion 65. The steps of FIGS. 14-17 and 19-24 are then performed.

According to various embodiment of the present disclosure described above, a method of fabricating a memory device includes performing a series of processing steps at least once. The series of processing steps includes a step of forming an alternating stack (1000 or 2000) of insulator layers (32 or 232) and spacer material layers (42 or 242) over a single crystalline semiconductor surface of a semiconductor substrate 8, a step of forming stepped surfaces by patterning the alternating stack (1000 or 2000), wherein a single crystalline semiconductor material is exposed in a region (such as the peripheral device region 200) from which all layers of the alternating stack are removed, and a step of forming an epitaxial semiconductor pedestal (110 or 220) and a dielectric material portion (65 o 265) on the single crystalline semiconductor material and over the stepped surfaces, respectively, wherein the epitaxial semiconductor pedestal (110, 210) is in epitaxial alignment with the single crystalline semiconductor material. An array of memory stack structures 55 can be formed through the at least one alternating stack (1000, 2000).

Each epitaxial semiconductor pedestal (110, 210) may be formed by a selective epitaxy process prior to, or after, formation of a respective dielectric material portion (65, 265) within a same series of processing steps. In one embodiment, each series of processing steps can further include forming the dielectric material portion (65 or 265) by depositing a dielectric material over the single crystalline semiconductor material and removing a portion of the deposited dielectric material from above the single crystalline semiconductor material, and then forming the epitaxial semiconductor pedestal (110 or 210) by planarizing a deposited epitaxial semiconductor material to provide a top surface that is within a same horizontal plane as a top surface of the dielectric material portion (65 or 265). In another embodiment, each dielectric material portion (65 or 265) may be formed by deposition and patterning of a respective dielectric material after formation of the respective epitaxial semiconductor pedestal (110 or 210).

In one embodiment, each epitaxial semiconductor pedestal (110, 210) may be formed by performing an epitaxial semiconductor deposition process that deposits an epitaxial semiconductor material on an underlying physically exposed semiconductor surface; and planarizing the deposited epitaxial semiconductor material, such that a remaining portion of the deposited epitaxial semiconductor material constitutes the epitaxial semiconductor pedestal (110, 210). In one embodiment, each series of processing steps can further comprise forming a plurality of memory openings (49 or 249) through a respective alternating stack (1000 or 2000). The array of memory stack structures may be formed by forming charge storage elements (as embodied by vertically spaced portions of a memory material layer that are adjacent to electrically conductive layers) and a tunneling dielectric through a vertically extending opening 349 that comprises a memory opening (49, 249) from each alternating stack (1000, 2000).

In one embodiment, each series of processing steps can further comprise forming a planarization stopping layer (80 or 280) over a respective alternating stack (1000 or 2000), and planarizing a topmost surface of a respective epitaxial semiconductor pedestal (110 or 210) employing the planarization stopping layer (80 or 280) as a stopping layer. In one embodiment, sidewalls of the at least one epitaxial semiconductor portion (110, 210) are free of stepped structures.

In one embodiment, each of the memory stack structures 55 can comprise a memory film 50 including tunneling dielectric, charge storage regions, and a blocking dielectric, and a vertical semiconductor channel 60 contacting an inner surface of the memory film and overlying the single crystalline semiconductor surface of the substrate 8. In one embodiment, each series of processing steps can further comprise forming a plurality of dummy openings (also referred to as dummy memory openings 49' or 249') through the stepped surfaces on a respective alternating stack (1000 or 2000). At least one dummy memory stack structure 55' can be formed through at least one vertically extending opening 349' that comprises a dummy memory opening (49' or 249') from each alternating stack (1000 or 2000).

A plurality of bit lines 92 in electrical contact with the array of memory stack structures 55 can be formed such that the at least one dummy memory stack structures 55' is not in electrical contact with the plurality of bit lines. The spacer material layers (such as the first and second sacrificial material layers (42, 242)) of each alternating stack (1000 or 2000) can be removed to form a plurality of recesses using the at least one dummy memory stack structure 55' as support pillars. Conductive material layers (46, 246) can be formed in the plurality of recesses, wherein the conductive material layers comprise control gate electrodes of the memory device.

The spacer material layers of the at least one alternating stack (1000, 2000) may be provided as, or are replaced with, electrically conductive layers (46, 246). Contact via structures 66 can be formed to respective electrically conductive layers (46, 246). The series of processing steps is performed multiple times so that a plurality of alternating stacks (1000, 2000) may be formed.

In one embodiment, sacrificial fill structures 59 may be formed through a first alternating stack 1000 among the plurality of alternating stacks (1000, 2000). Memory openings (such as the second memory openings 249) may be formed over the sacrificial fill structures 59 through a second alternating stack 200 that overlies the first alternating stack 1000. Vertically extending openings 349 that extend through the first and second alternating stacks (1000, 2000) can be formed. Each vertically extending opening 349 can include volumes of a second memory opening 249 in the second alternating stack 2000 and a first memory opening in the first alternating stack 1000.

In one embodiment, the first spacer material layers in the first alternating stack and the second spacer material layers in the second alternating stack can comprise first sacrificial material layers 42 and second sacrificial material layers 242, respectively. In this case, the first and second sacrificial material layers (42, 242) can be replaced with conductive material layers, for example, by removing the first and second sacrificial material layers (42, 242) selective to the first and second insulator layer (32, 232) employing a selective etch process to form lateral recesses, and by depositing at least one conductive material (such as a combination of a metallic nitride liner (e.g., TiN) and a metal fill material (e.g., W)) to fill the lateral recesses. The portions of the conductive material outside of the lateral recesses (for example, in the backside contact trenches and over the contact level dielectric layer 290) can be removed by an etch. Each lateral recess is filled with an electrically conductive layer. Specifically, each lateral recess bounded by one or more first insulator layers 32 is filled with a first electrically conductive layer 46, ad each lateral recess bounded by one or more second insulator layers 232 is filled with a second electrically conductive layer 246. The first and second electrically conductive layers (46, 246) can function as control gate electrodes of the memory stack structures 55. The dummy memory stack structures 55' are used to support the first and second insulator layers (32, 232) while the lateral recesses are present in the third exemplary structure.

Alternatively, the first and/or second spacer material layers can be provided as electrically conductive layers. In this case, replacement of such spacer material layers with at least one conductive material is not necessary.

An insulating spacer 74 can be formed on sidewalls of each backside contact trench in the same manner as in the first and second embodiments. A backside contact via structure 76 can be formed within each backside contact trench in the same manner as in the first and second embodiments.

Figure 12A:
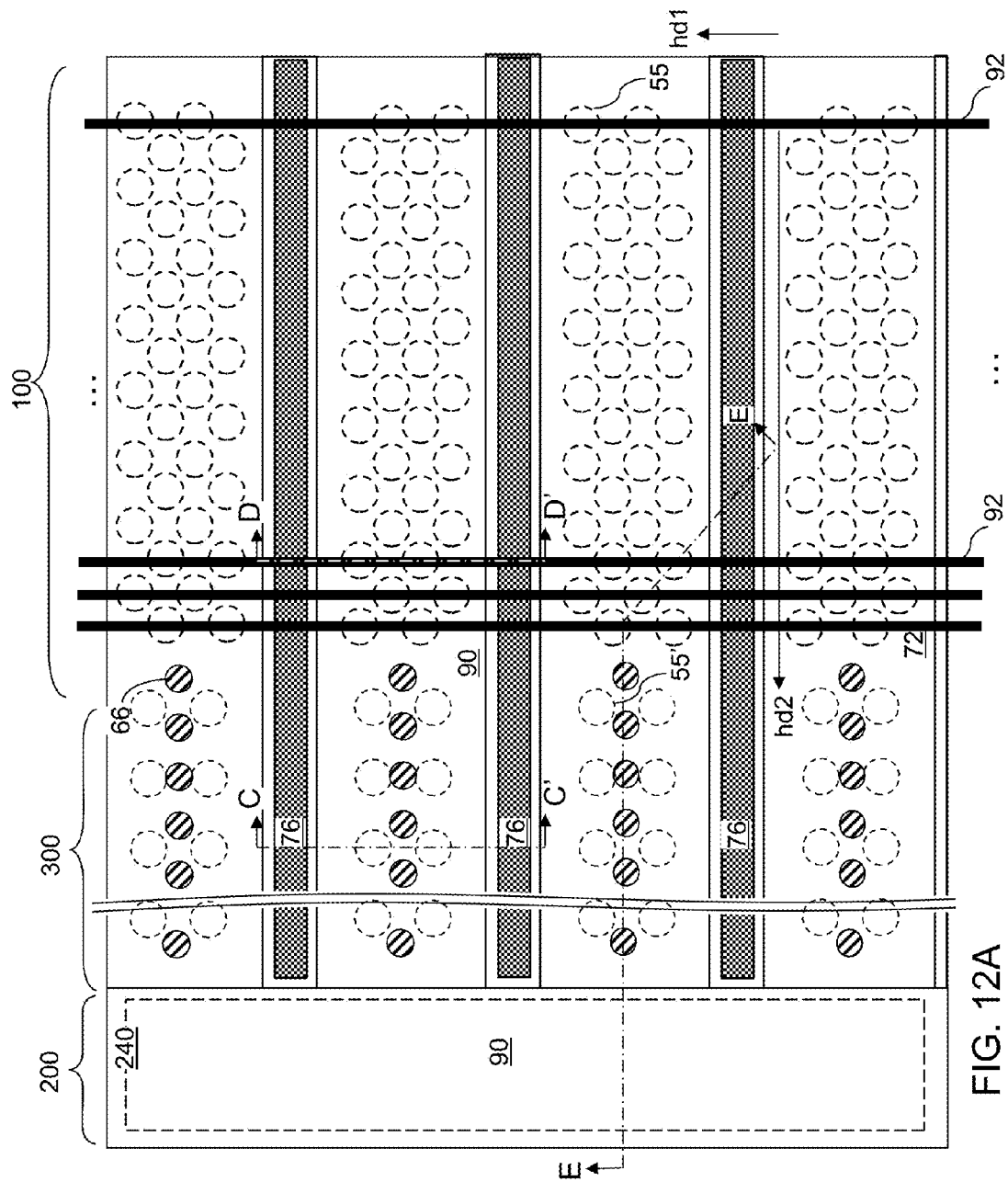
FIG. 12A is a top-down view of the first or second exemplary structure after formation of peripheral devices according to the embodiments of the present disclosure.
Figure 12E:
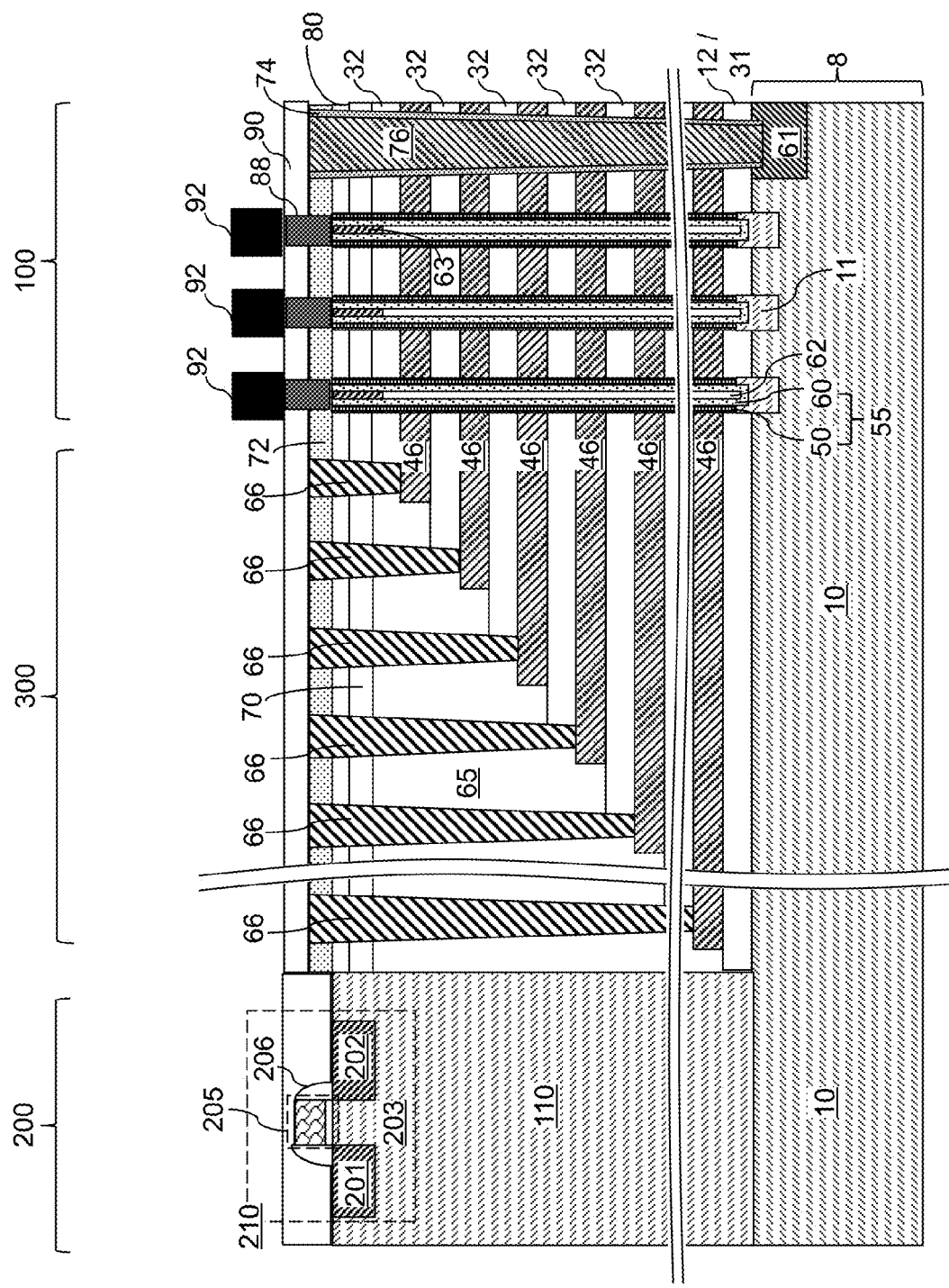
FIG. 12E is a vertical cross-sectional view of the exemplary structure of FIG. 12A along the vertical plane E-E'.

Contact via structures 66 can be formed through the second and/or first retro-stepped dielectric material portion (265, 65) to a respective electrically conductive layer 46, 246. The same processing steps may be employed to form the contact via structures 66 as in the first and second embodiments. The contact via structures 66 can provide electrical contact to the electrically conductive layers 46, 246. Memory contact via structures 88 can be formed in openings in the contact level dielectric layer 290 such that each respective memory contact via structure 88 contacts the drain region 63 in a respective memory stack structure 55. A plurality of bit lines may be formed to provide electrical connection to the memory contact via structures 88 in the same manner as in the first and second embodiments, for example, as illustrated in FIGS. 12D and 12E. The memory contact via structures 88 and bit lines do not physically contact, and do not electrically contact, the dummy memory stack structures 55' in the peripheral device region.

The various embodiments of the present disclosure can provide a memory device that comprises at least one alternating stack (which may comprise a plurality of alternating stacks (1000, 2000)) located over a semiconductor substrate 8. Each of the at least one alternating stack (1000, 2000)) comprises electrically conductive layers (46, 246) and insulator layers (32, 232) that alternate along a direction perpendicular to a top surface of the semiconductor substrate 8 and providing stepped surfaces in a contact region 300. The memory device can comprise an array of memory stack structures 55 located within memory openings which extend through an entirety of the at least one alternating stack (1000, 2000), and at least one dielectric material portion (65, 265) located at a level of a respective alternating stack (1000, 2000). Each of the at least one dielectric material portion (65, 265) overlies the stepped surfaces of a respective alternating stack (1000, 2000). The memory device can comprise at least one epitaxial semiconductor pedestal (110, 210) located on a respective alternating stack (1000, 2000). Each of the at least one epitaxial semiconductor pedestal (1000, 2000) is in epitaxial alignment with a single crystalline substrate semiconductor material in the semiconductor substrate 8. The memory device can include at least one semiconductor device 240 located on the at least one epitaxial semiconductor pedestal (110, 210).

In one embodiment, each of the at least one epitaxial semiconductor pedestal (110, 210) can have a top surface within the same horizontal plane as the top surface of a respective dielectric material portion, which can be, for example, a first retro-stepped dielectric material portion 65 or a second retro-stepped dielectric material portion 265. In one embodiment, the entire contact area between each dielectric material portion (65, 265) and a respective epitaxial semiconductor pedestal (110, 210) can be within the same vertical or tapered plane. In one embodiment, the at least one epitaxial semiconductor pedestal (110, 210) does not include stepped surfaces. In one embodiment, the at least one semiconductor device 240 comprises field effect transistor of a driver circuit of the memory device located in a peripheral region 200 of the memory device.

In one embodiment, an array of drain regions 63 can contact a respective semiconductor channel 60 within the array of memory stack structures 55. A dielectric material layer (such as the first insulating cap layer 70 or the second insulating cap layer 270) can be located over the at least one alternating stack (1000, 2000). The top surface of the dielectric material layer (such as the first insulating cap layer 70 or the second insulating cap layer 270) can be coplanar with the top surface of the respective dielectric material portion (65, 265).

In one embodiment, an array of epitaxial channel portions 11 can underlie the array of memory stack structures and epitaxially aligned to a single crystalline structure of a semiconductor material in the semiconductor substrate 8. In one embodiment, contact via structures 66 can extend through the at least one dielectric material portion (65, 265) and can contact a respective electrically conductive layer (46, 246). A plurality of dummy openings (49', 249') can extend through a respective portion of the stepped surfaces. A plurality of dummy memory stack structures 55' can be located in the plurality of dummy openings. A plurality of bit lines 92 can be in electrical contact with the array of memory stack structures 55. The plurality of dummy memory stack structures 55' are not in electrical contact with the plurality of bit lines 92.

In one embodiment, the array of memory stack structures 55 can extend through the plurality of alternating stacks (1000, 2000). At least one memory stack structure 55' (or all of the memory stack structures 55') within the array of memory stack structures can comprise a first tapered sidewall located within the first alternating stack 1000, a horizontal surface contacting a bottom surface of the second alternating stack 2000 that overlies the first alternating stack 1000, and a second tapered sidewall located within the second alternating stack 2000.

In one embodiment, the multistack structure can comprise a monolithic three-dimensional NAND memory device. The semiconductor substrate can comprise a silicon substrate. The monolithic three-dimensional NAND memory device can comprise an array of monolithic three-dimensional NAND strings over the silicon substrate. At least one memory cell in the first device level of the three-dimensional array of NAND strings can be located over another memory cell in the second device level of the three-dimensional array of NAND strings. The silicon substrate can contain an integrated circuit comprising a driver circuit for the memory device located thereon. Each NAND string can comprise a semiconductor channels. At least one end portion the semiconductor channel can extend substantially perpendicular to a top surface of the silicon substrate. Each NAND string can comprise a plurality of charge storage elements. Each charge storage element can be located adjacent to a respective semiconductor channel. In one embodiment, each charge storage element can be a portion of the charge storage material that is located adjacent to a control gate electrode as embodied as a conductive material layer. Each NAND string can comprise a plurality of control gate electrodes having a strip shape extending substantially parallel to the top surface of the silicon substrate. The plurality of control gate electrodes can comprise at least a first control gate electrode located in the first device level and a second control gate electrode located in the second device level.

Use of the multiple alternating stacks enables scaling of the total height of three-dimensional device structures by allowing repetition of processing steps that manipulates one alternating stack of insulator layers and spacer material layers at a time. While an exemplary embodiment is illustrated in which two alternating stacks are employed herein, the methods of the present disclosure can be extended to integrate three or more alternating stacks.

Referring to FIG. 28A, an alternative configuration is illustrated for the first, second, or third exemplary structure or any derived therefrom. The exemplary structure of FIG. 28A corresponds to any of the processing steps of FIGS. 7 and 16. In this configuration, a first staircase region 301 including a first set of stepped surfaces extending farther along one direction with increased proximity to the substrate 8 is laterally adjoined by a second staircase region 302 including a second set of stepped surfaces extending farther along the opposite direction with increased proximity to the substrate 8 such that a first retro-stepped dielectric material portion 65 is disposed between, and over, the first and second sets of stepped surfaces. The first staircase region 301 may be located adjacent to the device region 100, and the second staircase region 302 may be located adjacent to the peripheral device region. Thus, regions 301 and 302 are formed at the same time during the same step etching process. In this embodiment, region 302 is not removed, while in the prior embodiments shown in FIGS. 7 and 16, this region is removed.

Figure 28B:
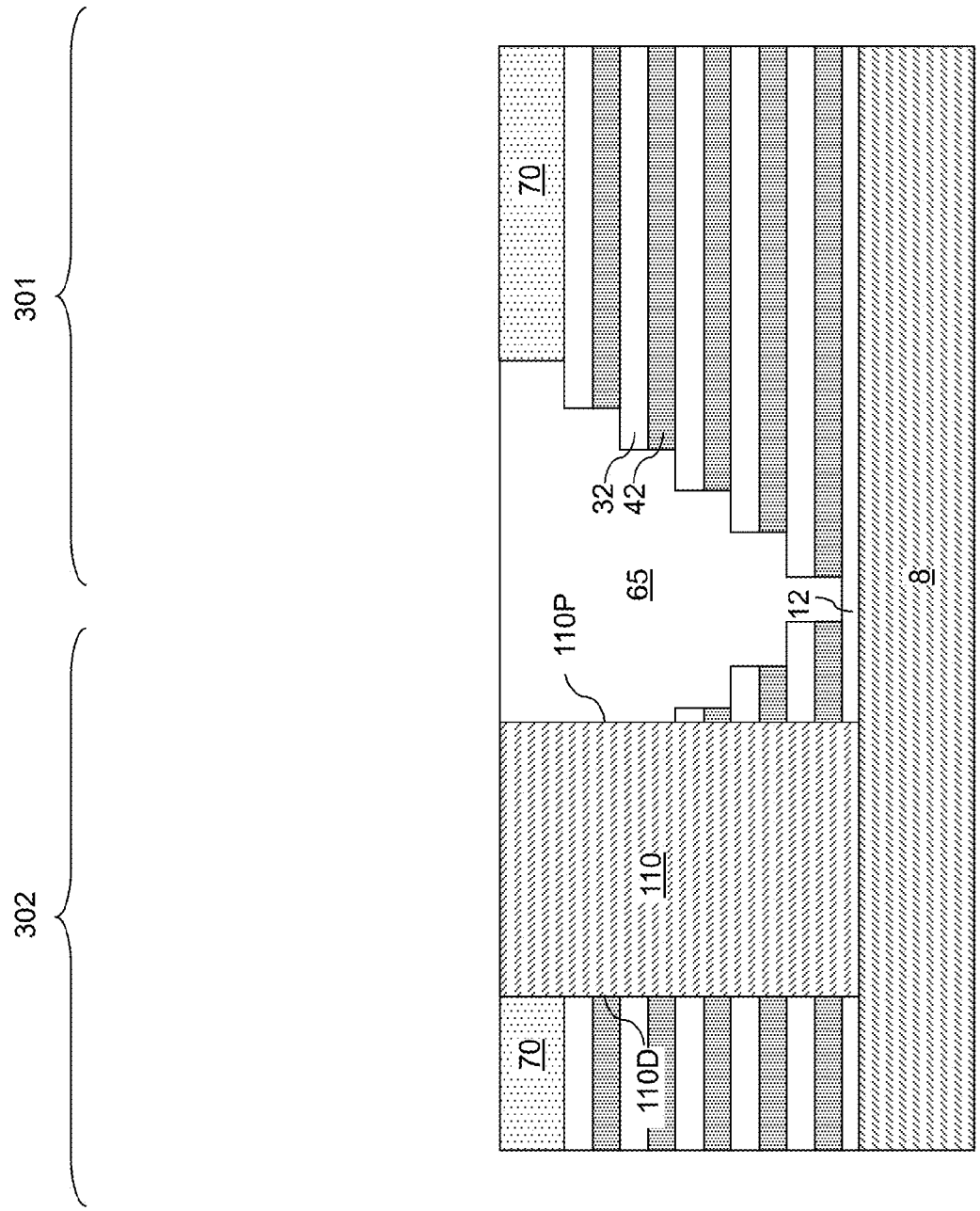

Referring to FIG. 28B, the processing steps of FIGS. 17 and 18 can be performed. The first epitaxial semiconductor pedestal 110 can be formed through the second staircase region 302 such that a remaining portion of the first alternating stack (32, 42) of the first insulating layers 32 and the first spacer material layers 42 contacts at least a distal sidewall 110D of the first epitaxial semiconductor pedestal 110 that is distal from the first staircase region 301. The proximal sidewall 110P of the first epitaxial semiconductor pedestal 110 may contact a sidewall of the first retro-stepped dielectric material portion 65, and may, or may not, contact another remaining portion of the first alternating stack (32, 42) of the first insulating layers 32 and the first spacer material layers 42. The distal sidewall 110D of the first epitaxial semiconductor pedestal 110 may, or may not, contact a portion of the first retro-stepped dielectric material portion 65.

Figure 28C:
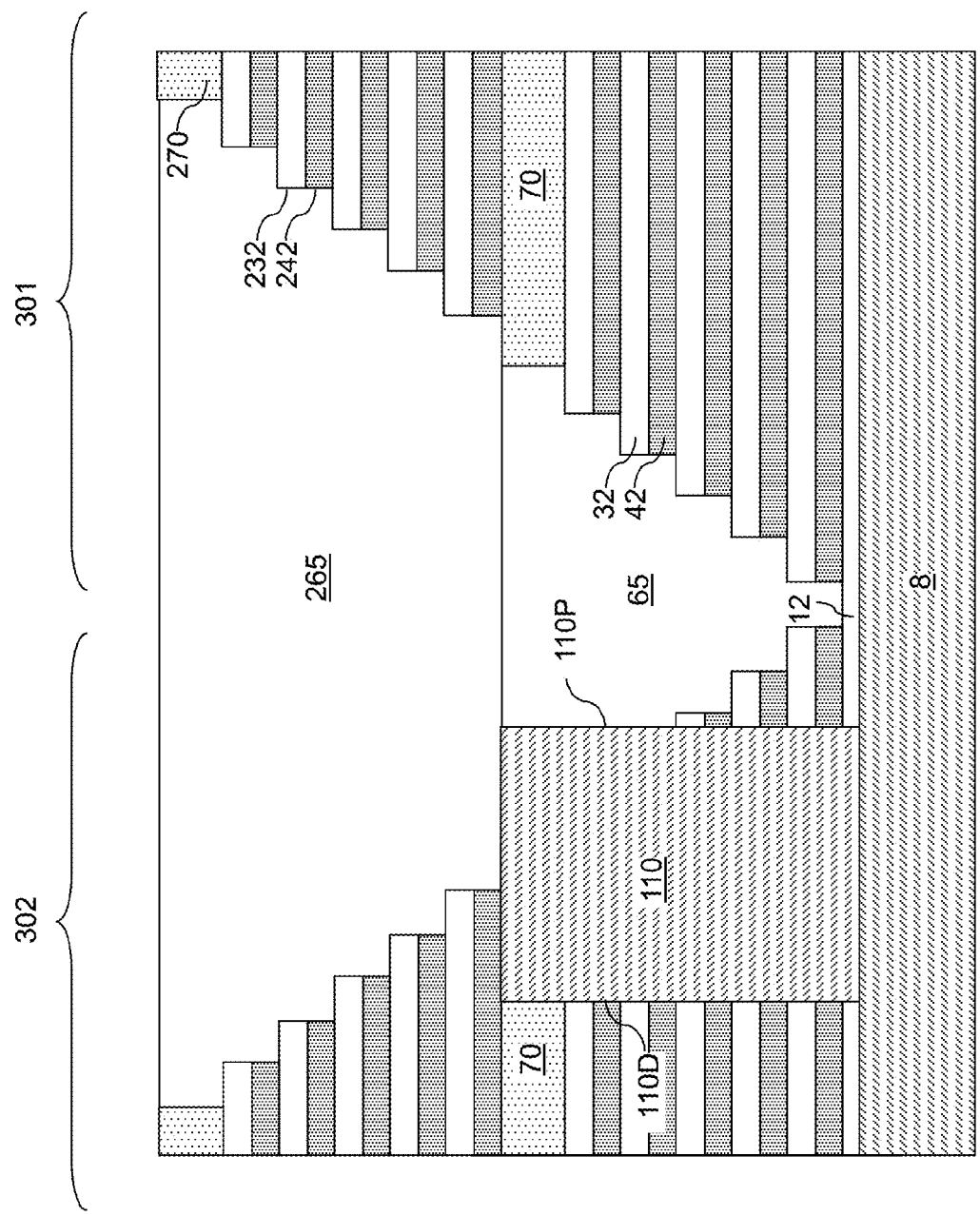

Referring to FIG. 28C, the processing steps of FIGS. 19-22 can be performed to form a second alternating stack (232, 242) of the second insulating layers 232 and the second spacer material layers 242 and a second retro-stepped dielectric material portion 265. The staircase regions 301 and 302 are extended into the second alternating stack to form continuous respective staircase regions 301 and 302 in both stacks.

Figure 28D:
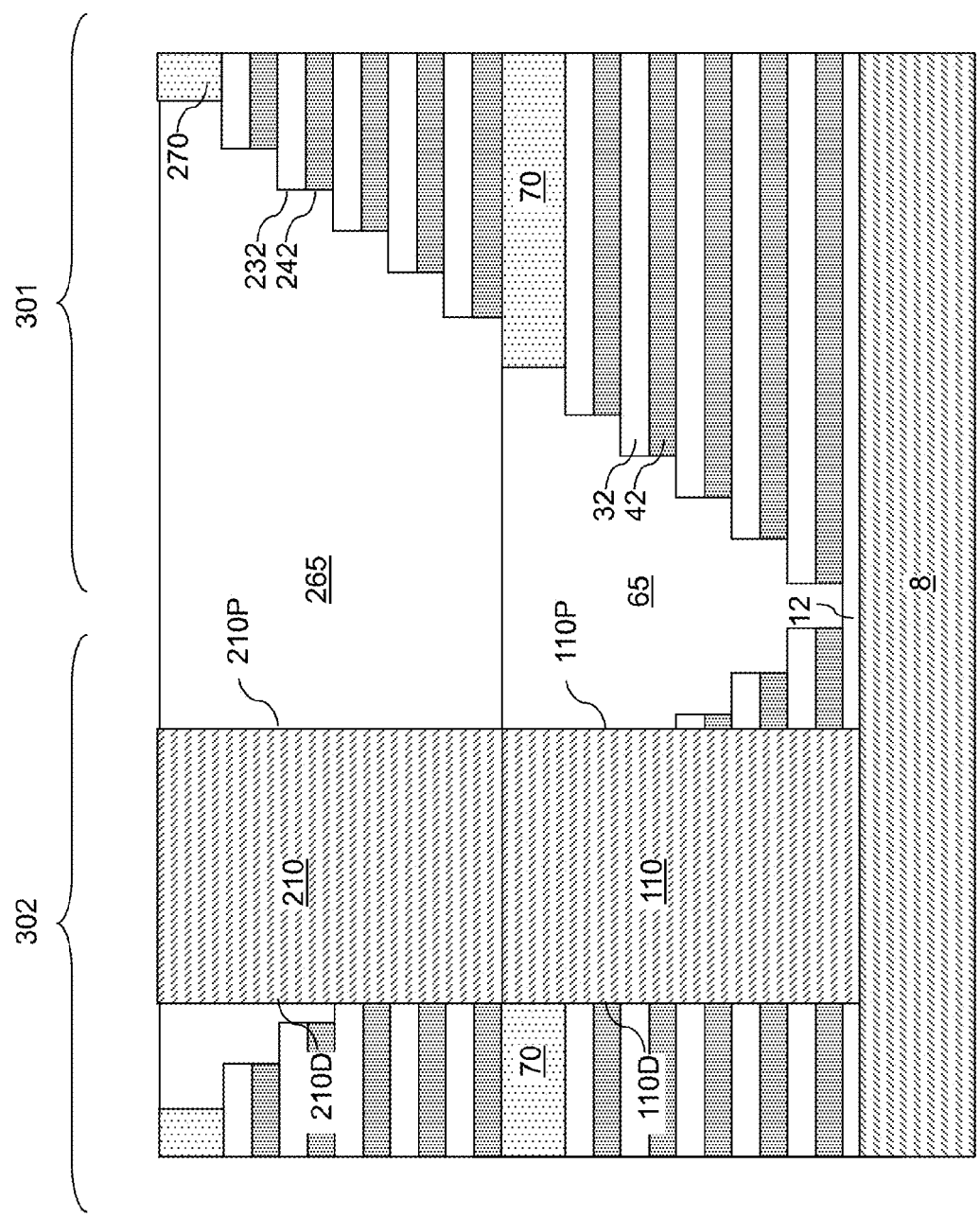

Referring to FIG. 28D, the processing steps of FIG. 23 can be performed to form the second epitaxial semiconductor pedestal 210 directly on the first epitaxial semiconductor pedestal 110. In one embodiment, the second epitaxial semiconductor pedestal 210 can be formed through the second staircase region 302 such that a remaining portion of the second alternating stack (232, 242) of the second insulating layers 232 and the second spacer material layers 242 contacts a distal sidewall 210D of the second epitaxial semiconductor pedestal 210 that is distal from the first staircase region 301. The proximal sidewall 210P of the second epitaxial semiconductor pedestal 210 may contact a sidewall of the second retro-stepped dielectric material portion 265, and may, or may not, contact another remaining portion of the second alternating stack (232, 242) of the second insulating layers 232 and the second spacer material layers 242. The distal sidewall 210D of the second epitaxial semiconductor pedestal 210 may, or may not, contact a portion of the second retro-stepped dielectric material portion 265.

Subsequently, the processing steps of FIGS. 24, 25, 26A, and 26B can be performed to provide a memory device.

Figure 29A:
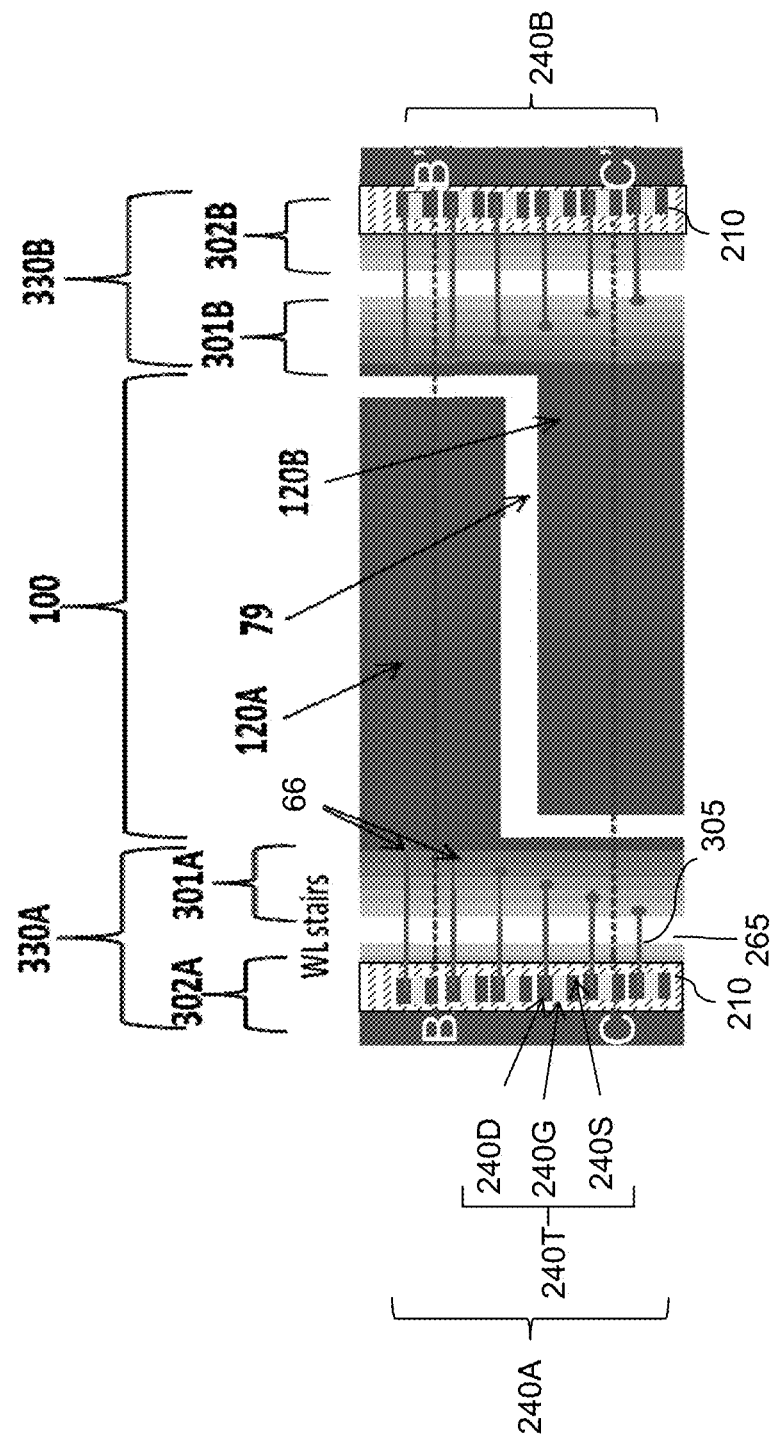
FIG. 29A is a schematic top-down view of the alternative configuration of FIG. 28D in which selected elements are illustrated.

FIGS. 29A-29C illustrate the overall configuration of the structure that can be derived through the processing steps of FIGS. 28A-28D. Selected elements are illustrated, and some elements are omitted for clarity in FIGS. 29A-29C.

A first memory block 120A and a second memory block 120B are laterally spaced by a contact trench 79, in which a backside contact via structure 76 (as illustrated in FIGS. 26A and 26B) can be formed. A first stepped surface region 330A can be formed adjacent to the first memory block 120A, and a second stepped surface region 330B can be formed adjacent to the second memory block 120B. The first stepped surface region 330A includes a first pair of step patterns, which would be symmetric patterns with mirror symmetry but for the presence of at least one instance of a stack of first and second epitaxial semiconductor pedestals (110, 120). Likewise, the second stepped surface region 330B includes a second pair of step patterns, which would be symmetric patterns with mirror symmetry but for the presence of at least another instance of a stack of first and second epitaxial semiconductor pedestals (110, 210).

A proximal side of each stepped surface region (330A, 330B) includes an active stair pattern (301A or 301B) in which the word lines 246 are electrically connected to the respective peripheral device regions 240A, 240B (e.g., word line driver circuit devices) located in the pedestal 210 in the respective dummy stair pattern (302A or 302B). As used herein, a "proximal side" of a stepped surface region (330A, 330B) refers to the side that is proximal to the memory blocks (120A, 120B) in the device region 100. In case the first spacer material layers 42 and the second spacer material layers 242 are formed as sacrificial material layers, the first spacer material layers 42 and the second spacer material layers 242 in the active stair patterns (301A, 301B) and in the device region 100 are replaced with first electrically conductive layers 146 and the second electrically conductive layers 246 after the processing steps of FIG. 25 and during the processing steps of FIGS. 26A and 26B. Contact via structures, which are herein referred to as word line contact via structures 66, are located in the active stair patterns. The word line contact via structures 66 contact the word lines, which can be end portions of the control gate electrodes (as embodied as the first electrically conductive layers 146 and the second electrically conductive layers 246) of the first alternating stack (32, 146) and the second stack (232, 246) after replacement of sacrificial material layers with electrically conductive layers. The word line contact via structures 66 can be connected to peripheral devices, such as field effect transistors 240T, located in peripheral device regions (240A, 240B) by conductive interconnect lines 305. For example, the lines 305 may be electrically connected to either a source 240S or a drain 204D of the respective transistor 240T which also contains a gate electrode 240G.

Preferably, the semiconductor devices 240T can be formed on or in each stack of first and second epitaxial semiconductor pedestals (110, 210). In this case, the memory device can include at least one semiconductor device 240T located on the at least one epitaxial semiconductor pedestal (110, 210). The at least one semiconductor device 240 can be any semiconductor device of the driver circuit.

In contrast, the distal side of each stepped surface regions (300A, 300B) can include dummy stair patterns (302A, 302B), which are not electrically connected to the peripheral devices 240T in the peripheral device regions (240A, 240B) or the memory blocks (120A, 120B). As used herein, a "distal side" of a stepped surface region (330A, 330B) refers to the side that is distal from the memory blocks (120A, 120B) in the device region 100. The portion of the alternating stacks (32, 42, 232, 242) located in the dummy stair pattern can be laterally spaced from backside contact trenches 79 by the retro-stepped dielectric material portions (65, 265). In case the first spacer material layers 42 and the second spacer material layers 242 are formed as sacrificial material layers, the etchant that removes the sacrificial material of the first and second spacer material layers (42, 242) does not reach the portion of the alternating stacks (32, 42, 232, 242) located in the dummy stair patterns (302A, 302B). Thus, the first spacer material layers 42 and the second spacer material layers 242 in the dummy stair patterns (302A, 302B) are not replaced with first electrically conductive layers 146 and the second electrically conductive layers 246 during the processing steps of FIGS. 26A and 26B. Instead, each dummy stair pattern (302A, 302B) can include a first alternating stack (32, 42) of first insulating layers 32 and first spacer material layers 42 (which may be first sacrificial material layers such as first silicon nitride layers), and a second alternating stack (232, 242) of second insulating layers 232 and second spacer material layers 242 (which may be second sacrificial material layers such as second silicon nitride layers) even after the processing steps that form the electrically conductive layers (46, 246) in the device region 100 and the active stair patterns (301A, 301B).

In an embodiment that employs the configuration illustrated in FIGS. 28A-28D and 29A-29C, a pair of stepped surface regions {(301A, 302A) or (301B, 302B)} having a mirror symmetry can be formed at the processing step of FIG. 28A. Each pair of stepped surface regions {(301A, 302A) or (301B, 302B)} includes active stair patterns (301A or 301B) that are proximal to a region of the array of memory stack devices in the device region 100, and dummy stair patterns (302A, 302B) that are distal from the region of the array of memory stack devices in the device region 100.

The pair of stepped surface regions {(301A, 302A) or (301B, 302B)} can be laterally spaced by at least one retro-stepped dielectric material portion (65, 265). The first epitaxial semiconductor pedestal 110 and the second epitaxial semiconductor pedestal 210 can be formed in an area of the dummy stair patterns (302A, 302B), and not in any area of the active stair patterns (301A, 301B). The at least one epitaxial semiconductor pedestal (110, 210) can be adjoined to the dummy stair patterns (302A, 302B) and does not extend into any area of the active stair patterns (301A, 301B).

The active stair patterns (301A, 301B) are located in the alternating stacks (32, 46, 232, 246) of respective insulating layers (32, 232) and respective electrically conductive layers (46, 246). In contrast, the dummy stair patterns (302A, 302B) are located in the at least one additional alternating stack (32, 42, 232, 242) of additional insulating layers (32, 232) and spacer material layers (42, 242). The spacer material layers (42, 242) include a sacrificial material, which has a different composition than the electrically conductive layers (46, 246). In one embodiment, the at least one additional alternating stack (32, 42, 232, 242) of additional insulating layers (32, 232) and spacer material layers (42, 242) contact at least one sidewall of the at least one epitaxial semiconductor pedestal (110, 210). In one embodiment, the spacer material layers (42, 242) can comprise a dielectric (i.e., electrically insulating) material such as silicon nitride and not contain an electrically conductive material.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A method of fabricating a memory device, comprising:
   forming a first alternating stack of insulator layers and spacer material layers over a semiconductor substrate;
   etching the first alternating stack to expose a single crystalline semiconductor material;
   forming a first epitaxial semiconductor pedestal on the single crystalline semiconductor material, wherein the first epitaxial semiconductor pedestal is in epitaxial alignment with the single crystalline semiconductor material;
   forming an array of memory stack structures through the first alternating stack;
   forming a second epitaxial semiconductor pedestal on the first epitaxial semiconductor pedestal, wherein the first and the second epitaxial semiconductor pedestals are epitaxial alignment with each other; and
   forming at least one semiconductor device over the first and the second epitaxial semiconductor pedestals.
2. The method of claim 1, further comprising:
   forming stepped surfaces in a side of the first alternating stack by patterning the first alternating stack;
   forming a dielectric material portion by depositing a dielectric material over the stepped surfaces, and removing a portion of the deposited dielectric material from above the single crystalline semiconductor material prior to forming the first epitaxial semiconductor pedestal; and
   planarizing a deposited first epitaxial semiconductor material to form the first epitaxial semiconductor ped- estal having a top surface that is within a same horizontal plane as a top surface of the dielectric material portion.

3. The method of claim 1, further comprising:
forming stepped surfaces in a side of the first alternating stack by patterning the first alternating stack after the step of forming the first epitaxial semiconductor pedestal; and
forming a dielectric material portion by depositing a dielectric material over the stepped surfaces and over the first epitaxial semiconductor pedestal, and removing a portion of the deposited dielectric material from above the first epitaxial semiconductor pedestal.

4. The method of claim 1, further comprising:
forming a planarization stopping layer over the first alternating stack; and
planarizing a topmost surface of the first epitaxial semiconductor pedestal employing the planarization stopping layer as a stopping layer.

5. The method of claim 1, wherein forming at least one semiconductor device comprises forming at least one transistor of a driver circuit of the memory device over the first and the second epitaxial semiconductor pedestals.

6. The method of claim 1, wherein forming the array of memory stack structures through the first alternating stack comprises forming a plurality of first memory openings through the first alternating stack, and forming a memory film and a semiconductor channel in the first memory openings.

7. The method of claim 6, further comprising forming stepped surfaces in a side of the first alternating stack by patterning the first alternating stack, wherein sidewalls of the first epitaxial semiconductor pedestal are free of stepped structures.

8. The method of claim 7, further comprising:
forming a plurality of first dummy openings through the stepped surfaces in the first alternating stack during the same step as forming the plurality of first memory openings;
forming dummy memory stack structures in the first dummy openings during the same step as forming the memory stack structures in the first memory openings; and
forming a plurality of bit lines in electrical contact with the array of memory stack structures, such that the at least one dummy memory stack structures is not in electrical contact with the plurality of bit lines.

9. The method of claim 8, further comprising:
removing the spacer material layers of each alternating stack to form a plurality of recesses using the dummy memory stack structures as support pillars; and
forming conductive material layers in the plurality of recesses, wherein the conductive material layers comprise control gate electrodes of the memory device.

10. The method of claim 1, wherein:
the spacer material layers of the at least one alternating stack are provided as, or are replaced with, electrically conductive layers; and
the method further comprises forming contact via structures to respective electrically conductive layers.

11. The method of claim 1, further comprising:
forming a second alternating stack of insulator layers and spacer material layers over the first alternating stack; and
etching the first alternating stack to expose the first epitaxial semiconductor pedestal.

12. The method of claim 11, wherein:
the array of memory stack structures are formed through the first and the second alternating stacks; and
forming the second epitaxial semiconductor pedestal occurs after the step of etching the first alternating stack to expose the first epitaxial semiconductor pedestal.

13. The method of claim 12, further comprising:
forming a plurality of first memory openings through the first alternating stack;
forming sacrificial fill structures in the first memory openings;
forming second memory openings through the second alternating stack to expose the sacrificial fill structures; and
removing the sacrificial fill structures to form inter-stack memory openings comprising the first and the second memory openings, wherein the array of memory stack structures are formed in the inter-stack memory openings.

14. The method of claim 1, further comprising forming a pair of stepped surface regions having a mirror symmetry, the pair of stepped surface regions including active stair patterns that are proximal to a region of the array of memory stack devices and dummy stair patterns that are distal from the region of the array of memory stack devices.

15. The method of claim 14, further comprising:
removing the spacer material layers from the active stair pattern but not from the dummy stair pattern to form a plurality of recesses in the active stair pattern; and
forming conductive material layers in the plurality of recesses;
wherein the conductive material layers comprise control gate electrodes of the memory device; and
wherein the first epitaxial semiconductor pedestal is formed in the dummy stair patterns and not in the active stair patterns.

16. The method of claim 1, wherein:
the memory device comprises a monolithic three-dimensional NAND memory device;
the semiconductor substrate comprises a silicon substrate;
the monolithic three-dimensional NAND memory device comprises an array of monolithic three-dimensional NAND strings over the silicon substrate;
at least one memory cell in the first device level of the three-dimensional array of NAND strings is located over another memory cell in the second device level of the three-dimensional array of NAND strings;
the silicon substrate contains an integrated circuit comprising a driver circuit for the memory device located thereon; and
each NAND string comprises:
a semiconductor channels, wherein at least one end portion the semiconductor channel extends substantially perpendicular to a top surface of the silicon substrate;
a plurality of charge storage elements, each charge storage element located adjacent to a respective semiconductor channel; and
a plurality of control gate electrodes having a strip shape extending substantially parallel to the top surface of the semiconductor substrate, the plurality of control gate electrodes comprise at least a first control gate electrode located in the first device level and a second control gate electrode located in the second device level.

17. A memory device, comprising:
- at least one alternating stack located over a semiconductor substrate, wherein each of the at least one alternating stack comprises electrically conductive layers and insulator layers that alternate along a direction perpendicular to a top surface of the semiconductor substrate and including stepped surfaces in a contact region;
- an array of memory stack structures located within memory openings which extend through an entirety of the at least one alternating stack;
- at least one additional alternating stack of additional insulating layers and spacer material layers, wherein the spacer material layers have a different composition than the electrically conductive layers;
- at least one epitaxial semiconductor pedestal located in the at least one additional alternating stack, wherein each of the at least one epitaxial semiconductor pedestal is in epitaxial alignment with a single crystalline substrate semiconductor material of the semiconductor substrate; and
- at least one semiconductor device located on the at least one epitaxial semiconductor pedestal.

18. The memory device of claim 17, wherein:
- each of the at least one epitaxial semiconductor pedestal has a top surface within a same horizontal plane as a top surface of a respective dielectric material portion;
- an entire contact area between each dielectric material portion and a respective epitaxial semiconductor pedestal is within a same vertical or tapered plane;
- the at least one epitaxial semiconductor pedestal does not include stepped surfaces; and
- the at least one semiconductor device comprises field effect transistor of a driver circuit of the memory device located in a peripheral region of the memory device.

19. The memory device of claim 18, further comprising:
- an array of drain regions contacting a respective semiconductor channel within the array of memory stack structures; and
- a dielectric material layer located over the at least one alternating stack, wherein a top surface of the dielectric material layer is coplanar with a top surface of a respective dielectric material portion.

20. The memory device of claim 17, further comprising an array of epitaxial channel portions underlying the array of memory stack structures and epitaxially aligned to a single crystalline structure of a semiconductor material in the semiconductor substrate.

21. The memory device of claim 17, further comprising:
- contact via structures extending through the at least one dielectric material portion and contacting a respective electrically conductive layer;
- a plurality of dummy openings extending through a respective portion of the stepped surfaces;
- a plurality of dummy memory stack structures located in the plurality of dummy openings; and
- a plurality of bit lines in electrical contact with the array of memory stack structures, wherein the plurality of dummy memory stack structures are not in electrical contact with the plurality of bit lines.

22. The memory device of claim 17, wherein the at least one alternating stack comprises a plurality of alternating stacks.

23. The memory device of claim 22, wherein:
- the array of memory stack structures extends through the plurality of alternating stacks; and
- at least one memory stack structure within the array of memory stack structures comprises a first tapered sidewall located within a first alternating stack, a horizontal surface contacting a bottom surface of a second alternating stack that overlies the first alternating stack, and a second tapered sidewall located within the second alternating stack.

24. The memory device of claim 17, comprising forming a pair of stepped surface regions laterally spaced by a retro-stepped dielectric material portion, wherein the pair of stepped surface regions includes active stair patterns that are proximal to a region of the array of memory stack devices and dummy stair patterns that are distal from the region of the array of memory stack devices.

25. The memory device of claim 24, wherein the at least one epitaxial semiconductor pedestal is adjoined to the dummy stair patterns and does not extend into any area of the active stair patterns.

26. The memory device of claim 17, further comprising at least one dielectric material portion located on a respective alternating stack, wherein each of the at least one dielectric material portion overlies the stepped surfaces of the respective alternating stack and the at least one additional alternating stack.

27. The memory device of claim 17, wherein:
- the at least one additional alternating stack of additional insulating layers and spacer material layers contact at least one sidewall of the at least one epitaxial semiconductor pedestal; and
- the spacer material layers comprise a dielectric material.

28. The memory device of claim 17, wherein:
- the memory device comprises a monolithic three-dimensional NAND memory device;
- the semiconductor substrate comprises a silicon substrate;
- the monolithic three-dimensional NAND memory device comprises an array of monolithic three-dimensional NAND strings over the silicon substrate;
- at least one memory cell in the first device level of the three-dimensional array of NAND strings is located over another memory cell in the second device level of the three-dimensional array of NAND strings;
- the silicon substrate contains an integrated circuit comprising a driver circuit for the memory device located thereon; and
- each NAND string comprises:
  - a semiconductor channels, wherein at least one end portion the semiconductor channel extends substantially perpendicular to a top surface of the silicon substrate;
  - a plurality of charge storage elements, each charge storage element located adjacent to a respective semiconductor channel; and
  - a plurality of control gate electrodes having a strip shape extending substantially parallel to the top surface of the semiconductor substrate, the plurality of control gate electrodes comprise at least a first control gate electrode located in the first device level and a second control gate electrode located in the second device level.

* * * * *